(12) United States Patent
Takizawa

(10) Patent No.: US 7,235,829 B2
(45) Date of Patent: Jun. 26, 2007

(54) ELECTRONIC CARD WITH PROTECTION AGAINST AERIAL DISCHARGE

(75) Inventor: Makoto Takizawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/141,024

(22) Filed: Jun. 1, 2005

(65) Prior Publication Data

US 2005/0219781 A1 Oct. 6, 2005

Related U.S. Application Data

(63) Continuation of application No. 10/722,598, filed on Nov. 28, 2003, now Pat. No. 6,952,027.

(30) Foreign Application Priority Data

Nov. 29, 2002 (JP) ............................. 2002-348935

(51) Int. Cl.
*H01L 29/76* (2006.01)
(52) U.S. Cl. ...................... 257/288; 257/360; 257/679; 257/E27.029
(58) Field of Classification Search ............... 257/288, 257/355, 360, 679, E27.029
See application file for complete search history.

(56) References Cited

U.S. PATENT DOCUMENTS

| 4,855,620 | A | 8/1989 | Duvvury et al. |
| 5,581,103 | A | 12/1996 | Mizukami ................... 257/355 |
| 5,608,594 | A | 3/1997 | Fukuda |
| 5,849,622 | A | 12/1998 | Hause et al. ................ 438/286 |
| 5,854,504 | A | 12/1998 | Consiglio ................... 257/358 |
| 5,877,534 | A | 3/1999 | Williams et al. ............ 257/355 |
| 6,046,480 | A | 4/2000 | Matsumoto et al. |
| 6,184,728 | B1 | 2/2001 | Ohki .......................... 327/108 |
| 6,353,247 | B1 | 3/2002 | Pan ............................ 257/355 |
| 6,455,895 | B1 | 9/2002 | Morishita ................... 257/355 |
| 6,586,780 | B1 | 7/2003 | Terashima .................. 257/140 |
| 6,639,284 | B1 | 10/2003 | Chatterjee et al. .......... 257/355 |
| 6,677,649 | B2 | 1/2004 | Osada et al. ................ 257/379 |
| 6,777,757 | B2 | 8/2004 | Peng et al. ................. 257/368 |
| 6,806,482 | B2 | 10/2004 | Yamagishi .................. 250/551 |
| 7,053,471 | B2 * | 5/2006 | Wada et al. ................ 257/679 |
| 7,055,757 | B2 * | 6/2006 | Nishizawa et al. ......... 235/492 |

(Continued)

FOREIGN PATENT DOCUMENTS

JP 59-11034 1/1984

(Continued)

OTHER PUBLICATIONS

Shigeo Araki, "The Memory Stick", IEEE Micro, Jul.-Aug. 2000, pp. 40-46.

*Primary Examiner*—T. N. Quach
(74) *Attorney, Agent, or Firm*—Oblon, Spivak, McClelland, Maier & Neustadt, P.C.

(57) ABSTRACT

A semiconductor integrated circuit device includes a semiconductor region of a first conductivity type. A first insulated-gate field effect transistor having a source/drain region of a second conductivity type connected to an output terminal is formed on the semiconductor region. Further, a semiconductor region of a second conductivity type connected to the gate of the transistor is formed adjacent to the source/drain region of the transistor on the semiconductor region.

16 Claims, 36 Drawing Sheets

U.S. PATENT DOCUMENTS

2001/0011766 A1* 8/2001 Nishizawa et al. ......... 257/685
2003/0001206 A1 1/2003 Negoro et al. .............. 257/336

FOREIGN PATENT DOCUMENTS

| JP | 63-288056 | 11/1988 |
| JP | 02-137269 | 5/1990 |
| JP | 05-291511 | 11/1993 |
| JP | 07-254709 | 10/1995 |
| KR | 1992-0004919 | 6/1992 |

* cited by examiner

| Fuse | | | | Protect ability | | Drive ability | |
|---|---|---|---|---|---|---|---|
| F4 | F3 | F2 | F1 | PFET | NFET | P1 | N1 |
| 0 | 0 | 0 | 0 | 2WG | 2WG | 2WG | 2WG |
| 0 | 0 | 0 | 1 | 2WG | 2WG | 2WG | WG |
| 0 | 0 | 1 | 0 | 2WG | 2WG | WG | 2WG |
| 0 | 0 | 1 | 1 | 2WG | 2WG | WG | WG |
| 0 | 1 | 0 | 0 | 2WG | WG | 2WG | 2WG |
| 0 | 1 | 0 | 1 | 2WG | WG | 2WG | WG |
| 0 | 1 | 1 | 0 | 2WG | WG | WG | 2WG |
| 0 | 1 | 1 | 1 | 2WG | WG | WG | WG |
| 1 | 0 | 0 | 0 | WG | 2WG | 2WG | 2WG |
| 1 | 0 | 0 | 1 | WG | 2WG | 2WG | WG |
| 1 | 0 | 1 | 0 | WG | 2WG | WG | 2WG |
| 1 | 0 | 1 | 1 | WG | 2WG | WG | WG |
| 1 | 1 | 0 | 0 | WG | WG | 2WG | 2WG |
| 1 | 1 | 0 | 1 | WG | WG | 2WG | WG |
| 1 | 1 | 1 | 0 | WG | WG | WG | 2WG |
| 1 | 1 | 1 | 1 | WG | WG | WG | WG |

0:Connect
1:Disconnect

FIG. 23

| Fuse | | | | | | | | Protect ability | | Drive ability | |
|---|---|---|---|---|---|---|---|---|---|---|---|
| F42 | F41 | F32 | F31 | F22 | F21 | F12 | F11 | PFET | NFET | P1 | N1 |
| 0 | 0 | 0 | 0 | 0 | 0 | 0 | 0 | 2WG | 2WG | 2WG | 2WG |
| 0 | 0 | 0 | 0 | 0 | 0 | 0 | 1 | 2WG | 2WG | 2WG | 1.5WG |
| 0 | 0 | 0 | 0 | 0 | 0 | 1 | 0 | 2WG | 2WG | 2WG | WG |
| 0 | 0 | 0 | 0 | 0 | 0 | 1 | 1 | 2WG | 2WG | 2WG | 0.5WG |
| ⋮ | ⋮ | ⋮ | ⋮ | ⋮ | ⋮ | ⋮ | ⋮ | ⋮ | ⋮ | ⋮ | ⋮ |
| 0 | 0 | 0 | 0 | 0 | 0 | 0 | 0 | 2WG | 2WG | 2WG | 2WG |
| 0 | 0 | 0 | 0 | 0 | 1 | 0 | 0 | 2WG | 2WG | 1.5WG | 2WG |
| 0 | 0 | 0 | 0 | 1 | 0 | 0 | 0 | 2WG | 2WG | WG | 2WG |
| 0 | 0 | 0 | 0 | 1 | 1 | 0 | 0 | 2WG | 2WG | 0.5WG | 2WG |
| ⋮ | ⋮ | ⋮ | ⋮ | ⋮ | ⋮ | ⋮ | ⋮ | ⋮ | ⋮ | ⋮ | ⋮ |
| 0 | 0 | 0 | 0 | 0 | 0 | 0 | 0 | 2WG | 2WG | 2WG | 2WG |
| 0 | 0 | 0 | 1 | 0 | 0 | 0 | 0 | 2WG | 1.5WG | 2WG | 2WG |
| 0 | 0 | 1 | 0 | 0 | 0 | 0 | 0 | 2WG | WG | 2WG | 2WG |
| 0 | 0 | 1 | 1 | 0 | 0 | 0 | 0 | 2WG | 0.5WG | 2WG | 2WG |
| ⋮ | ⋮ | ⋮ | ⋮ | ⋮ | ⋮ | ⋮ | ⋮ | ⋮ | ⋮ | ⋮ | ⋮ |
| 0 | 0 | 0 | 0 | 0 | 0 | 0 | 0 | 2WG | 2WG | 2WG | 2WG |
| 0 | 1 | 0 | 0 | 0 | 0 | 0 | 0 | 1.5WG | 2WG | 2WG | 2WG |
| 1 | 0 | 0 | 0 | 0 | 0 | 0 | 0 | WG | 2WG | 2WG | 2WG |
| 1 | 1 | 0 | 0 | 0 | 0 | 0 | 0 | 0.5WG | 2WG | 2WG | 2WG |

0:Connect
1:Disconnect

FIG. 35

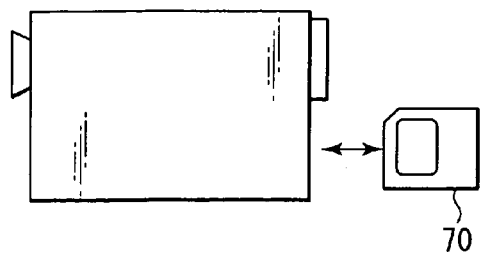
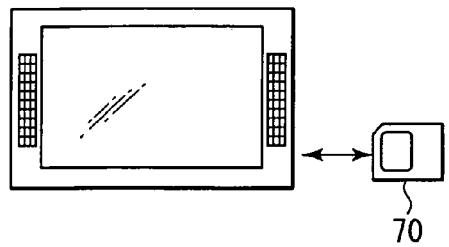
FIG. 52A          FIG. 52B
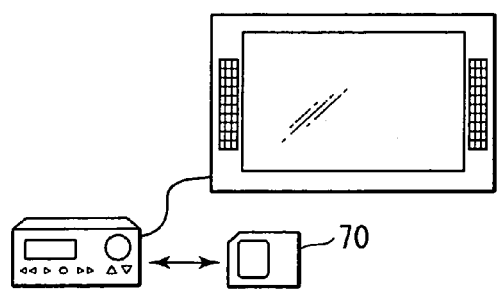
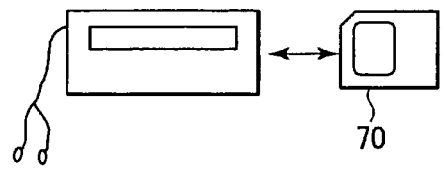
FIG. 52C          FIG. 52D
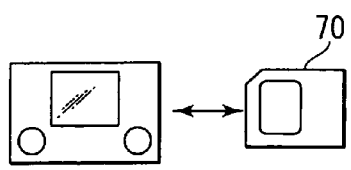
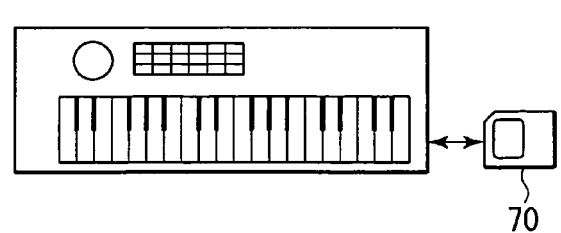
FIG. 52E          FIG. 52F

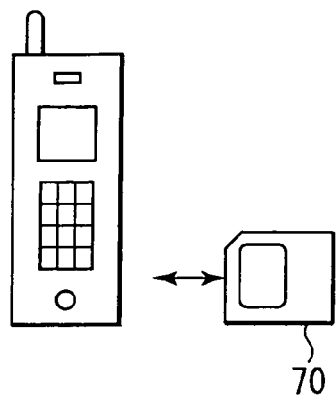
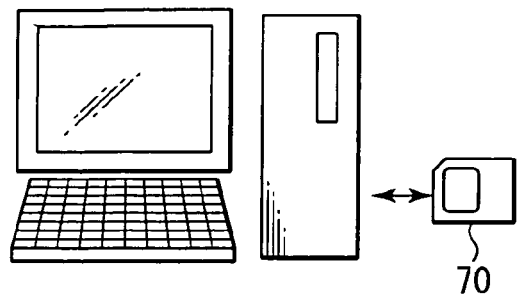
FIG. 53A            FIG. 53B
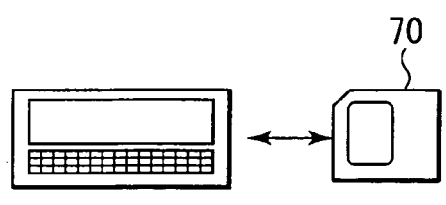
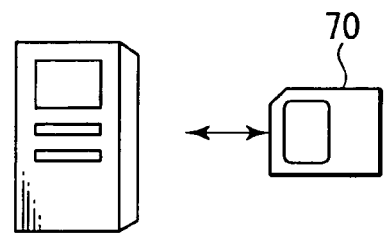
FIG. 53C            FIG. 53D
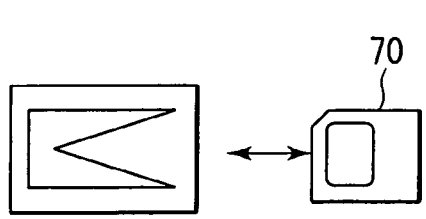
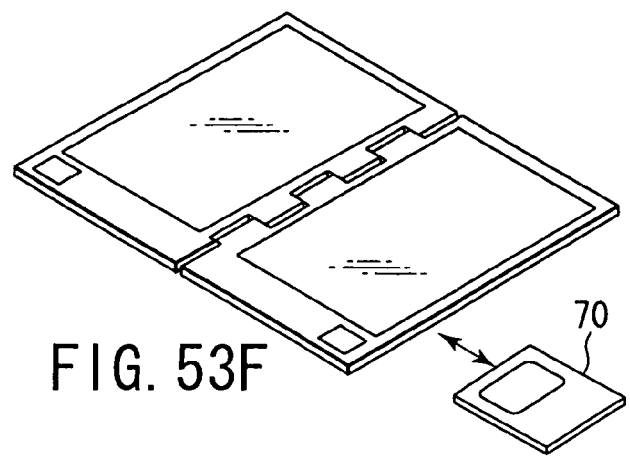
FIG. 53E            FIG. 53F

ELECTRONIC CARD WITH PROTECTION AGAINST AERIAL DISCHARGE

CROSS-REFERENCE TO RELATED APPLICATIONS

This application is a continuation of U.S. application Ser. No. 10/722,598, filed Nov. 28, 2003 now U.S. Pat. No. 6,952,027) and is based upon and claims the benefit of priority from the prior Japanese Patent Application No. 2002-348935, filed Nov. 29, 2002, the entire contents of each of which are incorporated herein by reference.

BACKGROUND OF THE INVENTION

1. Field of the Invention

This invention relates to a semiconductor integrated circuit device and an electronic card using the same and more particularly to a countermeasure against destruction caused by charging and discharging operations with respect to the semiconductor integrated circuit device itself.

2. Description of the Related Art

A semiconductor integrated circuit device has a protection circuit and protection function to protect it from an excessively large current supplied to an output terminal thereof. The test standard is defined by MIL (Military Standards) and EIAJ (Electronic Industries Association of Japan).

A semiconductor integrated circuit device is not used in a singular form and, in general, it is incorporated into an electronic product and used. Therefore, it is considered that the semiconductor integrated circuit device is normally connected to a ground node or power source in the market. In the test standards defined by MIL and EIAJ, a needle is brought into contact with the output terminal to cause an excessively large current to flow into the semiconductor integrated circuit device for a period of time of several tens of nanoseconds to several microseconds. During the test, the semiconductor integrated circuit device is set in a state in which it is connected to the ground node or power source. In this state, the protection circuit and protection function cause the excessively large current in the semiconductor integrated circuit device to leak into the ground node or power source, thus protecting the integrated circuit. As a result, the semiconductor integrated circuit device becomes difficult to be destroyed even if an excessively large current is inadvertently supplied thereto. Thus, the reliability and durability of the electronic product in which the semiconductor integrated circuit device is incorporated are enhanced.

In recent years, the application range of semiconductor integrated circuit devices covers not only electronic products but also various media such as recording media and information media. Conventional recording media and information media are magnetic cards and magnetic disks that magnetically store information. The magnetic storing device replace by a nonvolatile semiconductor memory device. Thus, the information storage amount, information holding characteristics, the degree of information secrecy and the like can be enhanced in comparison with magnetic cards and magnetic disks. Examples of the recording media are called memory cards or IC cards and are widely available on the market. As document which discloses a memory card, for example, document 1 is given. In this specification, all of the recording media and information media utilizing semiconductor integrated circuit devices are called electronic cards.

Document 1: Shigeo Araki, "The Memory Stick", the web site <hyperlink symbology omitted> pp. 40–46

Like the magnetic card and magnetic disk, the electronic card is not always used while it is incorporated in the electronic product. A person carries the electronic card. That is, the semiconductor integrated circuit device in the electronic card is most frequently set in a state in which it is not electrically connected to the ground node or power source. Further, the conventional protection circuit and protection function cause an excessively large current to leak into the ground node or power source. Therefore, if the semiconductor integrated circuit device is placed in a severe environment while it is connected to neither the ground node nor the power source, there occurs a possibility that the integrated circuit cannot be fully protected by use of a conventional protection circuit and protection function.

BRIEF SUMMARY OF THE INVENTION

An electronic card according to an aspect of the present invention includes a card terminal which is exposed on a surface of a card, a semiconductor integrated circuit chip including an insulated-gate field effect transistor, and a protection circuit which is provided between the card terminal and the insulated-gate field effect transistor, the protection circuit configured to protect the insulated-gate field effect transistor from destruction against a pulse having a pulse width of ins or less applied to the card terminal.

BRIEF DESCRIPTION OF THE SEVERAL VIEWS OF THE DRAWING

FIG. 23 is a view showing a relationship between a fuse connection/disconnection state; and a protection capability and a current driving capability;

FIG. 35 is a view showing a relationship between a state of a fuse connection/disconnection; and a protection capability and a current driving capability.

FIGS. 52A to 52F are views showing other examples of an electronic equipment utilizing an IC card according to embodiments of the present invention; and FIGS. 53A to 53F are views showing other examples of electronic equipment utilizing an IC card according to embodiments of the present invention.

DETAILED DESCRIPTION OF THE INVENTION

There will now be described embodiments of this invention with reference to the accompanying drawings. In the following explanation, like reference symbols are attached to common portions throughout the whole drawings.

Before explaining the embodiments, an unexpected situation which may occur while a semiconductor integrated circuit device is connected to neither a ground node nor a power source is explained.

Figure 1A:
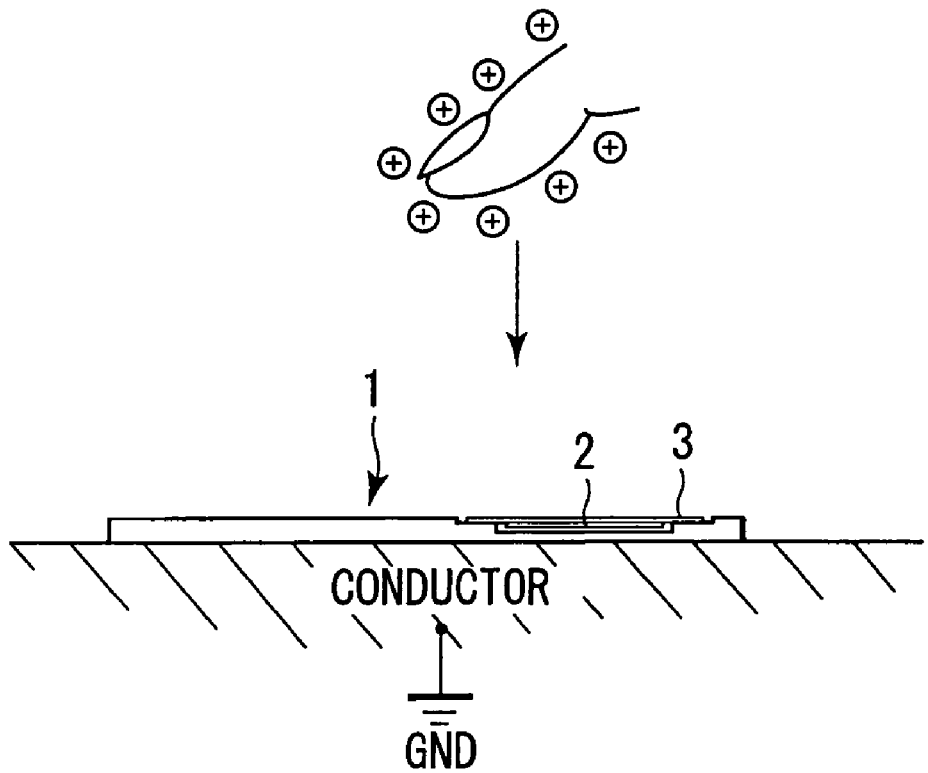
FIGS. 1A and 1B are views for illustrating one example of an unexpected situation.
Figure 1B:
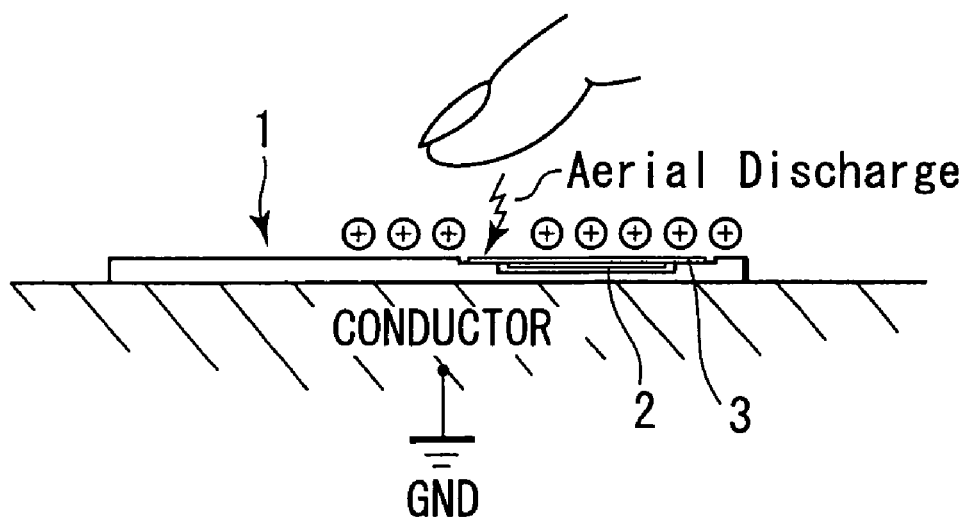

FIGS. 1A and 1B are views for illustrating one example of an unexpected situation.

As shown in FIG. 1A, an electronic card 1 is placed on a grounded conductor. A semiconductor integrated circuit device chip 2 in the electronic card 1 is connected to neither a ground node nor a power source. Assume that a "positively" charged body, for example, a fingertip is set close to the electronic card 1 in this state. When the distance between the fingertip and the electronic card 1 becomes a certain distance, an aerial discharge occurs between the fingertip and the electronic card 1 as shown in FIG. 1B. As a result, the electronic card 1 or chip 2 is positively charged.

Figure 2A:
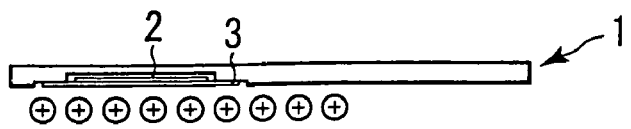
FIGS. 2A and 2B are views for illustrating another example of an unexpected situation.
Figure 2B:
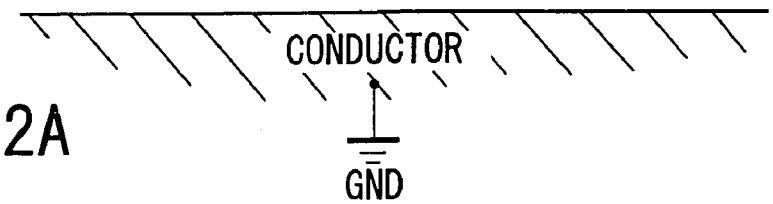

FIGS. 2A and 2B are views for illustrating another example of an unexpected situation.

As shown in FIG. 2A, assume that the electronic card 1 is "positively" charged, for example. Further, assume that the electronic card 1 is dropped on a grounded conductor, for example. As in the case of FIGS. 1A and 1B, the chip 2 in the electronic card 1 is connected to neither the ground node nor the power source. Also, in this case, when the distance between the electronic card 1 and the grounded conductor becomes a certain distance, an aerial discharge occurs between the electronic card 1 and the grounded conductor. As a result, the electronic card 1 is discharged conversely to the case shown in FIGS. 1A and 1B.

Figure 3A:
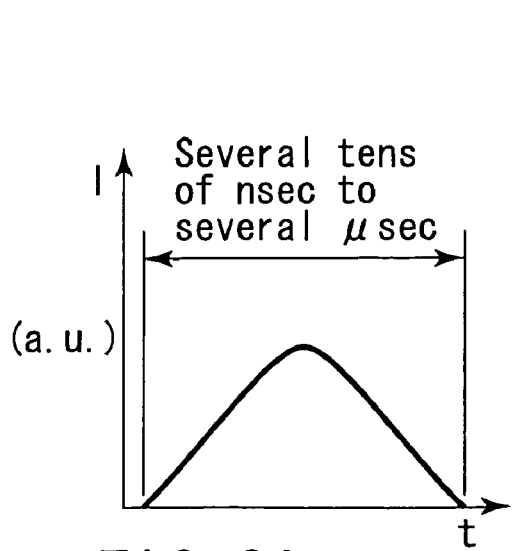
FIG. 3A is a diagram showing the relation between a current I and time t in a case where a needle is brought into contact with an output terminal.

A limitation is put on the protection of the integrated circuit by use of a protection circuit or protection function which causes an excessively large current to leak into the ground node or power source if the electronic card 1 is connected to neither the ground node nor the power source. For example, in the test standards defined by MIL and EIAJ, a needle is brought into contact with the output terminal to permit an excessively large current to flow into the semiconductor integrated circuit device for a period of time of several tens of nanoseconds to several microseconds. In order to meet the above standard, the protection circuit or protection function causes the excessively large current to leak into the ground node or power source for a period of time of several tens of nanoseconds to several microseconds. FIG. 3A shows the relation between a current I and time t in a case where a needle is brought into contact with the output terminal.

Figure 3B:
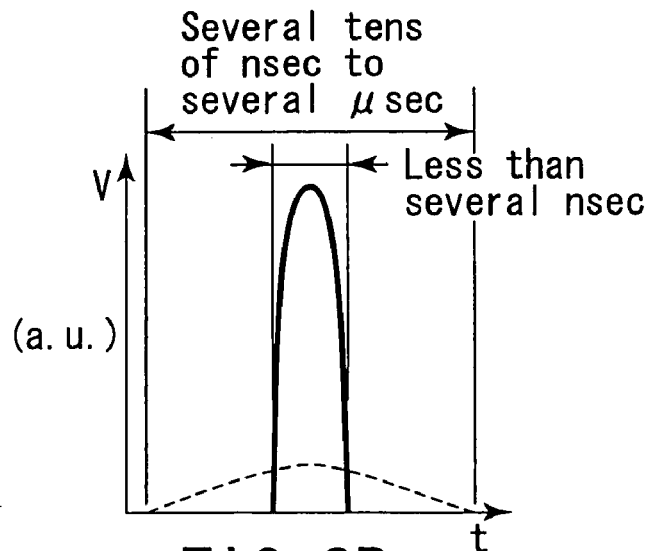
FIG. 3B is a diagram showing the relation between voltage V and time t in a case where an aerial discharge occurs.

In the above state, excessively high voltage is applied to the electronic card 1 and/or chip 2 while the chip 2 is connected to neither the ground node nor the power source. As a result, an aerial discharge occurs between the electronic card 1 and/or chip 2 and the charged body or ground node. It is considered that the aerial discharge terminates in several nanoseconds or less and generally 1 nanoseconds or less and the time of the aerial discharge is extremely shorter than the test time defined by MIL or EIAJ. Further, the voltage is extremely higher than that obtained in a case wherein the excessively large current flows. FIG. 3B shows the relation between voltage V and time t in a case where the gaseous discharge occurs. In FIG. 3B, the relation between voltage V and time t in a case where the needle is brought into contact with the output terminal is shown by use of broken lines for comparison with the above case. The unexpected situation is difficult to overcome only by use of a protection circuit and protection function which satisfies the test standard of MIK or EIAJ.

Figure 4A:
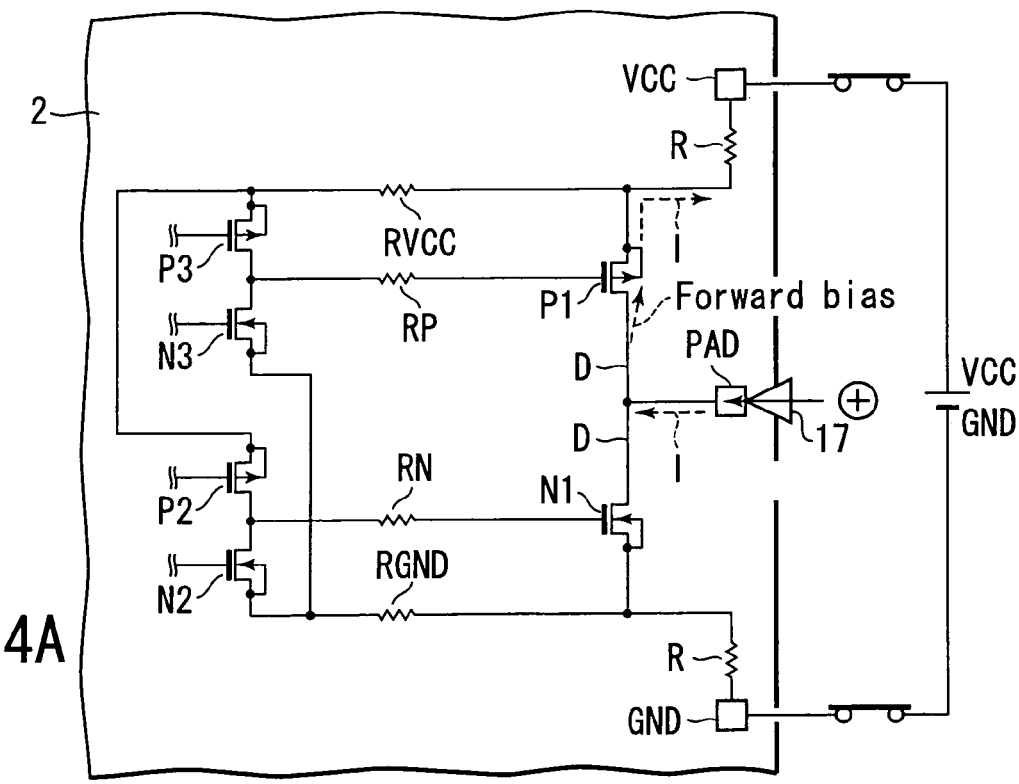
FIGS. 4A and 4B are circuit diagrams showing a semiconductor integrated circuit device according to a reference example of the present invention.
Figure 4B:
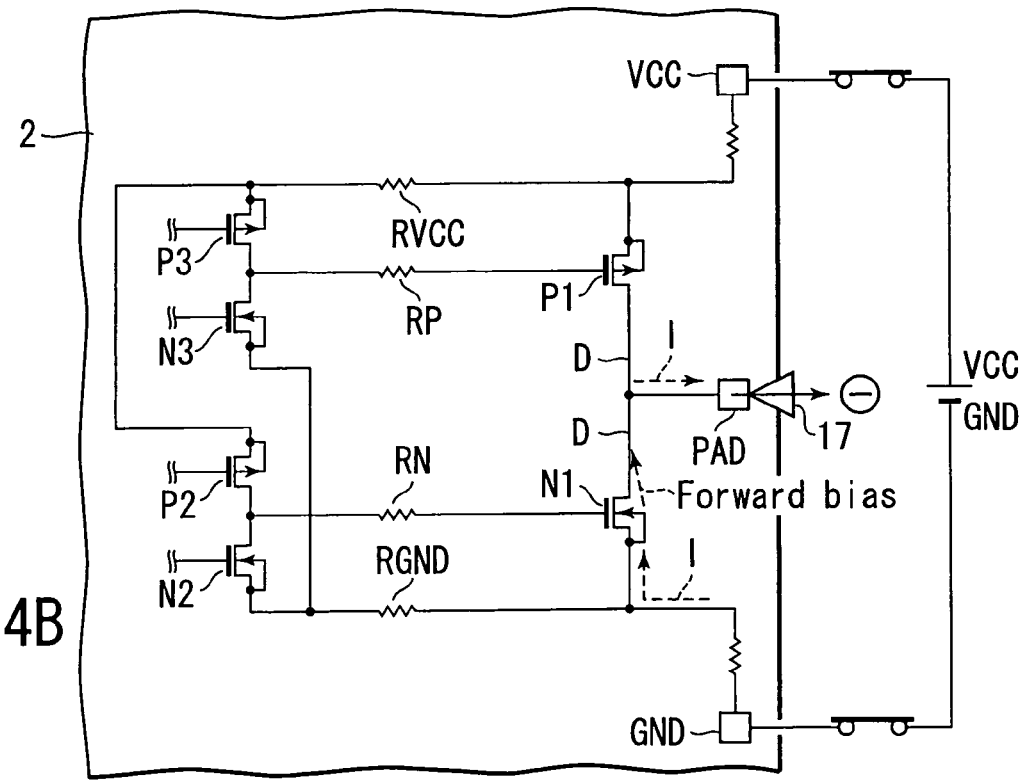

FIGS. 4A and 4B are circuit diagrams showing a semiconductor integrated circuit device according to a reference example of the present invention.

FIGS. 4A and 4B show a portion of the output circuit of the chip 2 and show the state in which the chip 2 is connected to a ground node GND and power source VCC. The output circuit protects the integrated circuit in the following manner when an excessively large current flows in an output terminal PAD.

As shown in FIG. 4A, a needle 17 to which positive potential is applied is brought into contact with the output terminal PAD. Thus, an excessively large current I is caused to flow towards the drain D of an N-channel MOSFET N1 and the drain D of a P-channel MOSFET P1 of the output circuit. In this case, the PN junction between the drain D of the transistor P1 and an N-type well (or an N-type semiconductor substrate) in which the drain D is formed, is forwardly biased. The excessively large current I flows into the power source VCC.

On the other hand, the needle 17 to which negative potential is applied is brought into contact with the output terminal PAD. In this case, as shown in FIG. 4B, the PN junction between the drain D of the transistor N1 and an N-type semiconductor substrate (or an N-type well) in which the drain D is formed is forwardly biased. The excessively large current I flows from the ground node GND into the output terminal PAD.

Thus, the semiconductor integrated circuit device according to the reference example satisfies the test standards of MIL and EIAJ and protects the integrated circuit from the excessively large current I.

Figure 5A:
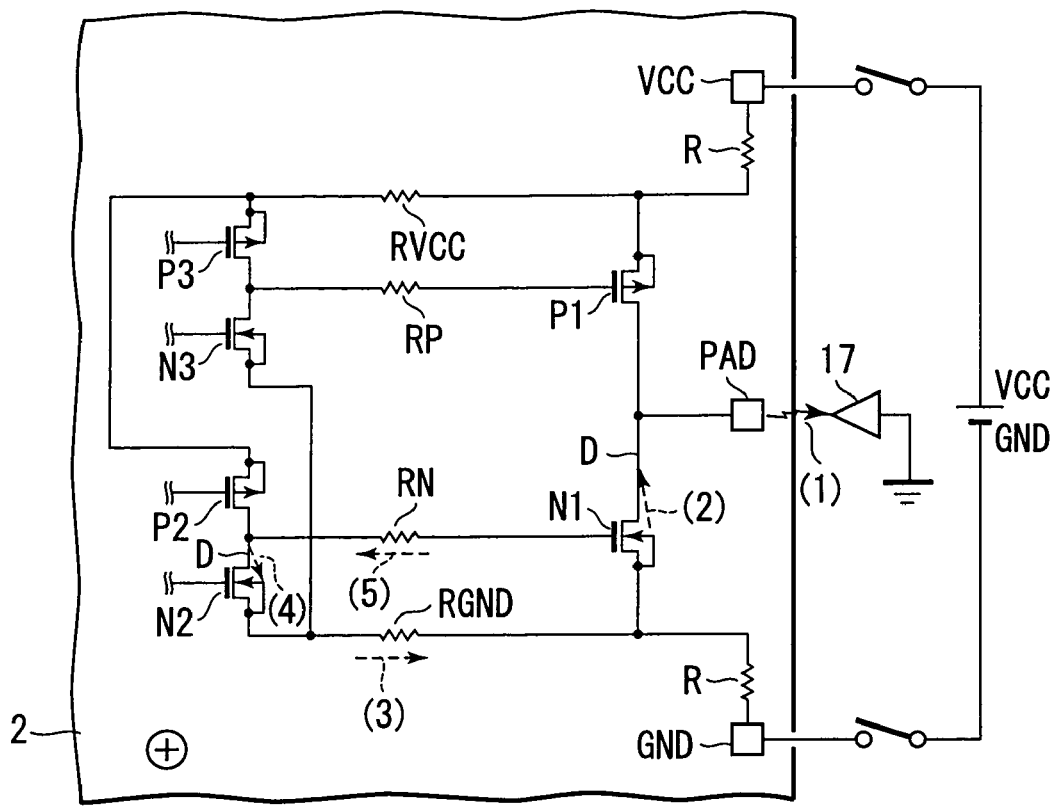
FIG. 5A is a circuit diagram showing a semiconductor integrated circuit device according to a reference example of the present invention.
Figure 5B:
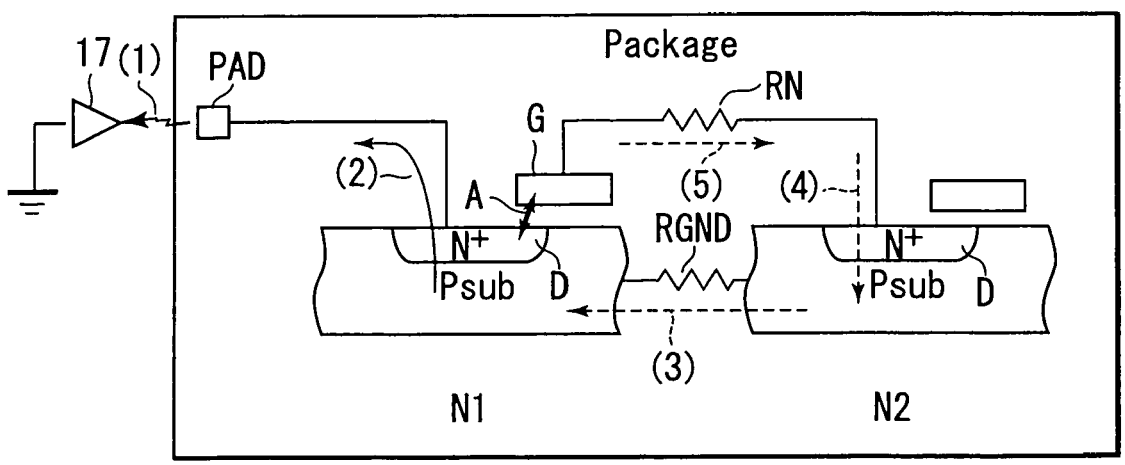
FIG. 5B is a cross-sectional view schematically showing the semiconductor integrated circuit device of FIG. 5A.

However, the inventor of this application has detected that the following destruction mode occurs when the chip 2 is connected to neither the ground node GND nor the power source VCC as shown in FIGS. 5A and 5B.

Assume that the chip 2 is positively charged for some reason as shown in FIGS. 5A and 5B. A grounded needle 17 is set close to the output terminal PAD of the positively charged chip 2. Then, an aerial discharge occurs between the output terminal PAD and the needle 17 (1). Therefore, the potential of the drain D of the transistor N1 is lowered and the P-type semiconductor substrate Psub is forwardly biased so as to permit a current to flow between the drain D and the semiconductor substrate. As a result, the potential of a portion of the substrate around the drain D is lowered (2). A lowering in the potential is spread in the internal portion of the substrate via a wiring (ground line GND) connected to the ground node GND (3). This is because the ground line GND has resistance RGND. The lowering in the potential soon reaches a drive circuit which drives the transistor N1. The drive circuit includes an N-channel MOS transistor N2. When the lowering in the potential has reached a portion around the drain D of the transistor N2, a portion between the drain D and the P-type semiconductor substrate is broken down (4). The gate of the transistor N1 is discharged and the gate potential of the transistor N1 is lowered (5).

At this time, time delay occurs between a lowering in the potential of the drain D of the transistor N1 and a lowering in the potential of the gate thereof. This is because the ground line GND has resistance RGND and the wiring which connects the drain of the transistor N2 to the gate of the transistor N1 has resistance RN. Therefore, a lowering in the gate potential is delayed and a potential difference A temporarily occurs between the drain D and gate G of the transistor N1 as shown in FIG. 5B. It is required for the gate insulating film of the transistor N1 to withstand the potential difference A. However, it is predicted that the potential difference occurring in the case of aerial discharge will reach several thousand V and the destruction cannot be avoided.

Thus, when an unexpected situation occurs in a case where the chip 2 is connected to neither the ground node GND nor the power source VCC, the integrated circuit is destroyed.

Next, a semiconductor integrated circuit device which can overcome the unexpected situation is explained as first to fourth embodiments of the present invention.

(First Embodiment)

Figure 6A:
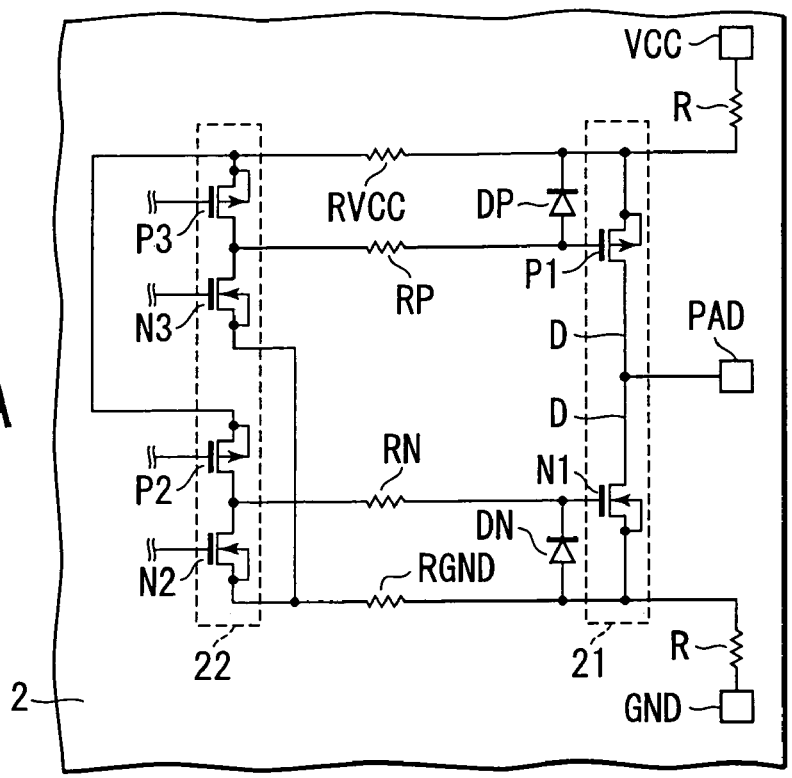
FIG. 6A is a circuit diagram showing a semiconductor integrated circuit device according to a first embodiment of the present invention.

FIG. 6A is a circuit diagram showing a semiconductor integrated circuit device according to a first embodiment of the present invention.

As shown in FIG. 6A, the semiconductor integrated circuit device according to the first embodiment is an output circuit. The output circuit includes an output buffer 21 which drives an output terminal PAD, and a drive circuit 22 which drives the output buffer 21 based on a signal from an internal portion of an integrated circuit.

The output buffer 21 includes an N-channel insulated-gate field effect transistor N1 having a drain connected to the output terminal PAD and a source and back-gate coupled to the ground node GND and a P-channel insulated-gate field effect transistor P1 having a drain connected to the output terminal PAD and a source and back-gate coupled to the power source VCC. One example of the insulated-gate field effect transistor is a MOSFET. The gates of the transistors P1 and N1 are connected to the drive circuit 22.

The drive circuit 22 includes an N-channel insulated-gate field effect transistor N2 having a drain coupled to the gate of the transistor N1 and a source and back-gate coupled to the ground node GND and a P-channel insulated-gate field effect transistor P2 having a drain coupled to the gate of the transistor N1 and a source and back-gate coupled to the power source VCC. The transistors N2, P2 drive the transistor N1 of the output buffer 21 based on a signal from an internal integrated circuit (not shown).

Further, the drive circuit 22 includes an N-channel insulated-gate field effect transistor N3 having a drain coupled to the gate of the transistor P1 and a source and back-gate coupled to the ground node GND and a P-channel insulated-gate field effect transistor P3 having a drain coupled to the gate of the transistor P2 and a source and back-gate coupled to the power source VCC. Like the transistors N2, P2, the transistors N3, and P3 drive the transistor P1 of the output buffer 21 based on a signal from an internal integrated circuit (not shown).

The output circuit according to the present embodiment includes a diode DN having a cathode connected to the gate of the transistor N1 and an anode coupled to the ground node GND and a diode DP having an anode connected to the gate of the transistor P1 and a cathode coupled to the power source VCC. The cathode of the diode DN is formed adjacent to the drain of the transistor N1 and the anode of the diode DP is formed adjacent to the drain of the transistor P2. One example of the pattern plane is shown in FIG. 6B.

Figure 6B:
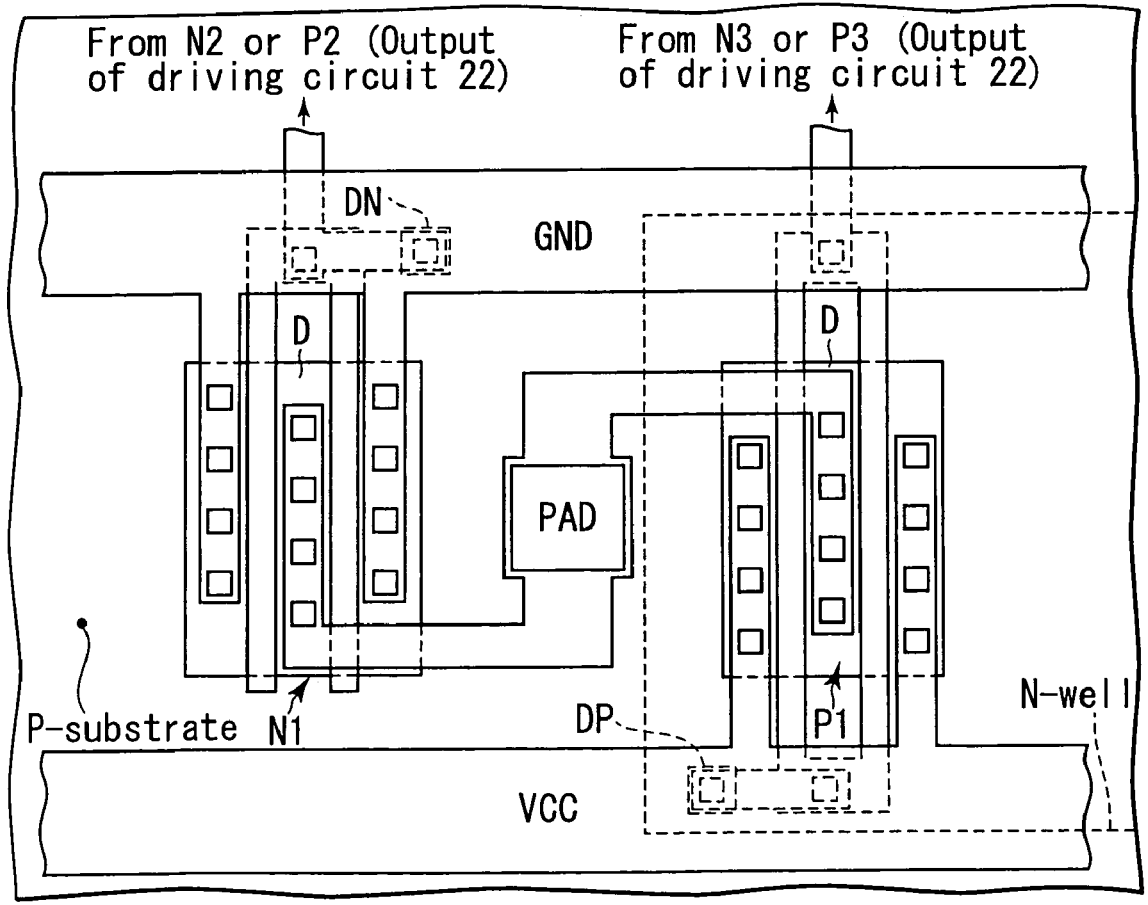
FIG. 6B is a plan view showing one example of a plane pattern of the semiconductor integrated circuit device of FIG. 6A.

As shown in FIG. 6B, in the plane pattern of one example, the transistors N1, P1 and output terminal PAD are arranged in an area between the ground line GND and the power source line VCC. For example, the ground line GND and the power source line VCC are formed of a second-layered metal film. The output terminal PAD is arranged between the transistors N1 and P1. For example, the cathode of the diode DN is formed in a portion of the P-type semiconductor substrate Psub which lies below the ground line GND and connected to the gate of the transistor N1 via a first-layered metal film which lies closer to the substrate side than the second-layered metal film. Likewise, for example, the anode of the diode DP is formed in a portion of the N-type well N-well which lies below the power source line VCC and connected to the gate of the transistor P1 via the first-layered metal film. Although not shown in the drawing, the transistors N2, P2, N3, P3 are arranged in an area other than the area in which the transistors N1, P1 are arranged. Therefore, the distance from the drain of the transistor N1 to the cathode of the diode DN is shorter than the distance from the drain of the transistor N1 to the drain of the transistor N2. Likewise, the distance from the drain of the transistor P1 to the anode of the diode DP is shorter than the distance from the drain of the transistor P1 to the drain of the transistor P3.

The unexpected situation can be overcome by providing the diodes DN, DP. This is explained in detail below.

Figure 7A:
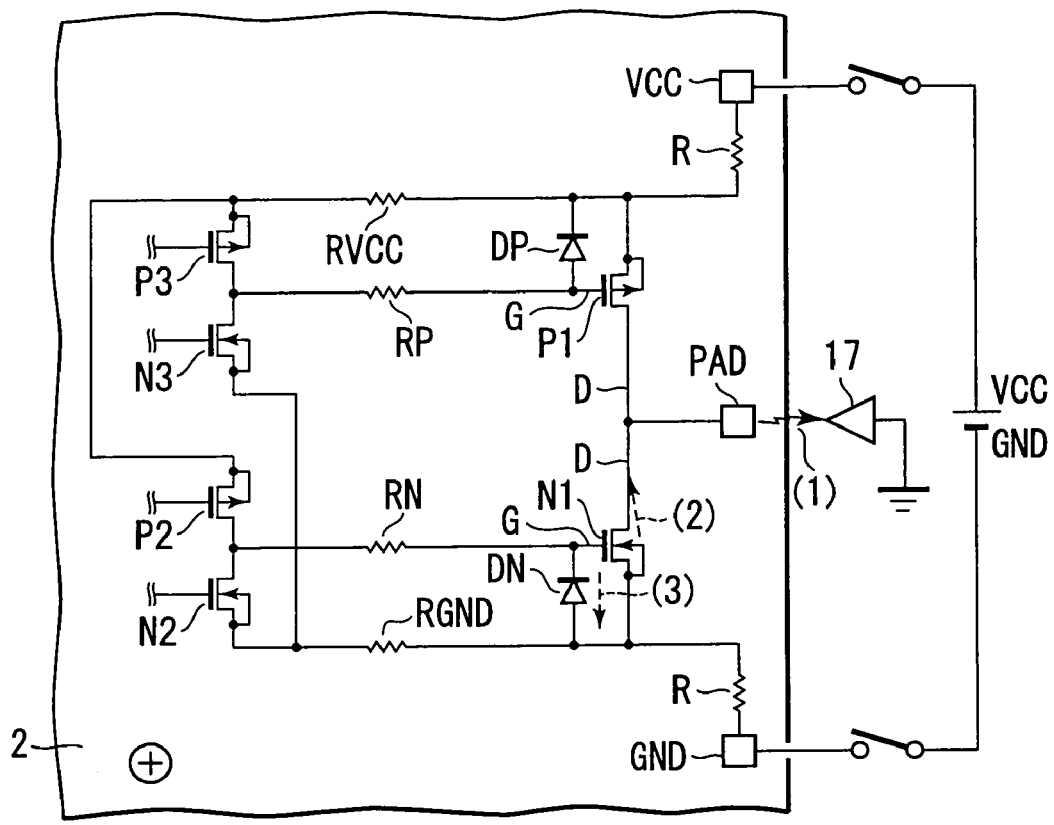
FIGS. 7A and 7B are a diagram and view for illustrating one example of the protection operation of the semiconductor integrated circuit device according to the first embodiment of the present invention.
Figure 7B:
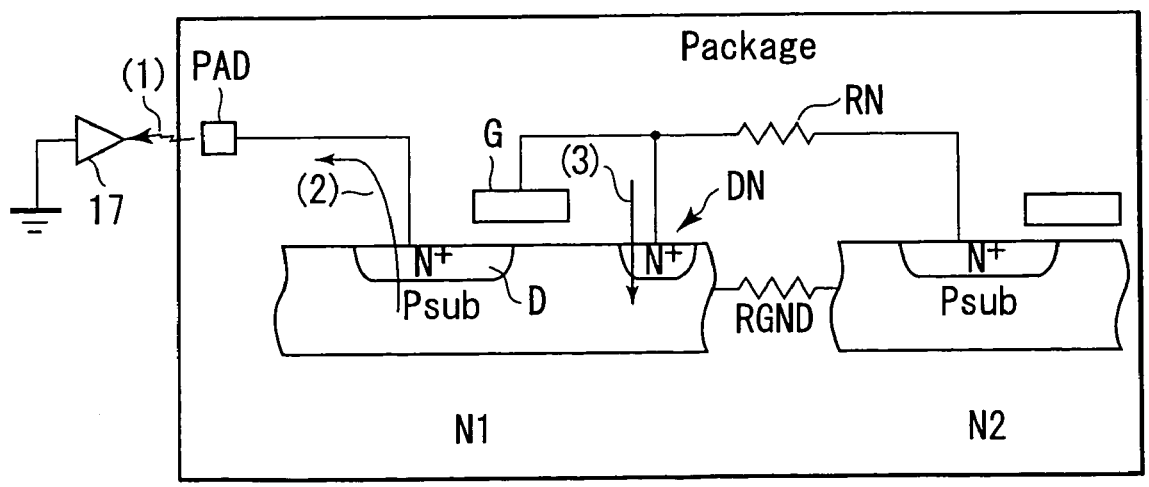

FIGS. 7A and 7B are a diagram and view for illustrating one example of the protection operation of the semiconductor integrated circuit device according to the first embodiment of the present invention. In this example, it is assumed that the chip 2 is positively charged.

As shown in FIGS. 7A and 7B, the grounded needle 17 is set closer to the output terminal PAD of the positively charged chip 2 to cause an aerial discharge between the output terminal PAD and the needle 17 (1). Then, the potential of the drain D of the transistor N1 is lowered, the drain D and the P-type semiconductor substrate Psub are forwardly biased, a current flows between the drain D and the P-type semiconductor substrate and potential of a portion of the substrate around the drain D is lowered (2). A diode DN having a substrate Psub used as an anode and an N-type semiconductor region N+ formed adjacent to the drain D and used as a cathode is broken down when a lowering in the substrate potential occurs (3). As a result, the gate potential of the transistor N1 is lowered. The breakdown occurs after reverse voltage in a reverse direction of the diode DN, generally a potential difference of approximately 15 V has occurred. However, as described above, voltage caused by the aerial discharge reaches several thousand V. Therefore, the breakdown occurs instantaneously. Further, since the cathode is formed adjacent to the drain of the transistor N1, the distance from the transistor N1 to the cathode is sufficiently short. Therefore, a time difference between the lowering in the potential of the drain of the transistor N1 and the lowering in the potential of the gate thereof can be made smaller in comparison with that of the reference example. As a result, it can be considered that the potential difference does not substantially occur between the drain D and gate G of the transistor N1. Therefore, even when an aerial discharge occurs with respect to the chip 2 in a state in which the chip 2 is connected to neither the ground node GND nor the power source VCC, the gate insulating film of the transistor N1 is not destroyed. Thus, the integrated circuit can be protected.

Figure 8A:
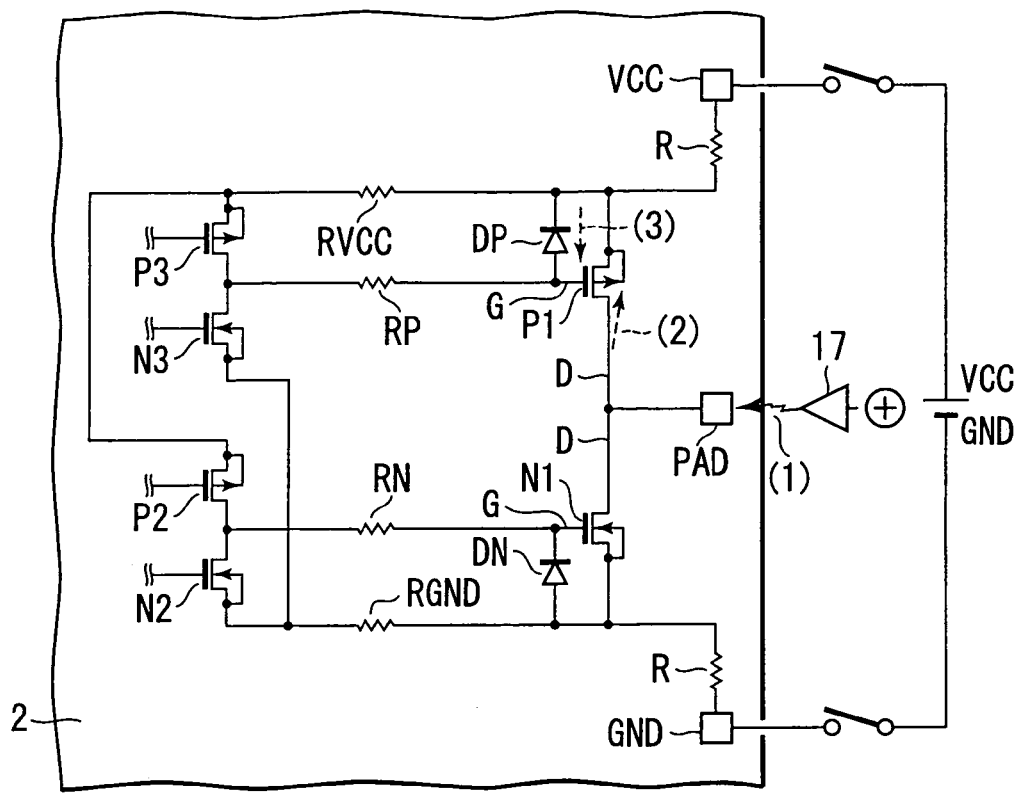
FIGS. 8A and 8B are a diagram and view for illustrating another example of the protection operation of the semiconductor integrated circuit device according to the first embodiment of the present invention.
Figure 8B:
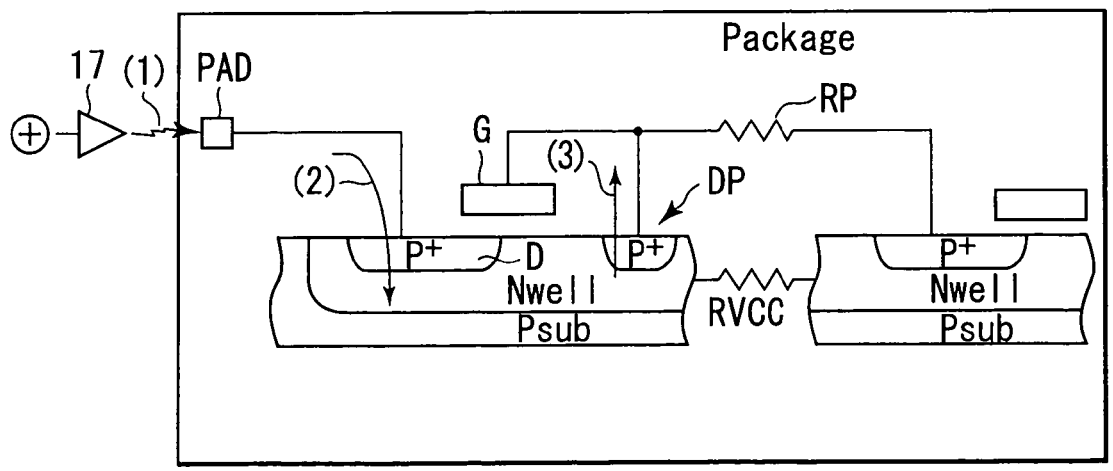

FIGS. 8A and 8B are a diagram and view for illustrating another example of the protection operation of the semiconductor integrated circuit device according to the first embodiment of the present invention. In this example, it is assumed that a positively charged body is set closer to the chip 2.

As shown in FIGS. 8A and 8B, the positively charged needle 17 is set closer to the output terminal PAD of the chip 2 to cause an aerial discharge between the output terminal PAD and the needle 17 (1). Then, the potential of the drain D of the transistor P1 rises, the drain D and the N-type well N-well are forwardly biased, a current flows between the drain D and the N-type well and potential of a portion of the well around the drain D rises (2). A diode DP having the well N-well used as a cathode and a P-type semiconductor region P+ formed adjacent to the drain D and used as an anode is broken down when the well potential rises (3). As a result, the gate potential of the transistor P1 is raised. Thus, even when an aerial discharge occurs towards the chip 2 in a state in which the chip 2 is connected to neither the ground node GND nor the power source VCC, the gate insulating film of the transistor P1 is not destroyed. Thus, the integrated circuit can be protected by the protection operation which is a reverse operation of the case of FIGS. 7A and 7B.

The test standard of MIL and EIAJ can be satisfied by the same protection operation as that of the semiconductor integrated circuit device according to the reference example.

In the present embodiment, the PN junction diode is used as the diode, but it is possible to use a diode other than the PN junction diode.

(Second Embodiment)

Figure 9:
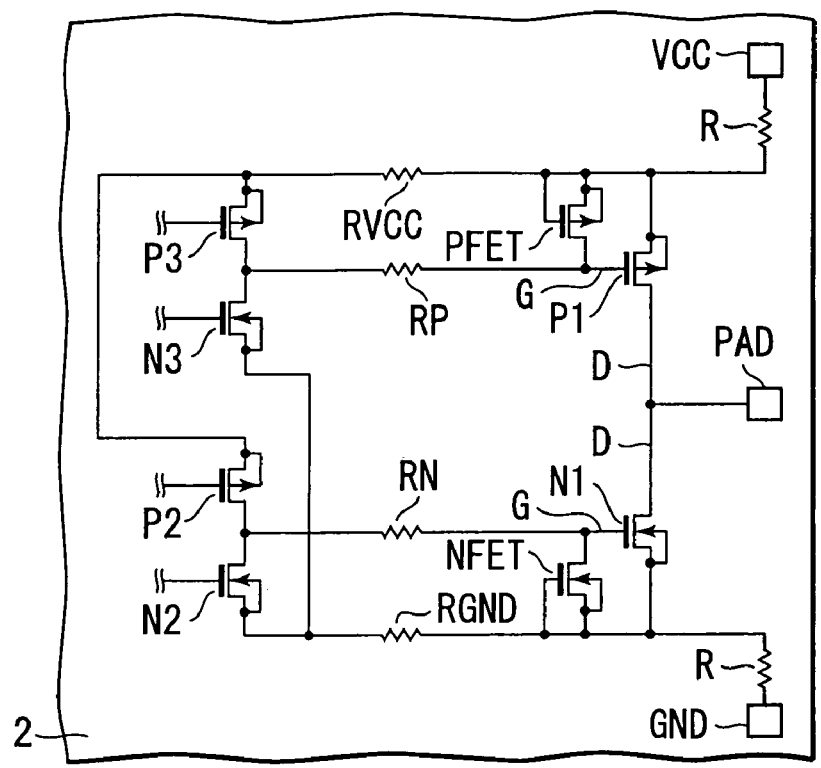
FIG. 9 is a circuit diagram showing a semiconductor integrated circuit device according to a second embodiment of the present invention.

FIG. 9 is a circuit diagram showing a semiconductor integrated circuit device according to a second embodiment of the present invention.

As shown in FIG. 9, the second embodiment is obtained by replacing the diodes DN, DP explained in the first embodiment by insulated-gate field effect transistors NFET, PFET, respectively. For example, an example of the insulated-gate field effect transistor is a MOSFET. The mechanism in which a chip 2 is charged or discharged by an aerial discharge is the same as that of the first embodiment. In this example, utilizing the surface breakdown characteristic of a channel portion of the MOSFET can attain the same effect as that of the first embodiment.

Surface breakdown may occur at a voltage lower than the voltage at which breakdown takes place at the PN junction. The second embodiment is advantageous in that the protection margin relating to the voltage, in particular, is broader than in the first embodiment.

(Third Embodiment)

Figure 10:
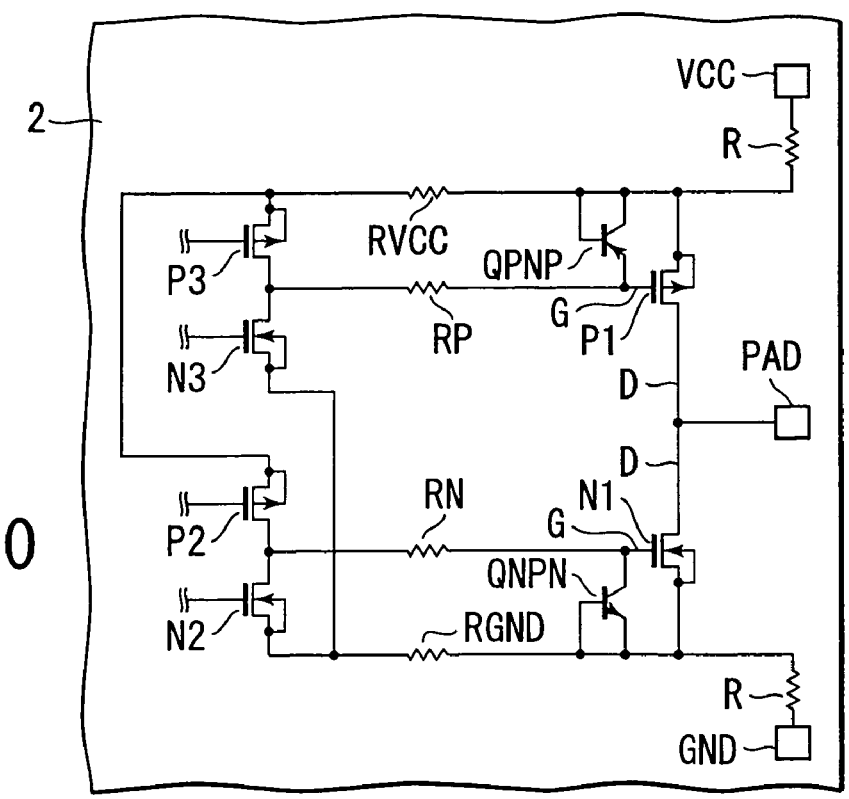
FIG. 10 is a circuit diagram showing a semiconductor integrated circuit device according to a third embodiment of the present invention.

FIG. 10 is a circuit diagram showing a semiconductor integrated circuit device according to a third embodiment of the present invention.

As shown in FIG. 10, the third embodiment is obtained by replacing the diodes DN, DP explained in the first embodiment by bipolar transistors QNPN, QPNP, respectively. Also, in the present embodiment, the mechanism in which a chip 2 is charged or discharged by an aerial discharge is the same as that of the first embodiment. In this example, utilizing the punch through characteristic of the bipolar transistor can attain the same effect as that of the first embodiment.

The third embodiment is advantageous in that a large current can flow because the bipolar transistor QNPN is turned on and/or the bipolar transistor QPNP are is turned on. The third embodiment is advantageous also in that the protection margin relating to the current, in particular, is broader than in the first embodiment.

(Fourth Embodiment)

Now, some of the layout examples of the semiconductor integrated circuit device according to the second embodiment will be described as a fourth embodiment together with their structures.

(First Layout Example)

Figure 11:
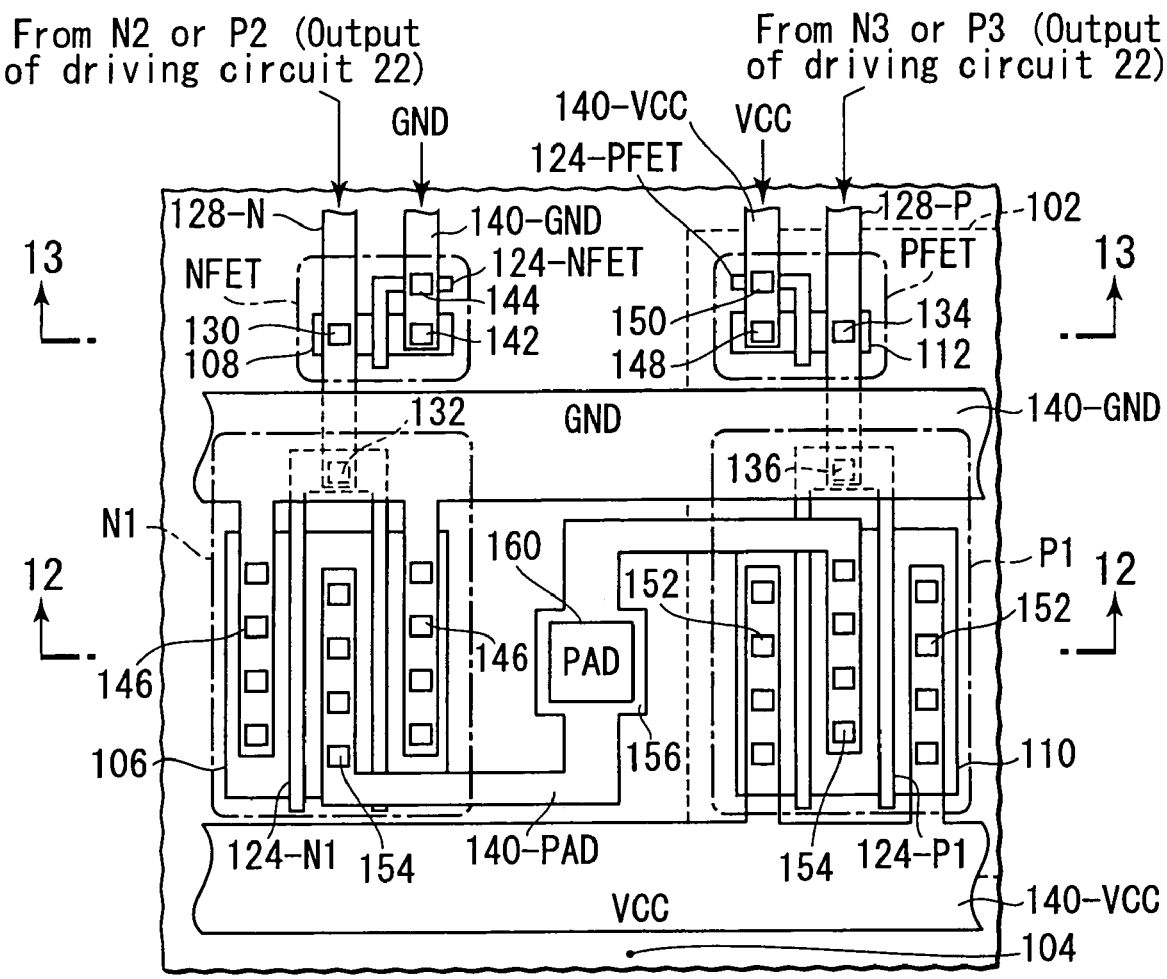
FIG. 11 is a plan view showing a first layout example of a semiconductor integrated circuit device according to a fourth embodiment of the present invention.
Figure 12:
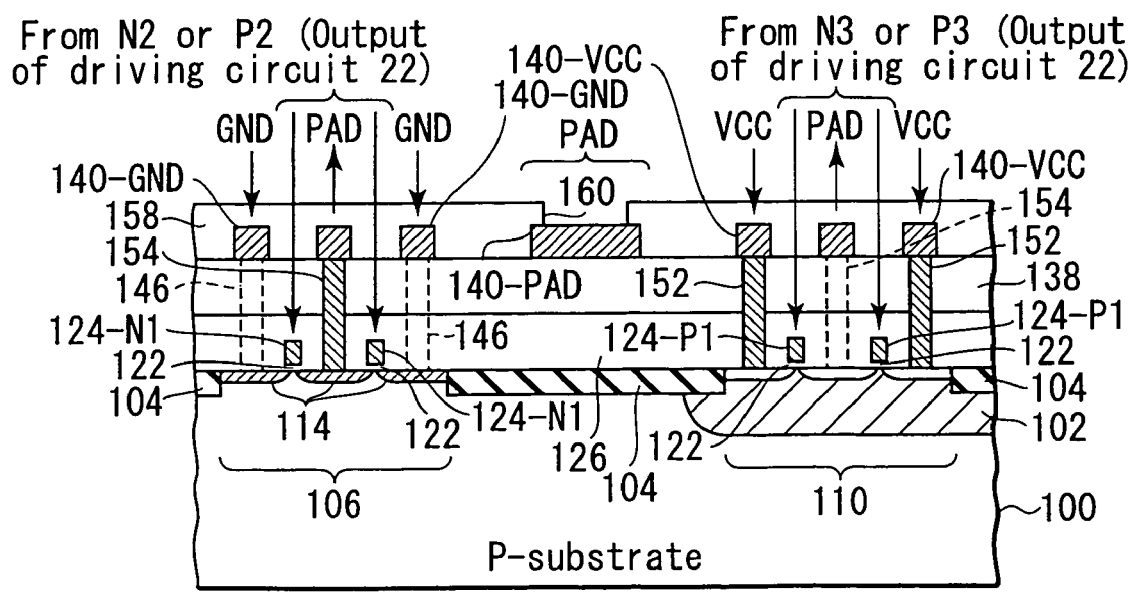
FIG. 12 is a sectional view taken along the line 12—12 in FIG. 11.
Figure 13:
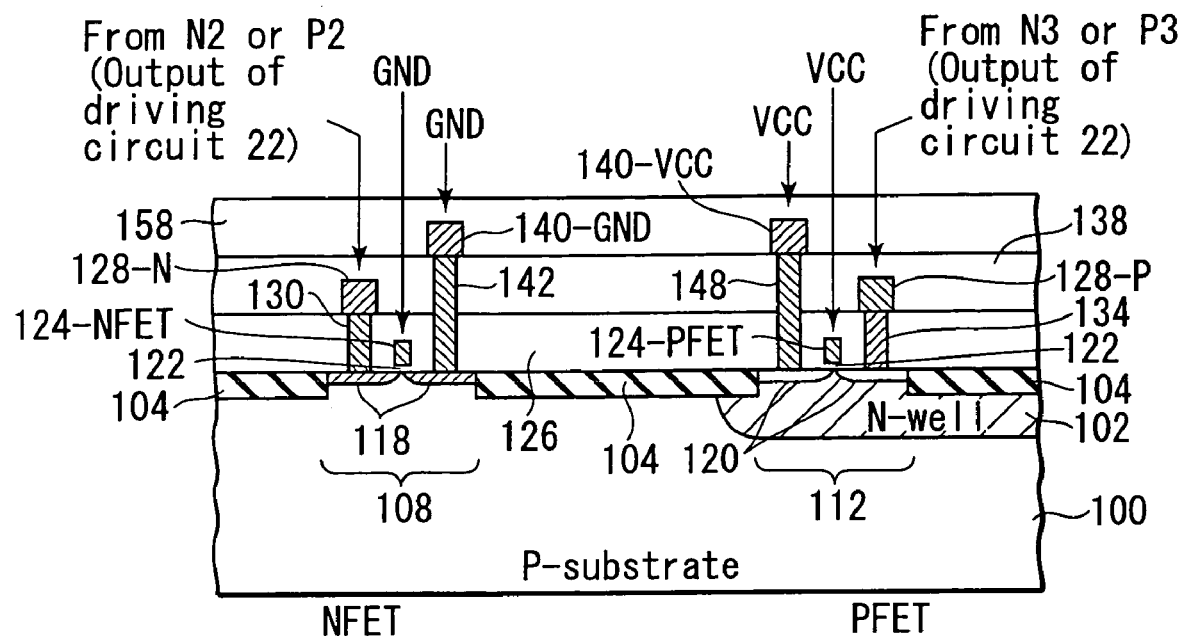
FIG. 13 is a sectional view taken along the line 13—13 in FIG. 11.
Figure 14:
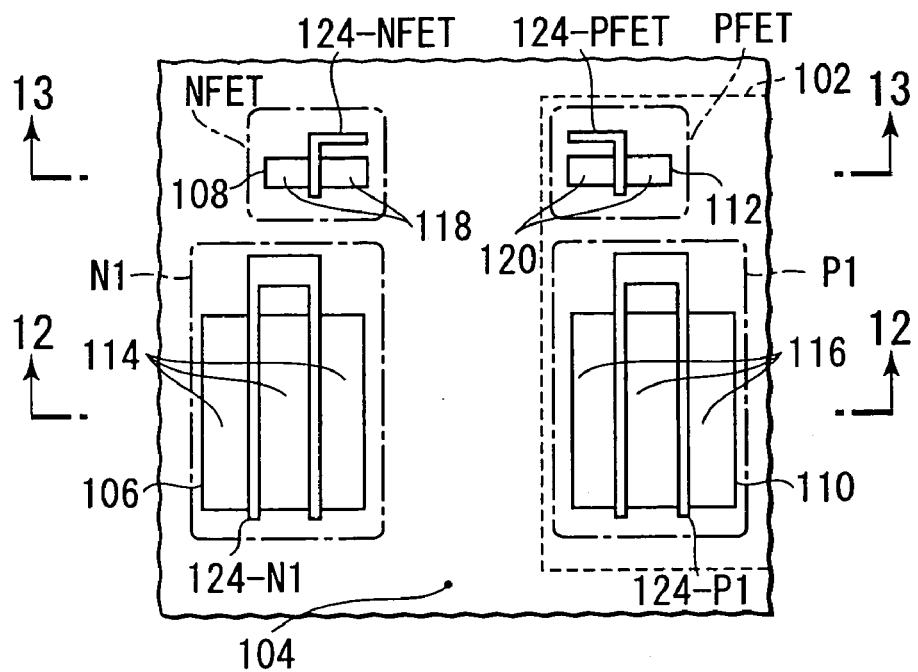
FIG. 14 is a plan view showing a state, in which a first-layered metal film and a second-layered metal film from a plan view shown in FIG. 11.
Figure 15:
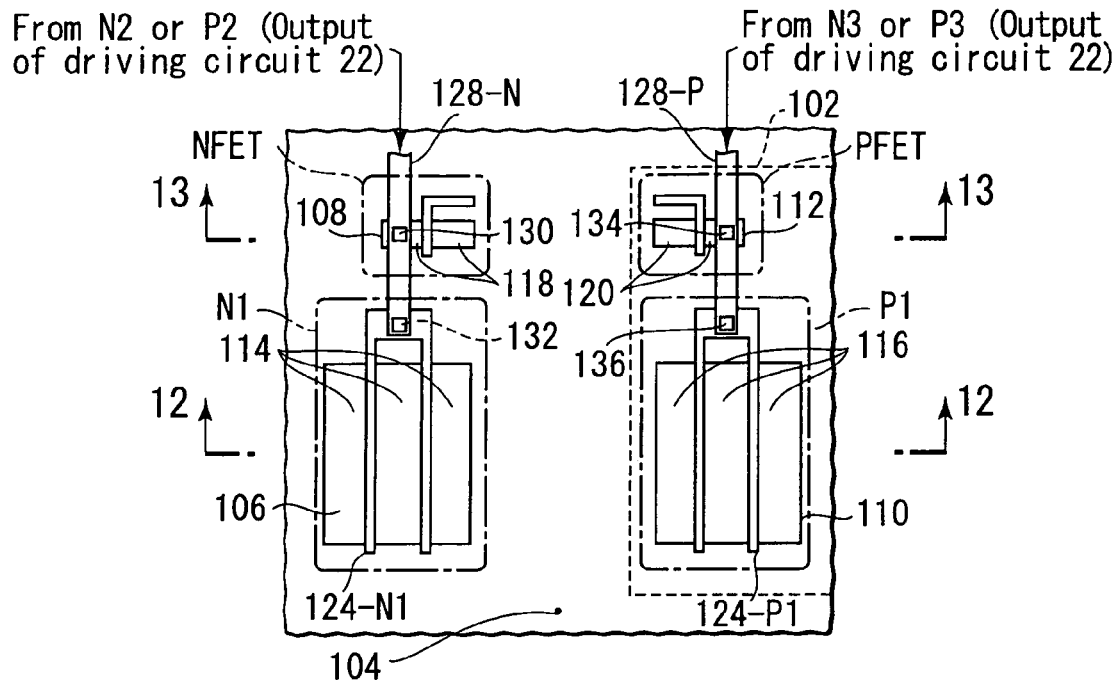
FIG. 15 is a plan view showing a state, in which the second-layered metal film is removed from the plan view shown in FIG. 12.

FIG. 11 is a plan view showing a first layout example of a semiconductor integrated circuit device according to the fourth embodiment of the present invention. FIG. 12 is a sectional view taken along the line 12—12 in FIG. 11. FIG. 13 is a sectional view taken along the line 13—13 in FIG. 11. FIG. 14 is a plan view showing a state in which a first-layered metal film and a second-layered metal film have been removed from the plan view shown in FIG. 11. FIG. 15 is a plan view showing a state in which the second-layered metal film has been removed similarly.

As shown in FIGS. 11 to 15, an N-type well (N-well) 102 is formed in a P-type semiconductor substrate (P-substrate), for example, in a P-type silicon substrate 100. An element isolation region 104 formed of a silicon oxide film is formed, for example, in a surface region of the P-type silicon substrate 100 having the N-well 102 formed thereon. In this example, the element isolation region 104 separates active regions 106 and 108 from each other on the P-type silicon substrate 100, and separates active regions 110 and 112 from each other on the N-well 102. The active regions 106 and 108 expose a surface of the P-type silicon substrate 100, and the active regions 110 and 112 expose a surface of the N-well 102. An N-type source/drain diffusion layer 114 of the transistor N1 described in the second embodiment is formed in the active region 106, and a source/drain diffusion layer 116 of the transistor P1 is formed in the active layer 110. Similarly, a source/drain diffusion layer 118 of the transistor NFET described in the second embodiment is formed in the active region 108, and a source/drain diffusion layer 120 of the transistor PFET is formed in the active region 112.

A gate insulating film 122 formed of a silicon oxide film, for example, is formed on the active regions 106, 108, 110, and 112, and a gate layer 124 is formed on the gate insulating film 122. The gate layer 124 is constituted of: for example, a layer structure film between an electrically conductive polysilicon film and a silicide film; a layer structure film between an electrically conductive polysilicon film and a metal film; or a metal film, of the electrically conductive polysilicon film. In this example, the gate layer 124 includes: a gate electrode 124-N1 of the transistor N1; a gate electrode 124-P1 of the transistor P1; a gate electrode 124-NFET of the transistor NFET, and a gate electrode 124-PFET of the transistor PFET. Further, a flat shape of the gate electrode 124-N1 is formed in a U-shape, and the transistor N1 is provided as a structure including two transistors connected in parallel between a power source line VCC and an output terminal PAD. The transistor N1 includes the two transistors connected in parallel, whereby a channel width of the transistor N1 is expanded as compared with a case in which the transistor N1 is single. By expanding the channel width, a driving capability required for driving the output terminal PAD is obtained. The gate electrode 124-P1 also has a flat shape similar to the gate pattern -N1, and a design is made for the transistor P1 in the same manner as in the transistor N1.

A first-layered interlayer insulating film 126 formed of a silicon oxide film, for example, is formed on the P-type silicon substrate 100 having formed thereon the element isolation region 104, the active regions 106, 108, 110, and 112, the gate electrodes 124-N1, 124-P1, 124-NFET, and 124-PFET. A first-layered metal film 128 is formed on the first-layered interlayer insulating film 126. In this example, the first-layered metal film 128 includes a wiring 128-N and a wiring 128-P. The wiring 128-N transmits a signal outputted from the transistor N2 or P2 of the drive circuit 22 to the gate electrode 124-N of the transistor N1, and the wiring 128-P transmits a signal outputted from the transistor N3 or P3 of the drive circuit 22 to the gate electrode 124-P of the transistor P1.

The wiring 128-N is connected to the drain of the source/drain diffusion layer 118 of the transistor NFET via a contact hole or plug 130 formed in the first-layered interlayer insulating film 126. The wiring 128-N is also connected to the gate electrode 124-N1 of the transistor N1 via a contact hole or plug 132 formed in the first-layered interlayer insulating film 126. The contact hole or plug 130 is formed at a portion of the wiring 128-N between an output node (not shown) of the drive circuit 22, a common output node (not shown) of the transistor N2 and transistor P2 in this example and the contact hole or plug 132. In this manner, the drain of the transistor NFET is connected between the output node of the drive circuit 22 and the gate electrode 124-N1 of the transistor N1, and the protection effect described in the foregoing embodiment can be obtained.

Similarly, the wiring 128-P is connected to the drain of the source/drain diffusion layer 120 of the transistor PFET via a contact hole or plug 134 formed in the first-layered interlayer insulating film 126. The wiring 128-P is also connected to the gate electrode 124-P1 of the transistor P1 via a contact hole or plug 136 formed in the first-layered interlayer insulating film 126. The contact hole or plug 134 is formed at a portion of the wiring 128-P between an output node (not shown) of the drive circuit 22, a common output node (not shown) of the transistor N3 and transistor P3 in this example and the contact hole or plug 136. In this manner, the protection effect described in the foregoing embodiment is obtained.

A second-layered interlayer insulating film 138 formed of a silicon oxide film, for example, is formed on the first-layered interlayer insulating film 126 having the first-layered metal film 128 formed thereon. A second-layered metal film 140 is formed on the first-layered interlayer insulating film 138. In this example, the second-layered metal film 140 includes wirings 140-GND, 140-VCC and a wiring 140-PAD. The wiring 140-GND supplies a grounding potential GND to a circuit in a semiconductor integrated circuit device chip, and the wiring 140-VCC supplies a power potential VCC to the circuit of the semiconductor integrated circuit device chip. The wiring 140-PAD transmits a signal outputted from the transistor N1 or P1 of the output buffer 21 to the output terminal PAD.

The wiring 140-GND is connected to the source of the source/drain diffusion layer 118 of the transistor NFET via a contact hole or plug 142 formed in the first-layered interlayer insulating film 126 and the second-layered interlayer insulating film 138 and is also connected to the gate electrode 124-NFET of the transistor NFET via a contact hole or plug 144 formed in the first-layered interlayer insulating film 126 and the second-layered interlayer insulating film 138. The potential of the gate electrode 124-NFET of the transistor NFET and the potential of the source serve as a ground potential GND when power is supplied, and is turned OFF. When power is supplied, the transistor NFET is turned OFF. As a result, while in normal operation, the wiring 128-N is not connected to the ground potential, and a malfunction of the integrated circuit is restricted. Further, the wiring 140-GND is connected to the source of the source/drain diffusion layer 114 of the transistor N1 via a contact hole or plug 146 formed in the first-layered interlayer insulating film 126 and the second-layered interlayer insulating film 138.

The wiring 140-VCC is connected to the source of the source/drain diffusion layer 120 of the transistor PFET via a contact hole or plug 148 formed in the first-layered interlayer insulating film 126 and the second-layered interlayer insulating film 138 and is also connected to the gate electrode 124-PFET of the transistor PFET via a contact hole or plug 150 formed in the first-layered interlayer insulating film 126 and the second-layered interlayer insulating film 138. The potential of the gate electrode 124-PFET of the transistor PFET and the potential of the source serves as a power source potential VCC when power is supplied, and is turned OFF. When power is supplied, the transistor PFET is turned OFF. As a result, while in normal operation, the wiring 128-P is not connected to a ground potential, and a malfunction of the integrated circuit is restricted. Further, the wiring 140-VCC is connected to the source of the source/drain diffusion layer 116 of the transistor P1 via a contact hole or plug 152 formed in the first-layered interlayer insulating film 126 and the second-layered interlayer insulating film 138.

The wiring 140-PAD is connected to the drain of the source/drain diffusion layer 114 of the transistor N1 via a contact hole or plug 154 formed in the first-layered interlayer insulating film 126 and the second-layered interlayer insulating film 138 and is also connected to the drain of the source/drain diffusion layer 114 of the transistor P1. A pad region 156 is provided between the contact holes or plugs 154, of the wiring 140-PAD. A portion of the pad region 156 is larger in width than a portion other than the pad region 156, and is formed in a fringe shape.

A passivation film 158 formed of, for example, a silicon oxide film, a silicon nitride film, or an insulating polyimide film is formed on the second-layered interlayer insulating film 138 having the second layer metal 140 formed thereon. A drilled hole 160 is formed at a portion of the passivation film 158 positioned on the pad region 156, and the pad region 156 is exposed. A bonding pad or a solder ball electrode etc. is formed at the exposed portion, and functions as the output terminal PAD.

In the first layout example, the active region 108 is formed between the gate electrode 124-N1 of the transistor N1 and the output node (not shown) of the drive circuit 22, and the transistor NFET is formed in the active region 108 (refer to FIG. 14 in particular). Further, the drain of the transistor NFET is connected to a portion of the wiring 128-N1 between the output node of the drive circuit 22 and the contact hole or plug 132 (refer to FIG. 15 in particular). In this manner, the drain of the transistor NFET is connected between the output node of the drive circuit 22 and the gate electrode 124-N1 of the transistor N1. The allocation and structure of the transistor PFET are also similar to those of the transistor NFET.

Therefore, according to the first layer example, as has been described in the foregoing embodiment, in a state in which the chip 2 is not connected to the grounding point GND and power source VCC, even in the case where aerial discharge occurs with or from the chip 2, for example, each of the gate insulating film 122 of the transistor N1 and the gate insulating film 122 of the transistor P1 can be protected from breakage.

(Second Layout Example)

Figure 16:
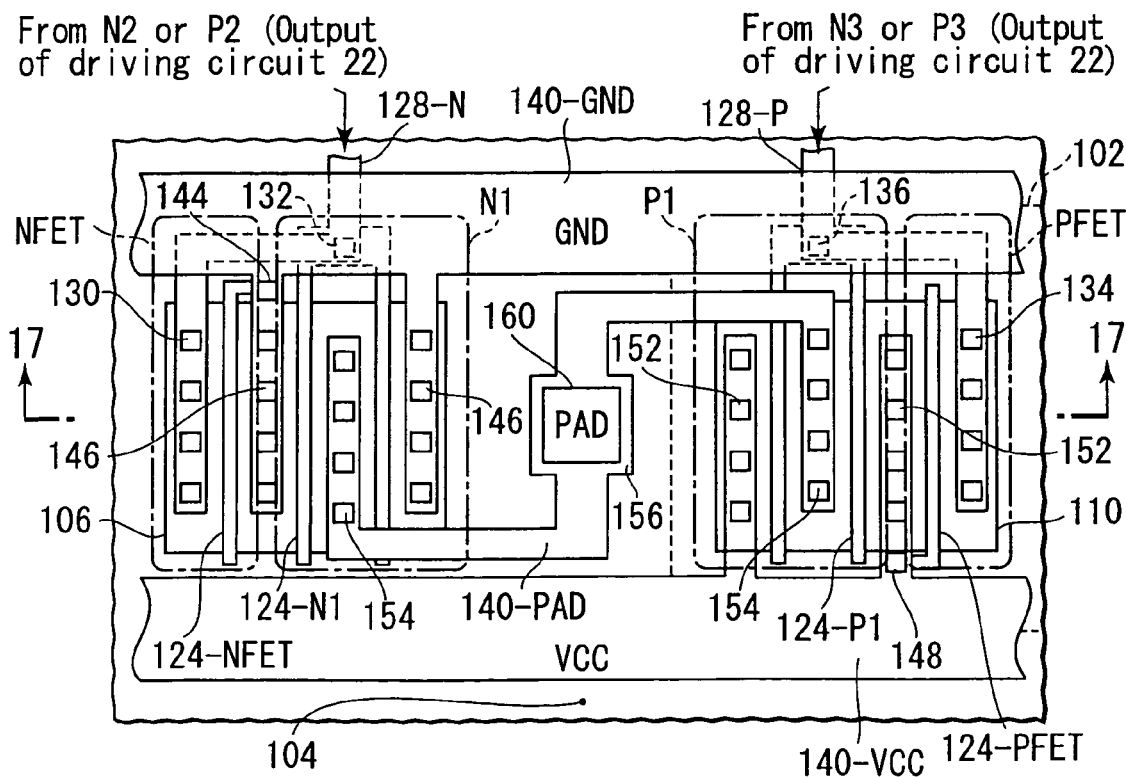
FIG. 16 is a plan view showing a second layout example of the semiconductor integrated circuit device according to the fourth embodiment of the present invention.
Figure 17:
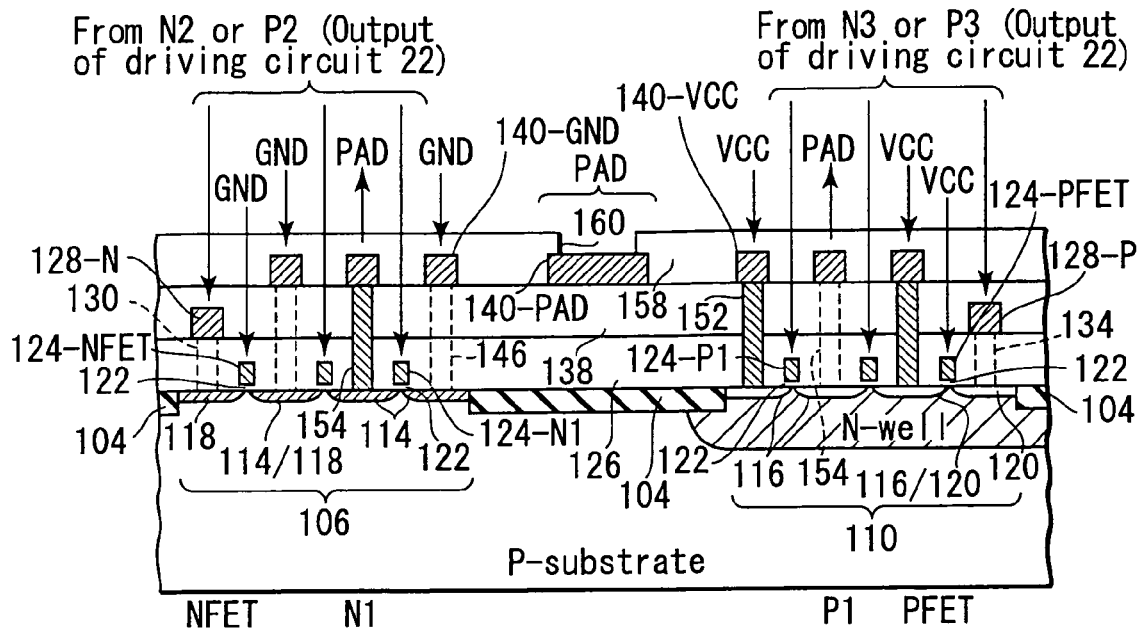
FIG. 17 is a sectional view taken along the line 17—17 in FIG. 16.
Figure 18:
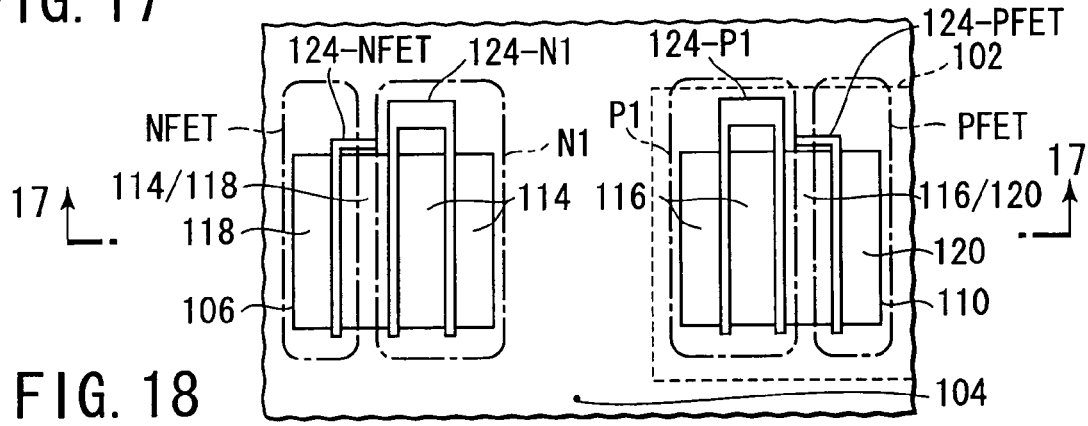
FIG. 18 is a plan view showing a state, in which the first-layered metal film and the second-layered metal film have been removed from the plan view shown in FIG. 16.
Figure 19:
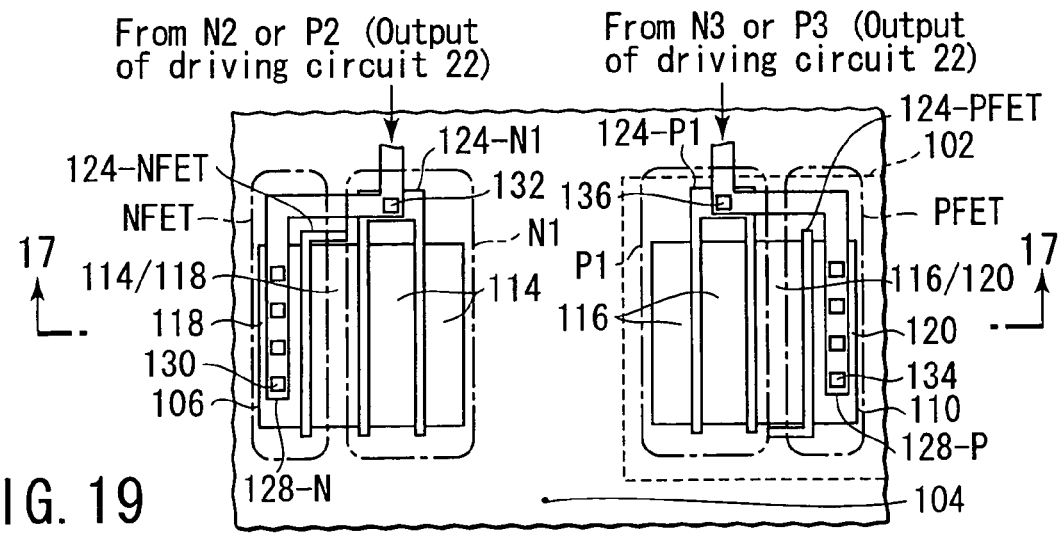
FIG. 19 is a plan view showing a state, in which the second-layered metal film has been removed from the plan view shown in FIG. 16.

FIG. 16 is a plan view showing a second layout example of the semiconductor integrated circuit device according to the fourth embodiment of the present invention. FIG. 17 is a sectional view taken along the line 17—17 in FIG. 16. FIG. 18 is a plan view showing a state in which a first-layered metal film and a second-layered metal film have been removed from the plan view shown in FIG. 16. FIG. 19 is a plan view showing a state in which the second-layered metal film has been removed similarly. In the second layout example, like elements in the first layout example are designated by like reference numerals. A description of different elements will be given here.

The second layout example is particularly different from the first layout example in that the transistor NFET is formed in the active region 106 in which the transistor N1 is formed, and the transistor PFET is formed in the active region 110 in which the transistor P1 is formed.

Further, in the second layout example, the source of the source/drain diffusion layer 118 of the transistor NFET is shared with the source of the transistor N1, and the source of the source/drain diffusion layer 120 of the transistor PFET is shared with the source of the transistor P1. The shared source/drain diffusion layers are designated by reference numerals 114/118 and 116/120, respectively.

Moreover, the drain of the source/drain diffusion layer 118 of the transistor NFET is connected to the contact hole or plug 132 via the contact hole or plug 130 and wiring 128-N. In the first layout example, the contact hole or plug 130 is formed at a portion of the wiring 128-N between the output node (not shown) of the drive circuit 22 and the contact hole or plug 132. However, in the second layer example, the contact hole or plug 132 reaching the electrode gate 124-N1 may be formed at a portion of the wiring 128-N between the output node (not shown) of the drive circuit 22 and the contact hole or plug 130 reaching the drain of the transistor NFET. Similarly, the contact hole or plug 136 reaching the electrode gate 124-P1 may be formed at a portion of the wiring 128-P between the output node (not shown) of the drive circuit 22 and the contact hole or plug 134 reaching the drain of the transistor PFET.

In the second layout example, the transistors NFET and PFET are formed in the active regions 106 and 110, respectively (refer to FIG. 18 in particular). Further, the drain of the transistor NFET is connected to the contact hole or plug 130 via the contact hole or plug 130 and the wiring 128-N1 (refer to FIG. 19 in particular). In this manner, the drain of the transistor NFET is connected to the gate electrode 124-N1 of the transistor N1. Similarly, the drain of the transistor PFET is connected to the contact hole or plug 136 via the contact hole or plug 134 and wiring 128-P. In this manner, the drain of the transistor PFET is connected to the gate electrode 124-P1 of the transistor P1.

Therefore, according to the second layout example, as in the first layout example, in a state in which the chip 2 is not connected to the grounding point GND and power source VCC, even in the case where aerial discharge occurs with or from the chip 2, for example, each of the gate insulating film 122 of the transistor N1 and the gate insulating film 122 of the transistor P1 can be protected from breakage.

According to the second layout example, the transistors NFET and PFET are formed in the active regions 106 and 110, respectively, and thus, the active regions 108 and 112 can be deleted as compared with the first layout example. That is, according to the second layout example, the active regions 108 and 112 are eliminated, whereby there can be attained an advantage that an increase in chip area caused by newly providing the transistors NFET and PFET can be restricted.

In addition, according to the second layout example, the source of the transistors NFET and PFET is shared with the source of the transistors N1 and P1, and thus, an increase in areas of the active regions 106 and 110 can be restricted.

(Third Layout Example)

Figure 20:
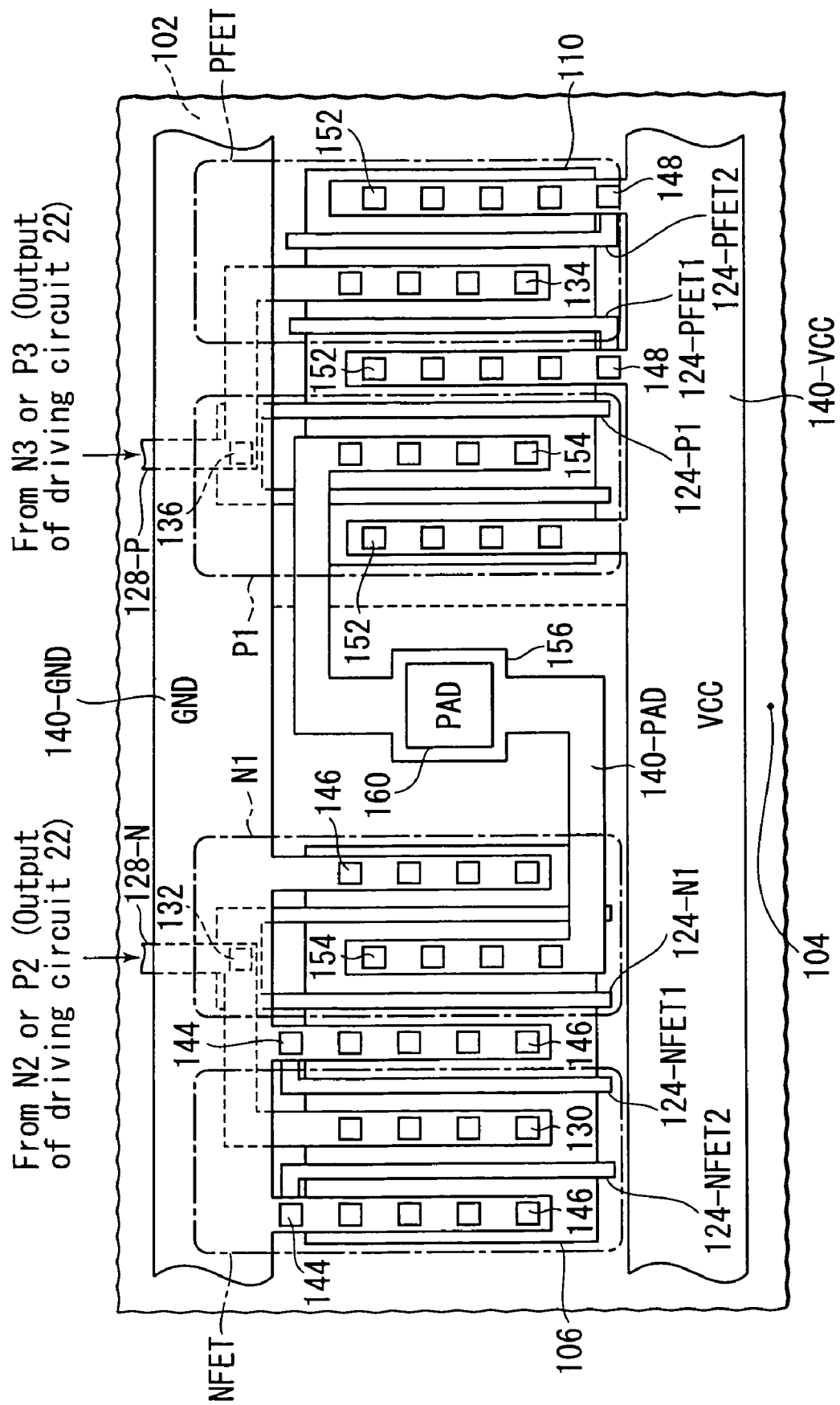
FIG. 20 is a plan view showing a third layer example of the semiconductor integrated circuit device according to the fourth embodiment of the present invention.
Figure 21:
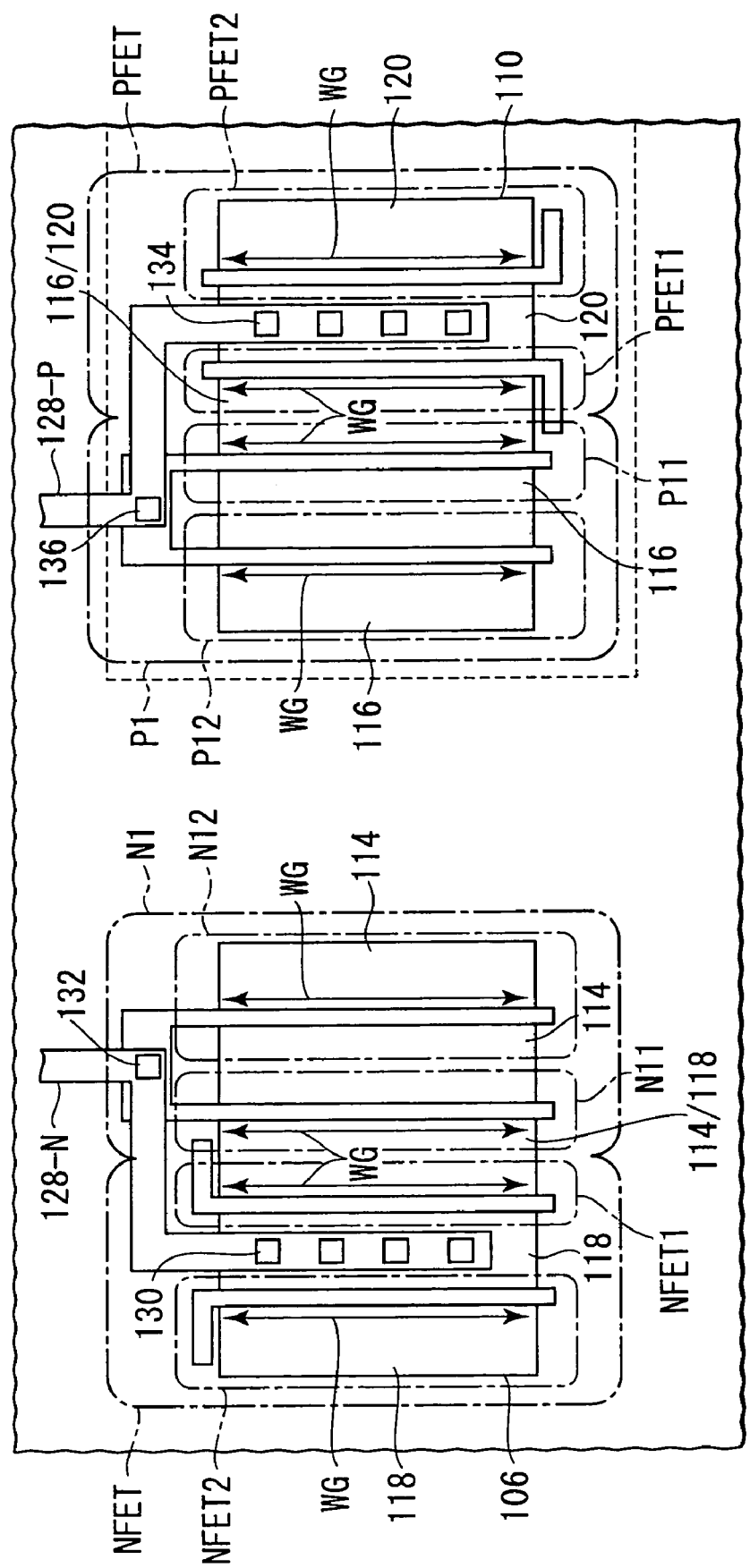
FIG. 21 is a plan view showing a state, in which the second-layered metal film has been removed from the plan view shown in FIG. 20.

FIG. 20 is a plan view showing a third layout example of the semiconductor integrated circuit device according to the fourth embodiment of the present invention. FIG. 21 is a plan view showing a state in which the second-layered metal film has been removed from the plan view shown in FIG. 20. In the third layout example, like elements in the second layout example are designated by like reference numerals. A description of different elements will be given here.

The third layout example is particularly different from the second layout example in that a plurality of transistors NFET and PFET are provided. In this example, the transistor NFET includes two transistors NFET1 and NFET2, and also the transistor PFET includes two transistors PFET1 and PFET2.

The transistors NFET1 and NFET2 are connected in parallel between the common output node of the transistors N2 and P2 of the drive circuit 22 (output node of the drive circuit 22) and the ground line GND. A gate electrode 124-NFET1 of the transistor NFET1 is connected to the wiring 140-GND (ground line GND), and similarly, a gate electrode 124-NFET2 of the transistor NFET2 is connected to the wiring 140-GND (ground line GND). The drain of the source/drain diffusion layer 118 of the transistors NFET1 and NFET2 is shared. A gate width (channel width) of the transistor NFET1 and a gate width (channel width) of the transistor NFET2 are set to "WG" (refer to FIG. 21).

The transistors PFET1 and PFET2 are connected in parallel between the common output node of the transistors N3 and P3 of the drive circuit 22 (output node of the drive circuit 22) and the power source line VCC. A gate electrode 124-PFET1 of the transistor PFET1 is connected to the wiring 140-VCC (power source line VCC), and similarly, a gate electrode 124-PFET2 of the transistor PFET2 is connected to the wiring 140-VCC (power source line VCC). The drain of the source/drain diffusion layer 120 of the transistors PFET1 and PFET2 is shared. A gate width (channel width) of the transistor PFET1 and a gate width (channel width) of the transistor PFET2 both are set to "WG" (refer to FIG. 21).

The transistors N1 and P1 also include a plurality of transistors, for example, two transistors, respectively, and the layout pattern is identical to those of the first and second layout examples. However, in the third layout example, conventionally, a description will be given in detail, assuming that the transistor N1 includes two transistors N11 and N12, and the transistor P1 includes two transistors P11 and P12 similarly. Gate widths (channel widths) of the transistors N11, N12, P11, and P12 are all set to WG. In this example, the transistors N11, N12, NFET1, and NFET2 are allocated in the active region 106 to be arranged in an arrayed shape. The transistors P11, P12, PFET1, and PFET2 are allocated in the active region 110 to be arranged in the arrayed shape.

Figure 22:
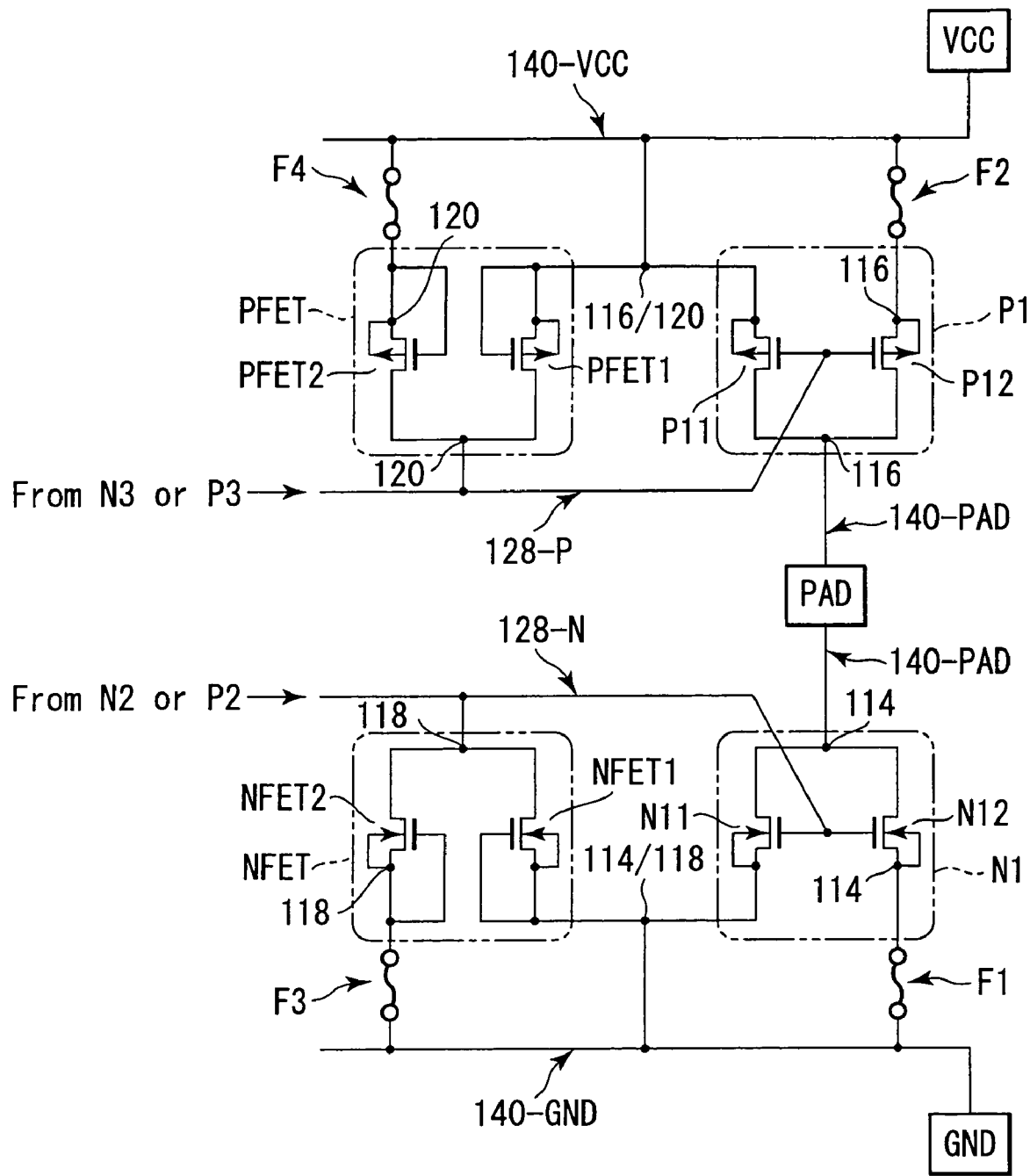
FIG. 22 is an equivalent circuit diagram showing an equivalent circuit of a third layout example.

FIG. 22 is an equivalent circuit diagram showing an equivalent circuit of the third layout example.

As shown in FIG. 22, when the third layout example is shown by the equivalent circuit, a common source diffusion layer 114/118 between the transistors N11 and NFET1 is connected to the ground line 140-GND; the source diffusion layer 114 of the transistor N12 is connected to the ground line 140-GND; and the source diffusion layer 118 of the transistor NFET2 is connected to the grounding line 140-GND.

Similarly, a common source diffusion layer 116/120 between the transistors P11 and PFET1 is connected to the power source line 140-VCC; the source diffusion layer 116 of the transistor P12 is connected to the power source line 140-VCC; and the source diffusion layer 120 of the transistor PFET2 is connected to the power source line 140-VCC.

Here, it may be considered that the source diffusion layer 114 of the transistor N12 and the source diffusion layer 118 of the transistor NFET2 are "always connected" to the ground line 140-GND. However, the source diffusion layers 114 and 118 can be considered to be "arbitrarily connected" to the ground line 140-GND. Similarly, it can be considered that the source diffusion layer 116 of the transistor P12 and the source diffusion layer 120 of the transistor PFET2 are "arbitrary connected" to the power source line 140-VCC. By making "arbitrary connection", the transistor N1 can be selected as a case in which the transistor N1 has one transistor N11 or a case in which the transistor has two transistors N11 and N12 as required. With respect to the transistor NFET as well, a case of one transistor N11 and a case of two transistors N11 and N12 can be selected as required. With respect to the transistor P1 as well, a case of one transistor P11 and a case of two transistors P11 and P12 can be selected as required. Also with respect to the transistor PFET, a case of one transistor PFET1 and a case of two transistors PFET1 and PFET2 can be selected as required. As a result, it becomes possible to adjust the current driving capabilities of the transistors N1 and P1 of the output buffer 21 and to adjust the short-circuit capability (hereinafter, referred to as a protection capability) of a short-circuit element causing short-circuit between a substrate and a gate, for example, of the transistors NFET and PFET.

The protection capability and current driving capability are adjusted in order to respond to a request for flexibly coping the equipment according to the present embodiment to a variety of electronic products.

A mass electric power generated with the "aerial discharge" which is raised as a problem in the present invention varies depending on the size of a charge quantity to be charged/accumulated in an electronic card, for example. If the accumulated charge quantity is large, the electric power generated in "aerial discharge" is likely to increase. The accumulated charge quantity would change variously depending on the size of an electronic card or a material for the electronic card, etc. Namely, the accumulated charge quantity differs depending on electronic products. In order to cope with a deviation in this accumulated charge quantity, it must be possible to adjust the protection capabilities of the transistors NFET and PFET.

The adjustment of the protection capability in this example is made according to an increase or decrease in the number of the transistors NFET and PFET. Simply, each of the transistors NFET and PFET is increased to a plurality with respect to an electronic product requiring high protection capability. In this example, the number of these transistors may be increased to two. With respect to an electronic product which does not require high protection capability, the number of transistors included in the transistors N1 and P1 may be reduced to one, for example.

Similarly, the current driving capability required for the output buffer 21 varies depending on each electronic product. Each of the transistors N1 and P1 is increased to a plurality, for example, two transistors, with respect to an electronic product requiring high protection capability. With respect to an electronic product which does not require high protection capability, the number of transistors included in the transistors N1 and P1 may be reduced to one, for example.

In an example when "arbitrary connection" is made, the source diffusion layers 114 and 118 may be connectable" to the ground line 140-GND, and the source diffusion layers 116 and 120 may be "connectable" to the power source line 140-VCC. As an example of "connectable", in this example, as shown in FIG. 22, fuses F1, F2, F3, and F4 are allocated between the source diffusion layer 114 and the ground line 140-GND; between the source diffusion layer 118 and the ground line 140-GND; the source diffusion layer 116 and the power source line 140-VCC; and between the source diffusion layers 120, respectively.

The word "fuse" used in the present specification is defined not only as a fuse for mechanically breaking electrical connection by using a laser or a mass current, but also as being including all of those for structurally disconnecting an electrical connection by not forming at least one of wiring and contact, and for restoring a state in which electrical connection is shorted to an electrically connected state and a technique capable of determining/changing an electrically connected/disconnected state other than those fuses.

FIG. 23 is a view showing a relationship between a state of connection/disconnection, and a protection capability and a current driving capability, of the fuses F1, F2, F3, and F4. The protection capability and current driving capability are indicated as the size of the gate width (channel width) WG.

As shown in FIG. 23, in this example, 16 combinations ($4^2$=16) can be obtained for combinations of the protection capability and the current driving capability.

In this example, although up to two transistors of each of the transistors N1, P1, NFET, and PFET can be "arbitrarily connected", the number of transistors is arbitrary without being limited to such up to two transistors. For example, in the case where an attempt is made to increase the number of transistors included in the transistor N1, patterns of the transistors N11 and N12 shown in FIGS. 20 and 21 may be repeated. In the same way, in the case where an attempt is made to increase the number of transistors included in the transistor NFET, patterns of the transistors NFET1 and NFET2 may be repeated. The number of transistors P1 and PFET can also be increased in the same manner as in the case of the transistors N1 and NFET.

Now, some examples of making transistors electrically disconnected/connected will be described here. In this description, although there is shown an example of making the transistor NFET2 electrically disconnected/connected, i.e., an example of making the fuse F3 disconnected/connected, the following examples can be applied to the fuses F1, F2, and F3.

(First Example)

Figure 24:
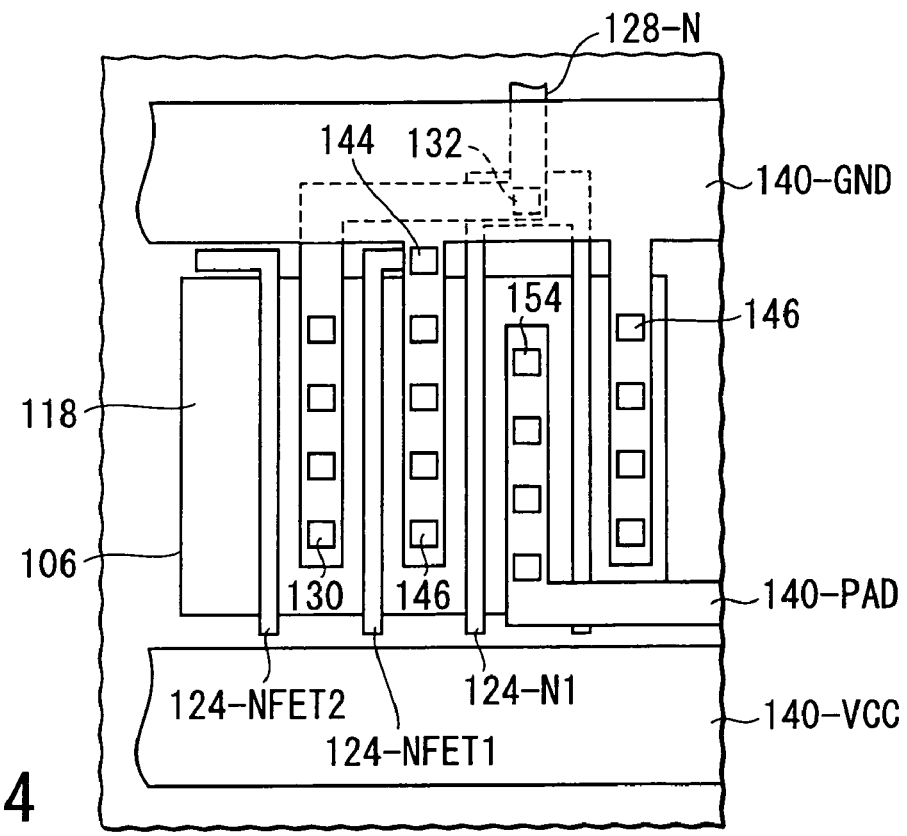
FIG. 24 is a plan view showing a first example of disconnection.

FIG. 24 is a plan view showing a first example of disconnection.

As shown in FIG. 24, the first example is provided as an example in which a portion to be connected to the source diffusion layer 118 of the transistor NFET2, of the ground line 140-VCC and the contact hole or plug 146 for connecting the ground line 140-VCC to the source diffusion layer 118 are structurally eliminated. In the layout pattern shown in FIG. 24, the source diffusion layer 118 of the transistor NFET2 is not connected to the ground line 140-VCC, and thus, the transistor NFET2 can be electrically disconnected.

In the first example, whether the transistor NFET2 is made electrically connected or electrically disconnected may be achieved merely by replacing a contact hole forming photo mask and a second-layered metal patterning photo mask.

(Second Example)

Figure 25:
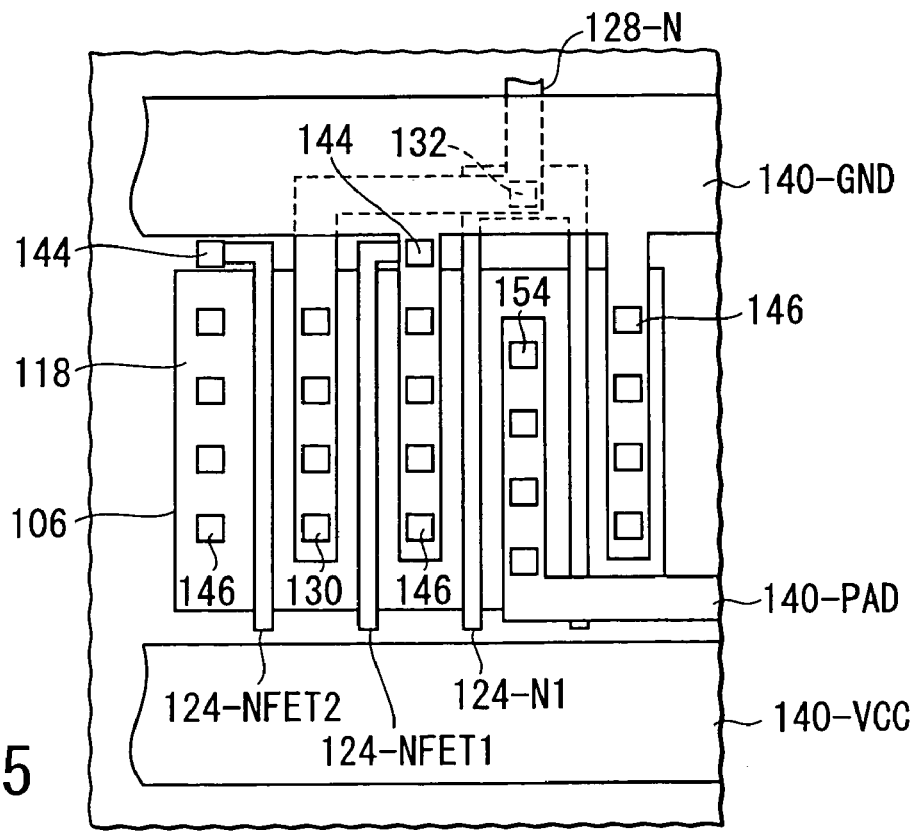
FIG. 25 is a plan view showing a second example of disconnection.

FIG. 25 is a plan view showing a second example of disconnection.

As shown in FIG. 25, the second example is provided as an example in which a portion connected to the source diffusion layer 118 of the transistor NFET2, of the ground line 140-VCC, is structurally eliminated. The contact hole or plug 146 for connecting the ground line 140-VCC to the source diffusion layer 118 exists. In this structure as well, the transistor NFET2 can be made electrically disconnected.

In the second example, whether the transistor NFET2 is made electrically connected or electrically disconnected may be achieved merely by replacing only the second-layered metal patterning photo mask, for example. An advantage of the second example is that at least one photo mask to be replaced is reduced in number, as compared with the first example.

(Third Example)

Figure 26:
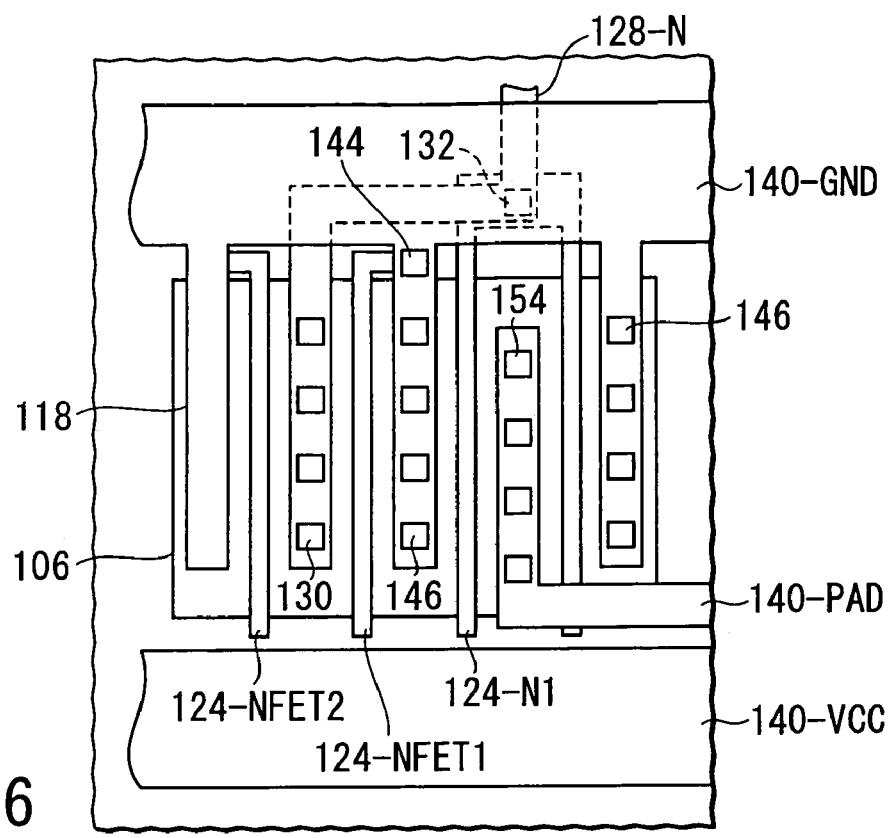
FIG. 26 is a plan view showing a third example of disconnection.

FIG. 26 is a plan view showing a third example of disconnection.

As shown in FIG. 26, the third example is provided as an example in which the contact hole or plug 146 for connecting the ground line 140-VCC to the source diffusion layer 118 is structurally eliminated. A pattern of the ground line 140-VCC is identical to a case of connecting the transistor NFET2. In this structure as well, the transistor NFET2 can be made electrically disconnected.

In the third example, whether the transistor NFET2 is made electrically connected or electrically disconnected may be achieved by replacing only the contact hole forming photo mask which penetrates the first-layered interlayer insulating film 126 and the second-layered interlayer insulating film 128, for example. An advantage of the third example is that at least one photo mask to be replaced is reduced in number, as compared with the first example.

(Fourth Example)

Figure 27:
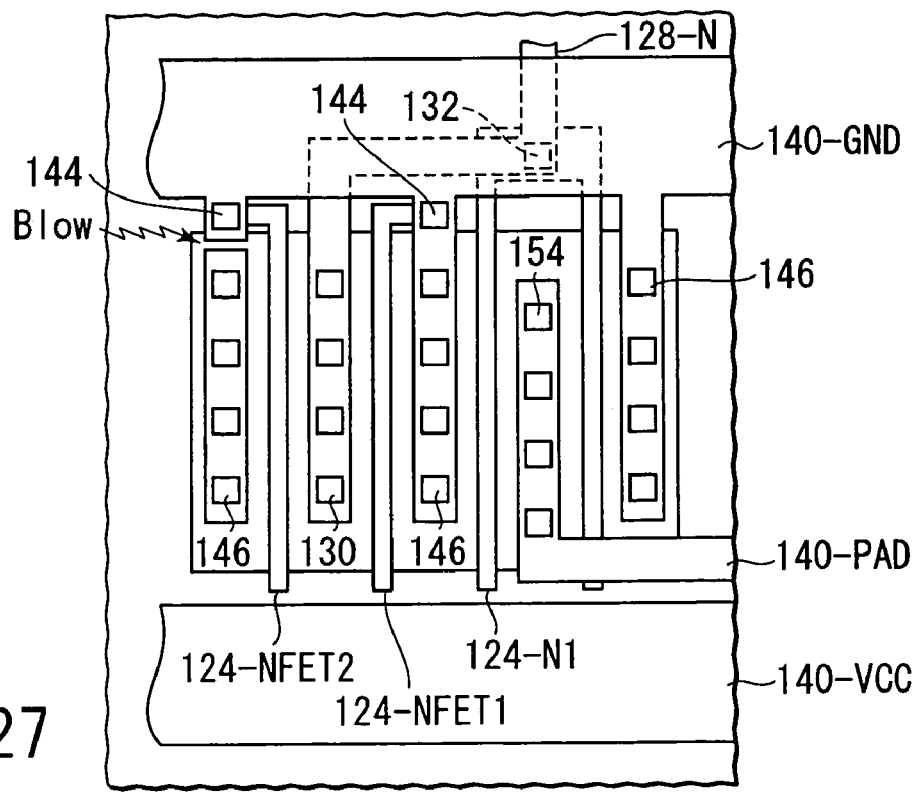
FIG. 27 is a plan view showing a fourth example of disconnection.

FIG. 27 is a plan view showing a fourth example of disconnection.

As shown in FIG. 27, the fourth example is provided as an example in which a portion of the ground line 140-VCC to be connected to the source diffusion layer 118 of the transistor NFET2 (hereinafter, referred to as a local ground line 140-VCC') is mechanically broken while maintaining the same structure as that in the case of connecting the transistor NFET2. To break the local ground line 140-VCC', there may be used a laser, focusing ion beam or the like which is used in a fuse blowing process of the semiconductor integrated circuit device. This makes it possible to electrically disconnect the transistor NFET2.

In the fourth example, there is no need to replace a semiconductor production photo mask. The local ground line 140-VCC' may be broken at the final stage in the fuse blowing process or wafer process. This is an advantages of the fourth example.

(Fifth Example)

Figure 28:
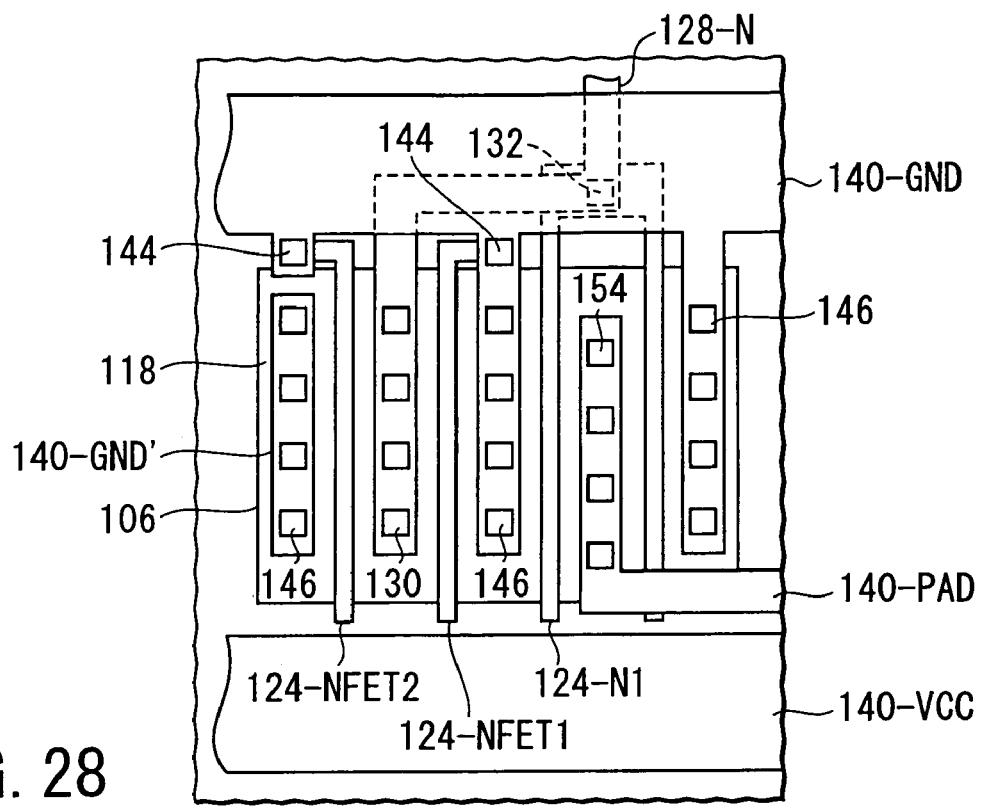
FIG. 28 is a plan view showing a fifth example of disconnection.

FIG. 28 is a plan view showing a fifth example of disconnection.

As shown in FIG. 28, the fifth example is provided as an example in which the ground line 140-VCC and a portion of the ground line 140-VCC to be connected to the source diffusion layer 118 of the transistor NFET2 (hereinafter, referred to as a local ground line 140-VCC') are structurally isolated from each other. A final structure is very similar to that of the fourth example. A difference between these examples is described below. In the fourth example, the local ground line 140-VCC' is separated from the ground line 140-VCC by mechanically breaking the ground line 140-VCC'. In contrast, in the fifth example, the local ground line 140-VCC' is formed in a state isolated from the ground line 140-VCC by using, for example, the second-layered metal patterning photo mask.

In the fifth example, as in the second example, the transistor NFET2 can be made electrically disconnected merely by replacing only the second-layered metal patterning photo mask.

Further, in the fifth example, the following use is possible.

An equipment completion state is provided as a state in which the local ground line 140-VCC' is isolated from the ground line 140-VCC. The isolated state is equivalent to the completion state. Thus, when the protection capability is adjusted, the local ground line 140-VCC' may be connected to the ground line 140-VCC. Namely, in the fifth example, the local ground line 140-VCC' can be used as a state in which it can be connected to the ground line 140-VCC.

Figure 29:
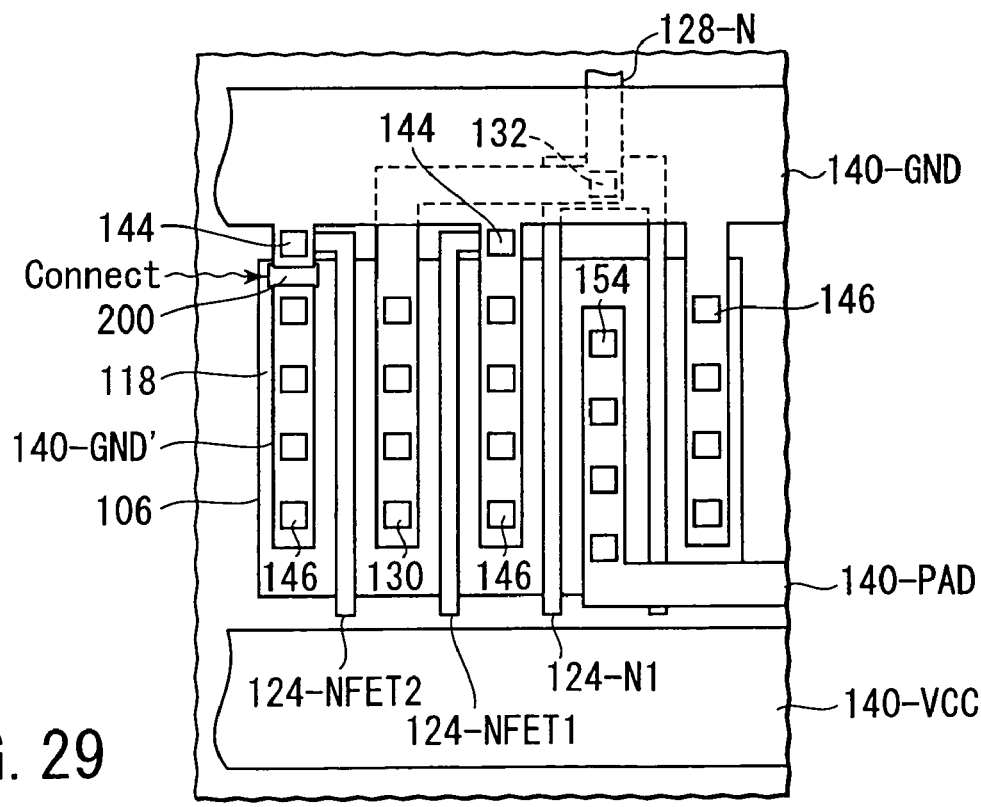
FIG. 29 is a plan view showing an example of connection.

When the local ground line 140-VCC' is connected to the ground line 140-VCC, for example, as shown in FIG. 29, another electrically conductive layer 200 is formed for an isolated portion, and electrical connection may be recovered.

An advantage of an example of recovering electrical connection is that, even if the protection capability is judged to be insufficient after completion, equipment can be saved without discarding it. In the case where the driving capabilities of the transistors N1 and P1 are insufficient as well, the equipment can be saved similarly.

Moreover, this example of recovering electrical connection can be used as the fourth example as well as the fifth example. An advantage in the case of being used as the fourth example is that, even if the local ground line 140-VCC' is mistakenly broken, the mistakenly broken equipment can be saved. Also when the transistors N1 and P1 are mistakenly broken, they can be saved similarly.

The first to fifth examples can be applied by variously combining them with each other.

(Fourth Layout Example)

Figure 30:
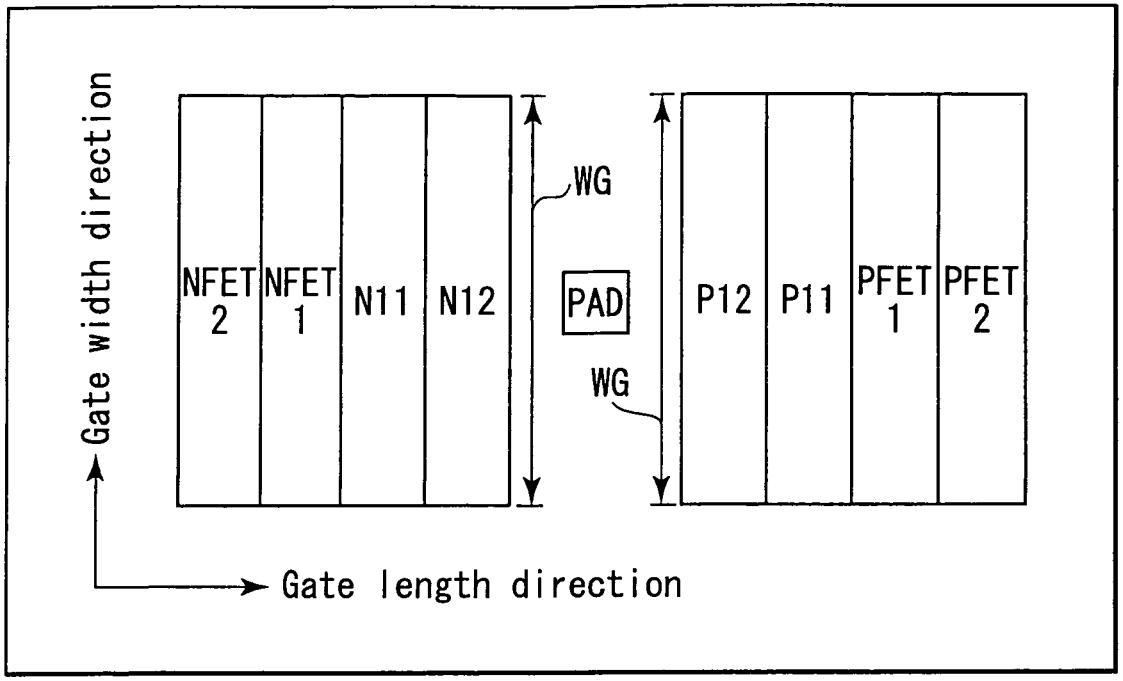
FIG. 30 is a view showing a basic layout of the third layout example of the semiconductor integrated circuit device according to the fourth embodiment of the present invention.
Figure 31:
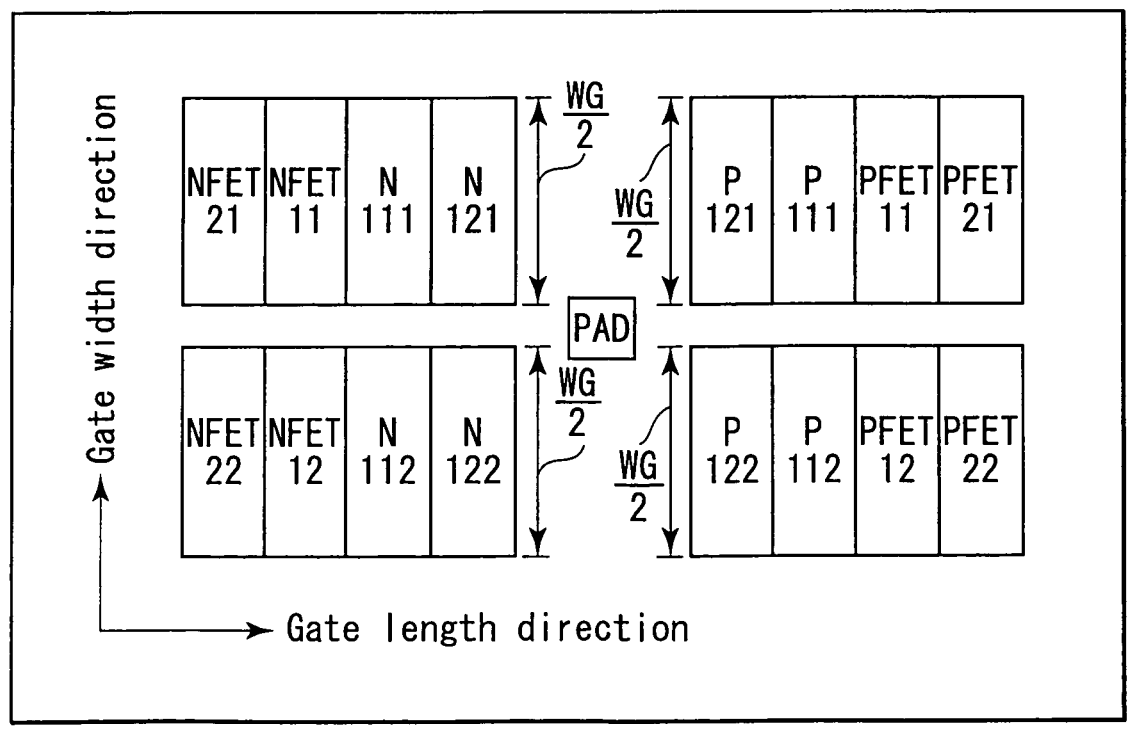
FIG. 31 is a view showing a basic layout of a fourth layout example of the semiconductor integrated circuit device according to the fourth embodiment of the present invention.

FIG. 30 is a view showing a basic layout of the third layout example, of the semiconductor integrated circuit device according to the fourth embodiment of the present invention. FIG. 31 is a view showing a basic layout of a fourth layout example, of the semiconductor integrated circuit device according to the fourth embodiment of the present invention.

As shown in FIG. 30, in the third layout example, the basic layout is that the transistors N11, N12, NFET1, NFET2, P11, P12, PFET1, and PFET2 of the gate width (channel width) WG, namely, a plurality of transistors, are arranged in an arrayed shape along the gate length direction.

In contrast, in the fourth layout example, as shown in FIG. 31, the basic layout is that the transistors N11, N12, NFET1, NFET2, P11, P12, PFET1, and PFET2 are arranged in the arrayed shape along the gate length direction, and that these transistors are isolated in plurality along the gate width direction. In the fourth layout example, the transistor N1 includes four transistors N111, N112, N121, and N122. Hereinafter, similarly, the transistor NFET includes four transistors NFET11, NFET12, NFET21, and NFET22, the transistor P1 includes four transistors P111, P112, P121, and P122, and the transistor PFET includes four transistors RFET11, PFET12, PFET21, and PFET22. The gate widths (channel widths) of these 16 transistors are set to "WG/2" respectively.

In the fourth layout example, the basic layout is that the transistors N111, N112, N121, N122, NFET11, NFET12, NFET21, NFET22, P111, P112, P121, P122, PFET11, PFET12, PFET21, and PFET22 of the gate width (channel width) WG/2, namely, a plurality of transistors, are arranged in a matrix shape along the gate length direction and the gate width direction crossing the gate length direction.

Figure 32:
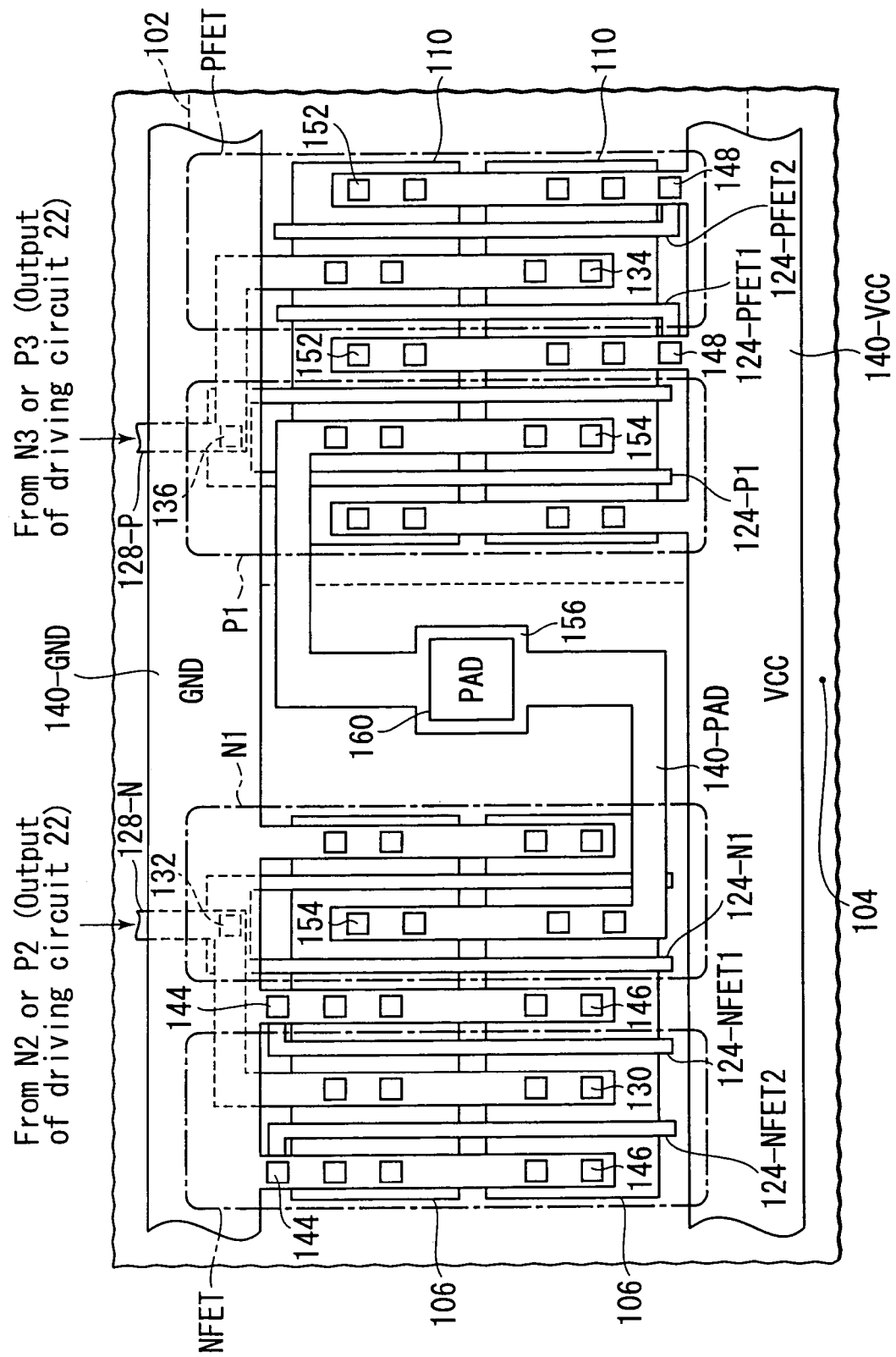
FIG. 32 is a plan view showing a basic layer of the fourth layout example of the semiconductor integrated circuit device according to the fourth embodiment of the present invention.
Figure 33:
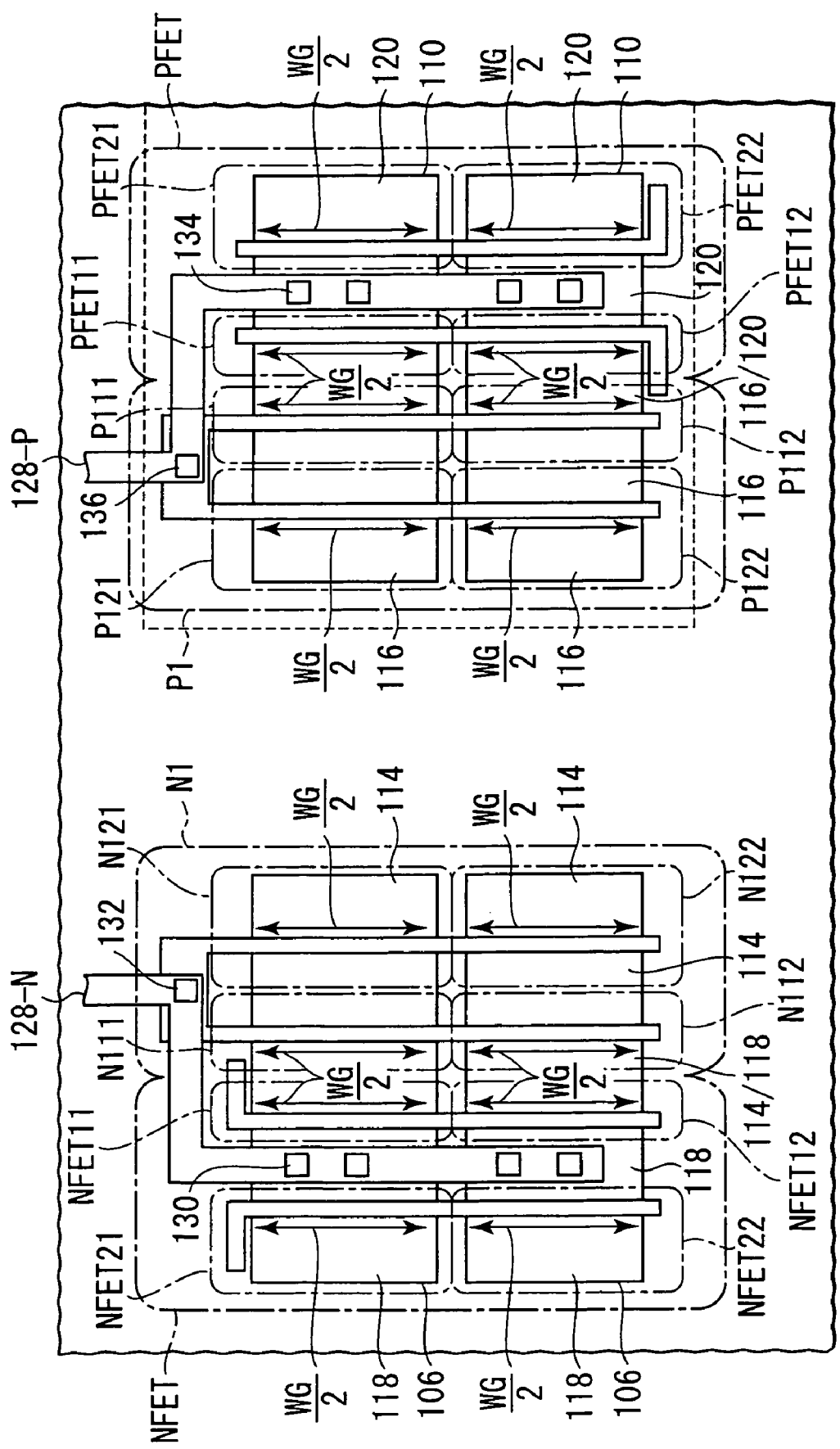
FIG. 33 is a plan view showing a state, in which the second-layered metal film has been removed from the plan view shown in FIG. 32.

FIG. 32 is a plan view showing the fourth layout example of the semiconductor integrated circuit device according to the fourth embodiment of the present invention. FIG. 33 is a plan view showing a state in which the second-layered metal film has been removed from the plan view shown in FIG. 32. A difference between the fourth layout example and the third layout example is as described above. In FIGS. 32 and 33, like elements in FIGS. 20 and 21 are designated by like reference numerals. A description of these elements is omitted here.

Figure 34:
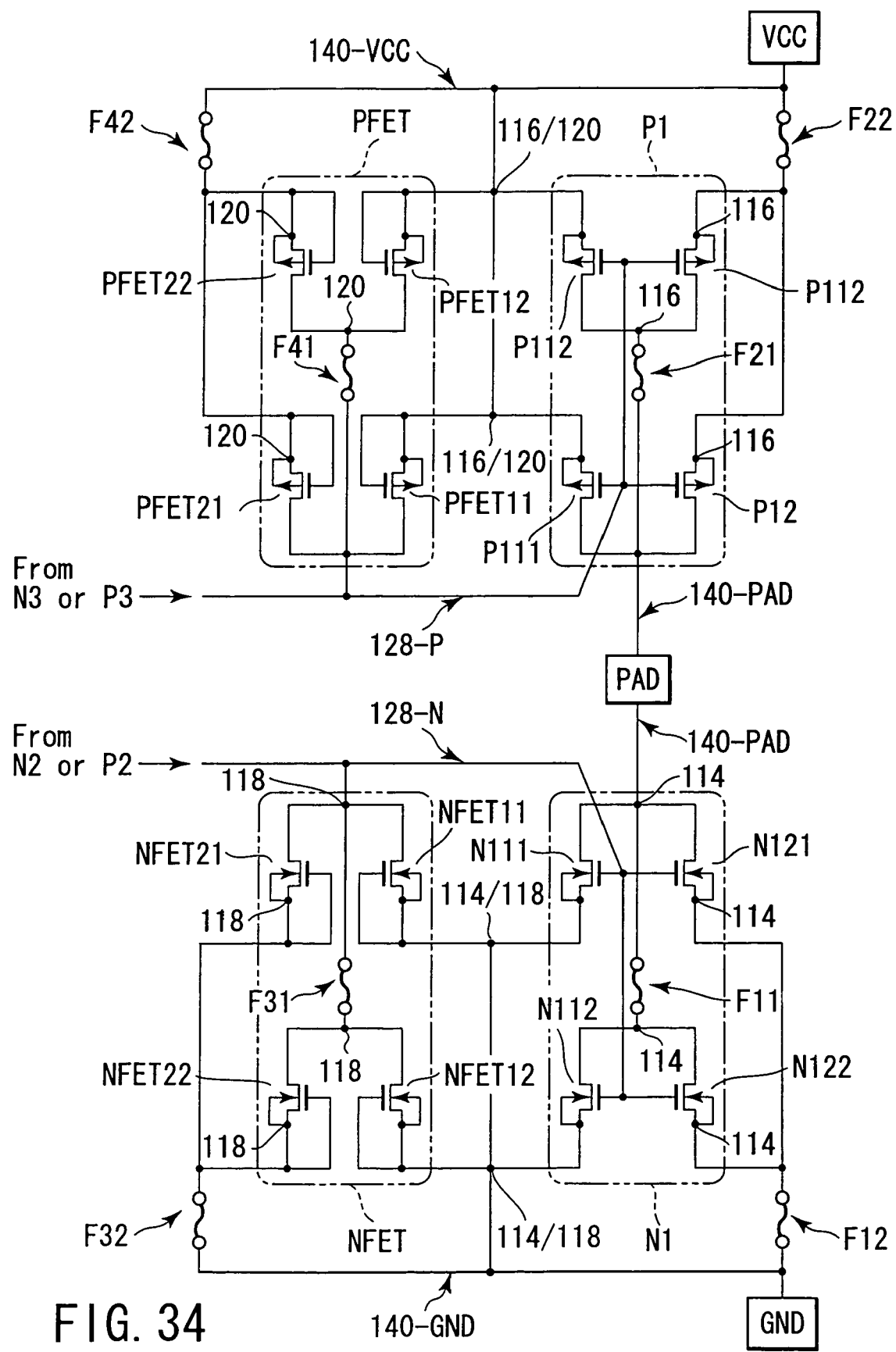
FIG. 34 is an equivalent circuit diagram showing an equivalent circuit of the fourth layout example.

FIG. 34 is an equivalent circuit diagram showing an equivalent circuit of the fourth layout example.

As shown in FIG. 34, when the fourth layout example is shown by the equivalent circuit, a common source diffusion layer 114/118 between the transistor N111 and the NFET11 is connected to the ground line 140-GND. The source diffusion layer 114 of the transistor N121 is connected to the ground line 140-GND via a fuse F12. The source diffusion layer 118 of the transistor NFET21 is connected to the ground line 140-GND via a fuse F32. The common drain diffusion layer 118 between the transistors NFET11 and HFET21 is connected to the wiring 128-N to which a signal outputted from the transistor N2 or P2 is transmitted. The common drain diffusion layer 114 between the transistors N111 and N121 is connected to the wiring 140-PAD to be connected to a pad.

A common source diffusion layer 114/118 between the transistor N112 and the NFET12 is connected to the grinding wiring 140-GND via the fuse F12. The source diffusion layer 1118 of the transistor NFET22 is connected to the ground line 140-GND via the fuse F32. The source diffusion layer 118 of the transistor NFET22 is connected to the ground line 140-GND via the fuse F32. The common drain diffusion layer 118 between the transistors FNET12 and NFET22 is connected to the wiring 128-N via a fuse F31. The common drain diffusion layer 114 between the transistors N112 and N122 is connected to the wiring 140-PAD via a fuse F11.

For connection of the transistors P111, P121, P112, P122, PFET11, PFET12, PFET21, and PFET22, it is substantially sufficient if the ground line 140-GND be reread as the power source line 140-VCC, the wiring 128-N be reread as the wiring 1280P. A description of these transistors is omitted here with reference to the accompanying drawings.

FIG. 35 is a view showing a relationship between a state of connection/disconnection and a protection capability and a current driving capability, of the fuses, F11, F12, F21, F22, F31, F32, F41, and F42. The protection capability and current driving capability are indicated as the size of the gate width (channel width) WG.

In this example, 64 combinations can be obtained as combinations of the protection capability and current driving capability ($8^2=64$). In FIG. 35, only essential 16 combinations are shown.

An advantage achieved by this example is that the protection capability can be adjusted more finely as compared with that of the third layout example. For example, although the minimum unit of adjustment of the protection capability is set to "WG" in the third layout example, the minimum unit of adjustment is reduced to "WG/2" in the fourth layout example. Reference is made to columns of fuses F41 and F42 in FIG. 35 and the columns of PFET of the protection capability. The protection capability of PFET can be adjusted in four steps of 2 WG, 1.5 WG, and 0.5 WG in accordance with a combination of connection (0)/disconnection (1).

In this example, although "2" is set in the gate width direction and "2" is set in the gate length direction per transistor N1 or P1 or transistor NFET or PFET, i.e., although a matrix of 2 columns×2 rows is defined, the number of columns and the number of rows each are not limited to "2". For example, in the case where "4" is set in the gate width direction, the minimum unit of adjustment is set to "WG/4", so that the adjustment precision is enhanced. In the case where an attempt is made to enhance the adjustment precision, the number of transistors arranged along the gate width direction may be increased. Further, in the case where "4" is set in the gate length direction, the maximum protection capability is set to "4 WG", so that the adjustable range is expanded. In the case where an attempt is made to expand the adjustable range, the number of transistors arranged along the gate length direction may be increased. These settings may be combined as required.

A matter common to the third and fourth layout examples is that adjustment of the protection capability and adjustment of the current driving capability may be achieved at the same time, or alternatively, adjustment of only the protection capability and adjustment of only the current driving capability may be achieved.

Now, some examples of making the transistors electrically disconnected/connected will be described here. In this description, although there is shown an example of making the transistor NFET22 electrically disconnected, i.e., making the fuse F31 disconnected/connected, the following examples can be applied to the fuses F11, F12, F21, F22, F31, F32, F41, and F42.

(First Example)

Figure 36:
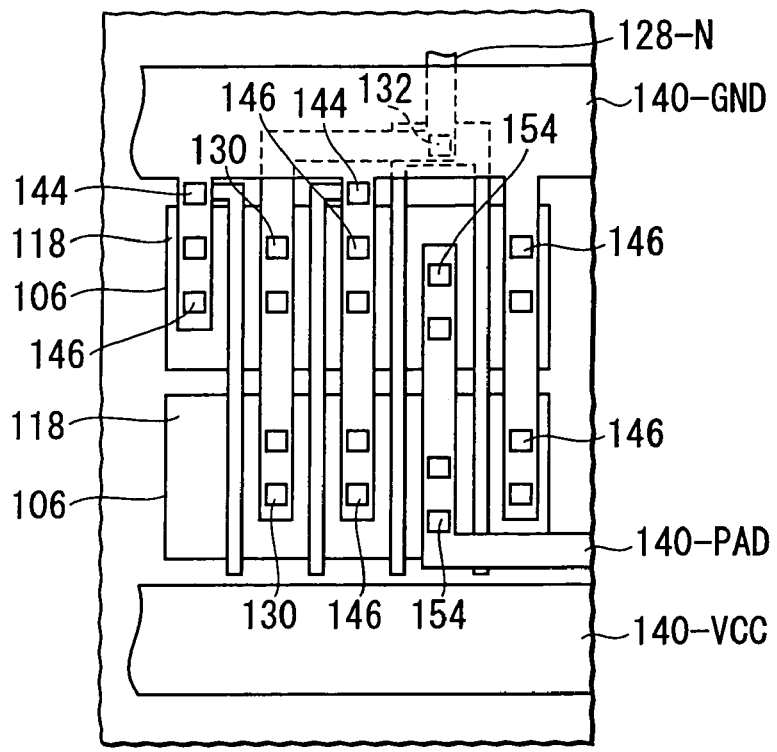
FIG. 36 is a plan view showing a first example of disconnection.

FIG. 36 is a plan view showing a first example of disconnection.

In the example shown in FIG. 36, the first example shown in FIG. 24 is applied to the device according to the fourth embodiment. In FIG. 36, like elements in FIG. 24 are designated by like reference numerals. A description of these elements is omitted here.

(Second Example)

FIG. 36 is a plan view showing a second example of disconnection.

Figure 37:
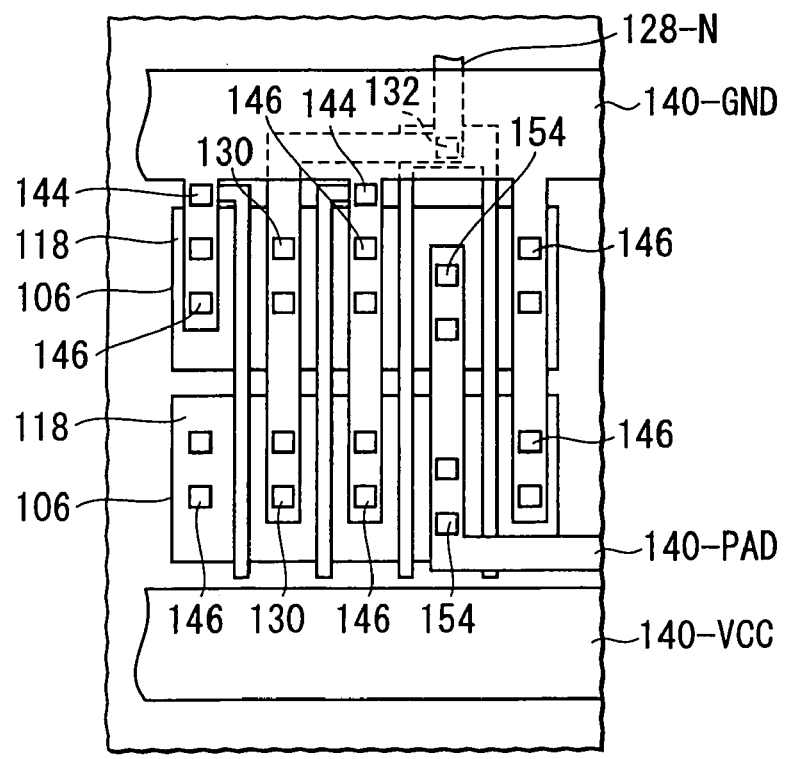
FIG. 37 is a plan view showing a second example of disconnection.

In the example shown in FIG. 36, the second example shown in FIG. 25 is applied to the device according to the fourth embodiment. In FIG. 37, like elements in FIG. 25 are designated by like reference numerals.

(Third Example)

Figure 38:
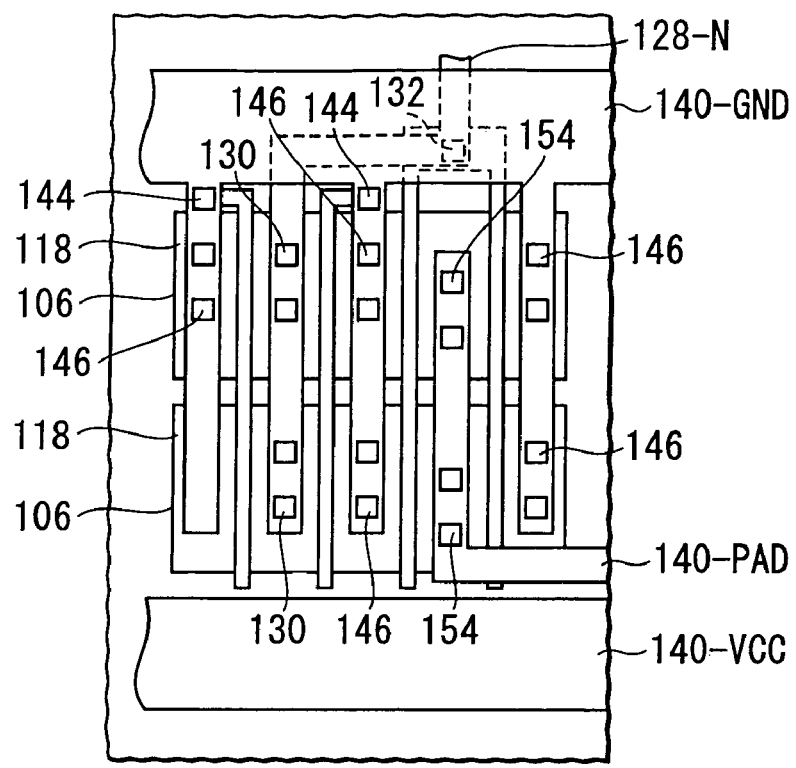
FIG. 38 is a plan view showing a third example of disconnection.

FIG. 38 is a plan view showing a third example of disconnection.

In the example shown in FIG. 38, the third example shown in FIG. 26 is applied to the device according to the fourth embodiment. In FIG. 38, like elements in FIG. 26 are designated by like reference numerals. A description of these elements is omitted here.

(Fourth Example)

Figure 39:
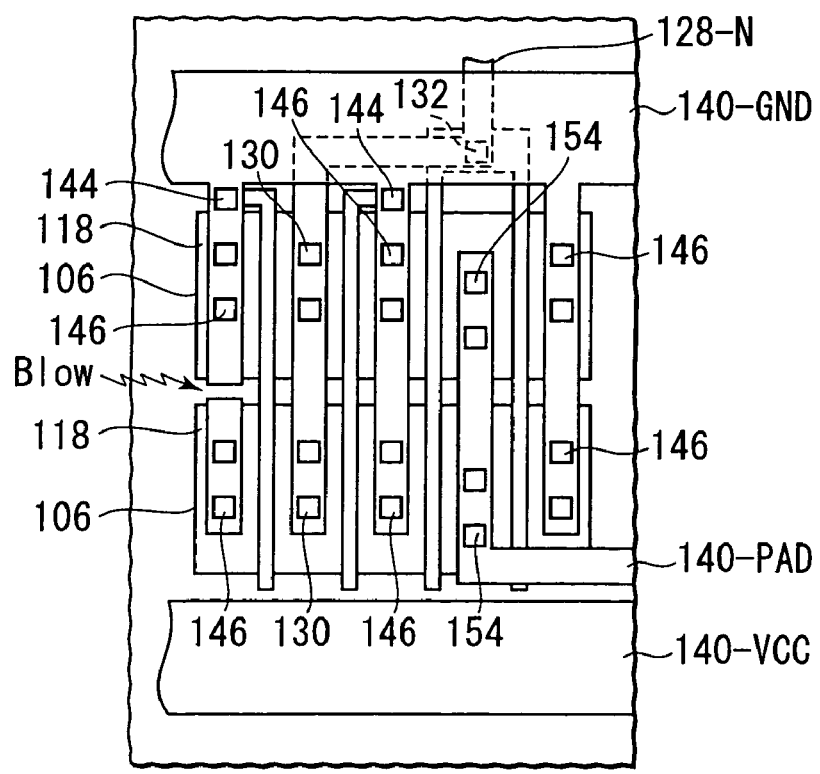
FIG. 39 is a plan view showing a fourth example of disconnection.

FIG. 39 is a plan view showing a fourth example of disconnection.

In the example shown in FIG. 39, the first example shown in FIG. 27 is applied to the device according to the fourth embodiment. In FIG. 39, like elements in FIG. 27 are designated by like reference numerals. A description of these elements is omitted here.

(Fifth Example)

Figure 40:
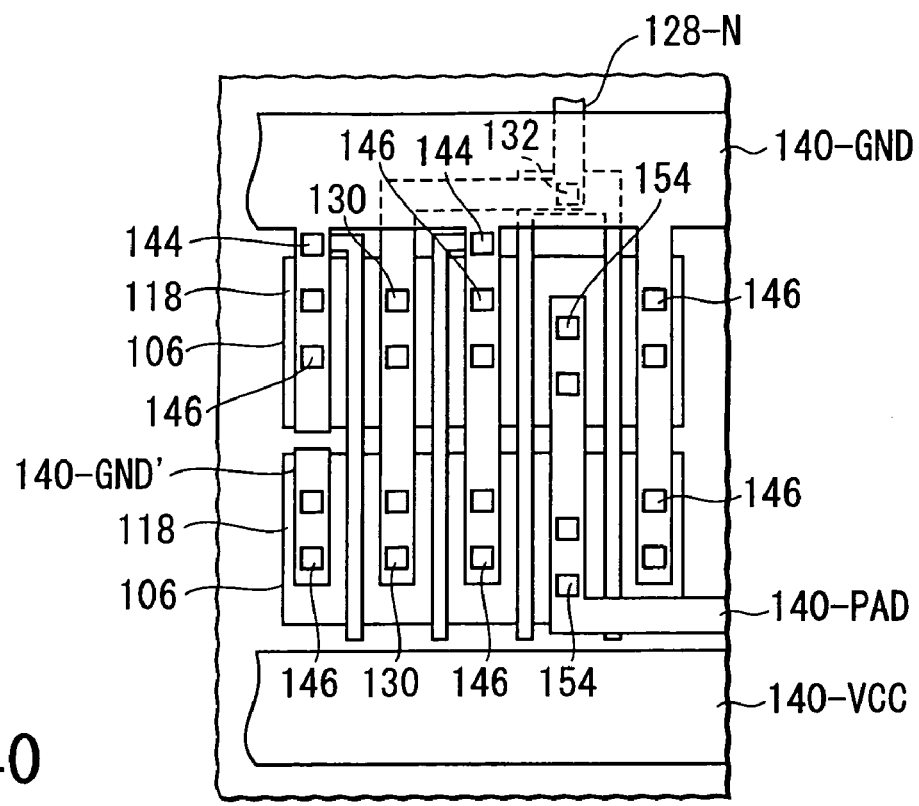
FIG. 40 is a plan view showing a fifth example of disconnection.
Figure 41:
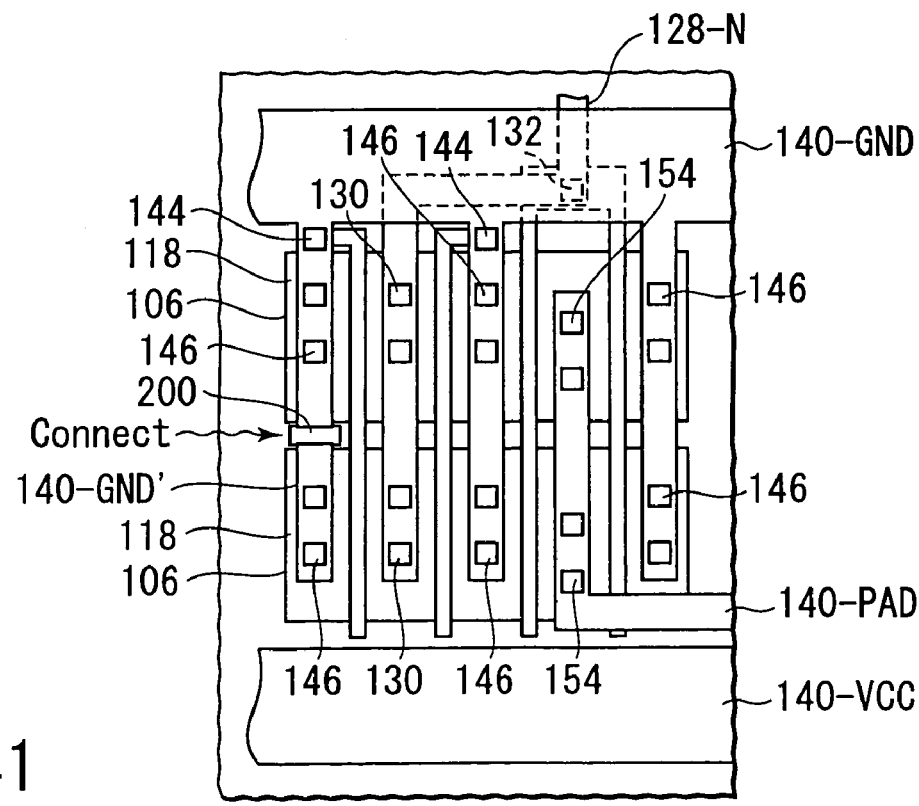
FIG. 41 is a plan view showing an example of connection.

FIG. 40 is a plan view showing a fifth example of disconnection. FIG. 41 is a plan view showing an example of connection.

The examples shown in FIGS. 40 and 41 show that the fourth examples shown in FIGS. 28 and 29 are applied to the device according to the fourth embodiment. In FIGS. 40 and 41, like elements in FIGS. 28 and 29 are designated by like reference numerals. A description of these elements is omitted here.

In the third and fourth layout examples, the gate width WG is adjusted. The method of adjusting the gate width is not limited to the one specified above. The gate length may be adjusted. The gate length may be adjusted, in addition to the gate width WG.

The number of the wiring layers provided is not limited to those adopted in the first to fourth layout examples.

(Test Example)

Next, a test example for the electronic card which reproduces the unexpected situation shown in FIGS. 1A, 1B, 2A, and 2B is explained.

Figure 42A:
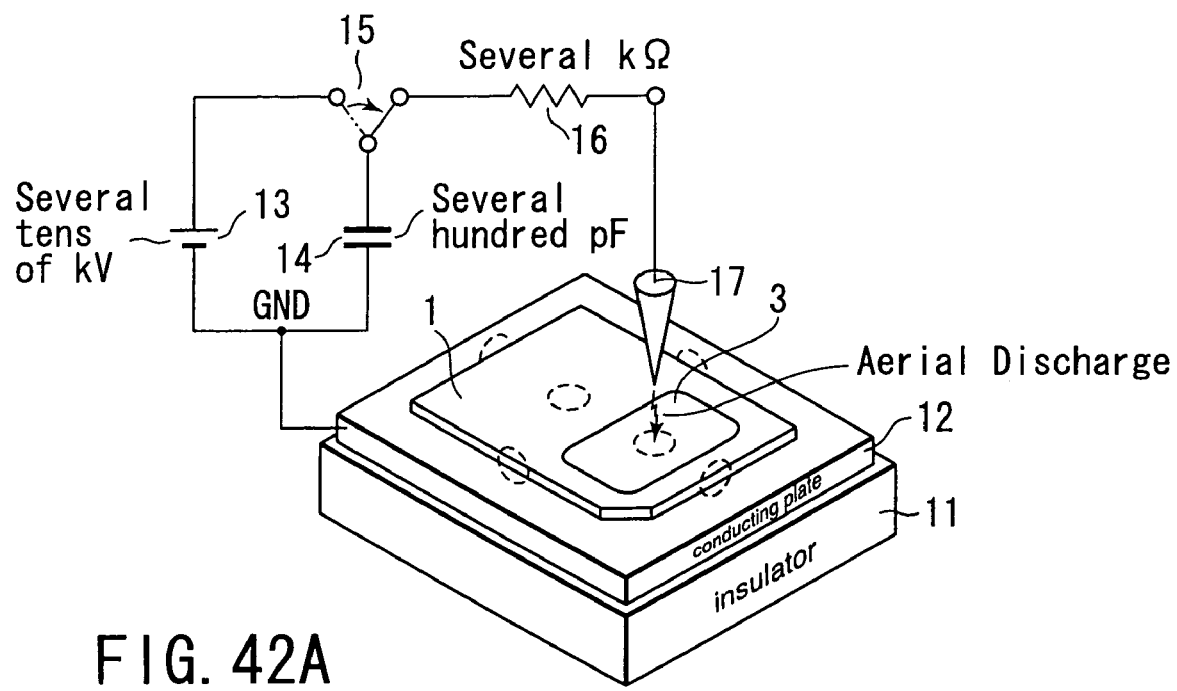
FIG. 42A is a perspective view showing an example of a charge test.

FIG. 42A is a perspective view showing an example of a charging test in which the electronic card and/or chip is charged.

As shown in FIG. 42A, a conducting plate 12 is placed on an insulator 11 and the electronic card 1 is placed on the conducting plate 12. The conducting plate 12 is grounded. A power source 13 is connected to a condenser 14 via a relay 15 to charge the condenser 14. The power source 13 supplies a voltage of several ten kV, for example, 15 kV. The condenser 14 has a capacitance of several hundred pF, for example, 100 pF. After completion of charging, the condenser 14 is connected to one end of a resistor 16 via the relay 15. The resistor 16 has a resistance of several kΩ, for example, 1.5 kΩ and the other end thereof is connected to a needle 17. The needle 17 is set closer to the electronic card 1. When a distance between the needle 17 and the electronic card 1 becomes a certain distance, an aerial discharge occurs between the needle 17 and the electronic card 1 to charge the electronic card 1 and/or the chip in the card. Thus, an unexpected situation shown in FIGS. 1A and 1B is reproduced.

Figure 42B:
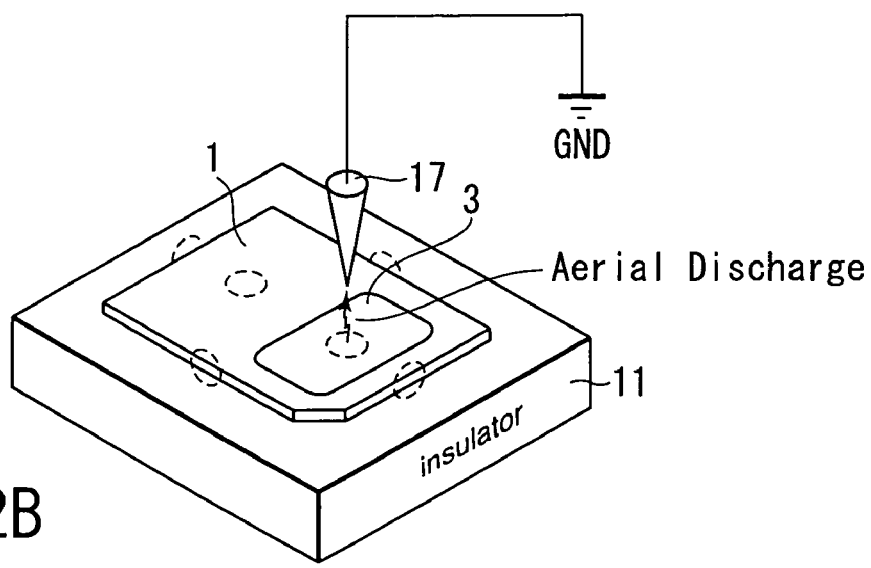
FIG. 42B is a perspective view showing an example of a discharge test.

FIG. 42B is a perspective view showing a discharging test in which the electronic card and/or chip is discharged.

As shown in FIG. 42B, for example, the electronic card 1 charged in the test of FIG. 42A is placed on the insulator 11. At this time, the grounded needle 17 is set closer to the electronic card 1. When a distance between the needle 17 and the electronic card 1 becomes a certain distance, an aerial discharge occurs between the needle 17 and the electronic card 1 to discharge the electronic card 1 and/or the chip in the card. Thus, an unexpected situation shown in FIGS. 2A and 2B is reproduced.

In the present charging test example and discharging test example, an example in which the needle 17 is set closer to the electronic card 1 is shown. However, the tests were made not only for the external terminal 3 but also for the side surface, front surface and rear surface of the electronic card 1 as shown by circles of broken lines in FIGS. 42A and 42B. This is because it is impossible to predict positions of the electronic card 1 in which an aerial discharge occurs in the market.

In each of the above tests, the electronic card 1 containing the semiconductor integrated circuit device according to the first to fourth embodiments was not destroyed and was correctly operated.

Thus, the semiconductor integrated circuit device according to the first to fourth embodiments and the electronic card containing the semiconductor integrated circuit device have an advantage that the integrated circuit can be protected from destruction even when the integrated circuit is connected to neither the ground node nor the power source.

(Application Example 1)

Of course, the semiconductor integrated circuit device according to the first to fourth embodiments can be incorporated into an electronic product. However, it is particularly preferable to incorporate the semiconductor integrated circuit device into an electronic card. Generally, a person carries the electronic card. Therefore, the possibility that the electronic card meets with the above-unexpected situation is strong.

A memory card is provided as one example of the electronic card. The memory card has a nonvolatile semiconductor memory device as a main memory section. As an example of the nonvolatile semiconductor memory device, a NAND type flash memory and AND type flash memory can be given. The output circuit explained in the first to fourth embodiments can be used as an output circuit of the NAND type flash memory and AND type flash memory. One example of the NAND type flash memory is shown in FIGS. 43A and 43B.

Figure 43A:
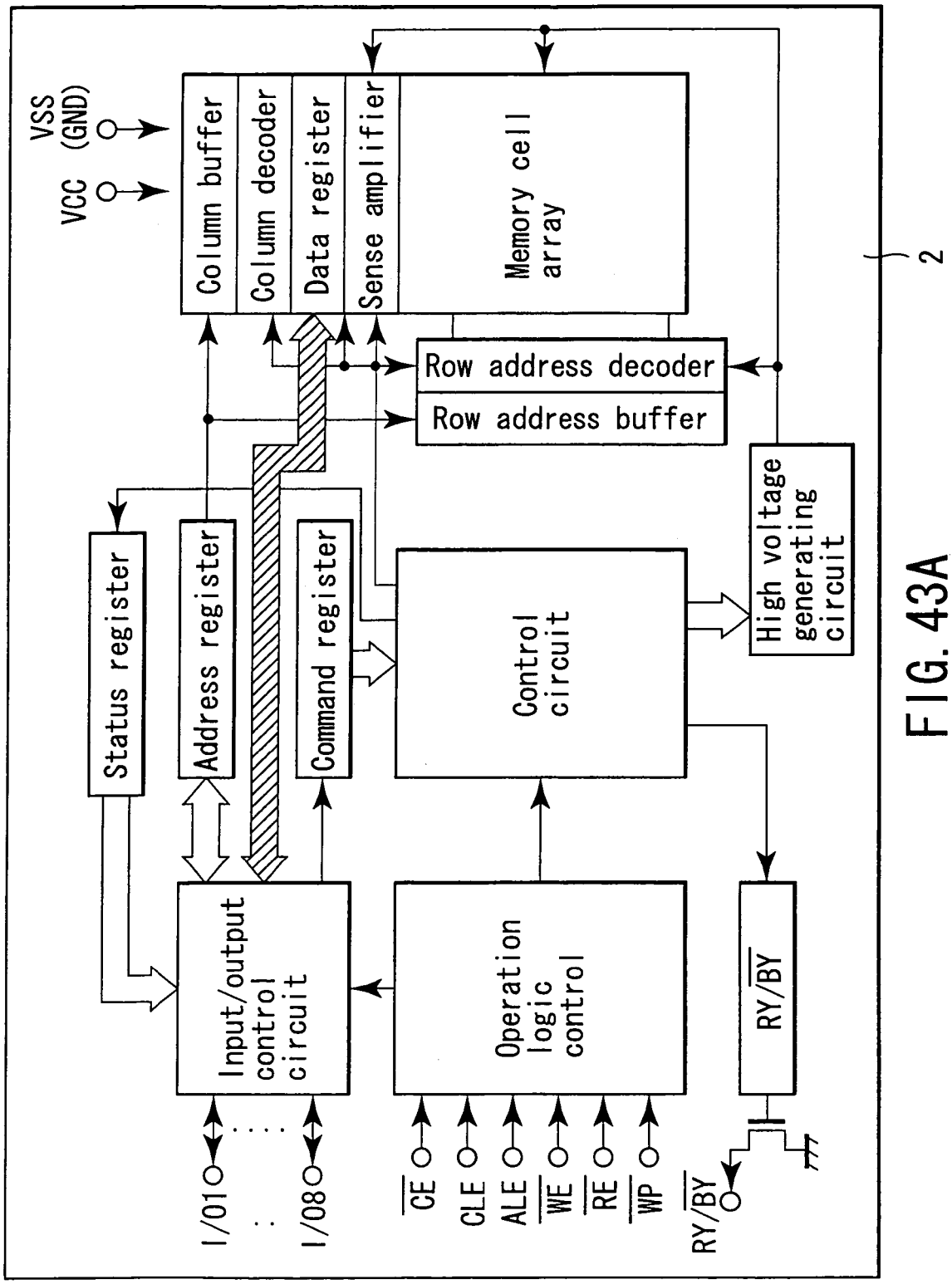
FIG. 43A is a block diagram depicting an example of a NAND type EEPROM.
Figure 43B:
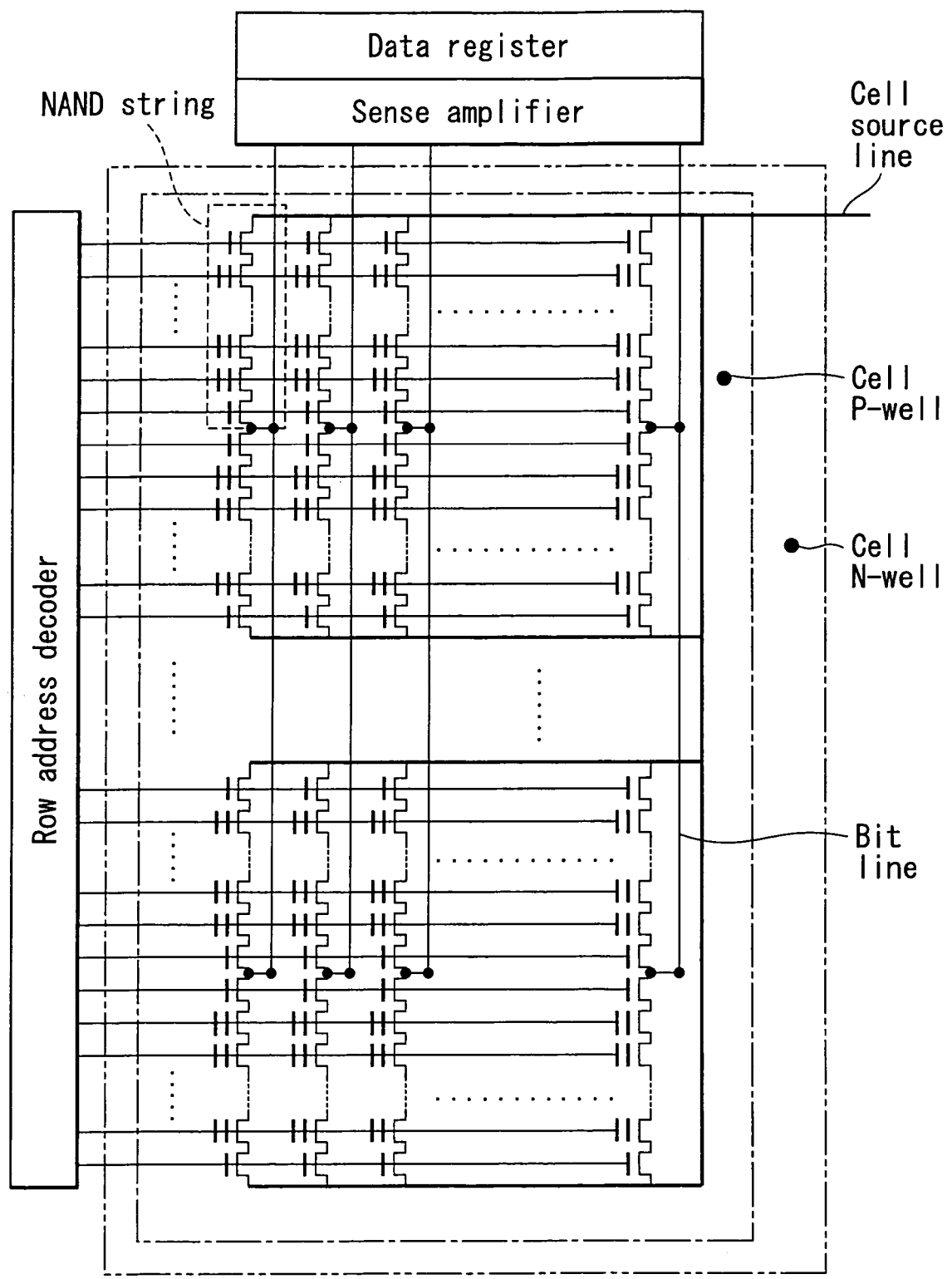
FIG. 43B is a circuit diagram showing an example of a memory cell array in the NAND type EEPROM.

FIG. 43A is a block diagram showing one example of a NAND type EEPROM and FIG. 43B is a circuit diagram showing one example of a memory cell array of a NAND type EEPROM.

The output circuit explained in the first to fourth embodiments can be used as an output circuit connected to I/O pins (I/O1 to I/O8) shown in FIG. 43A, for example.

In some of the memory cards, not only a nonvolatile semiconductor memory device used as a main memory section but also a memory controller which controls the nonvolatile semiconductor memory device is contained. The output circuit explained in the first to fourth embodiments can be used as an output circuit connected to I/O pins of the memory controller.

Now, specific examples of a memory card will be described here.

(First Example of Memory Card)

Figure 44:
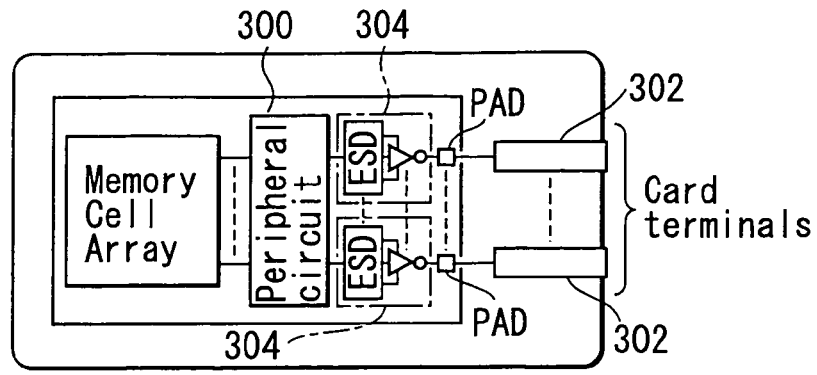
FIG. 44 is a block diagram depicting a first example of a memory card.

FIG. 44 is a block diagram depicting a first example of the memory card.

As shown in FIG. 44, the memory car according to the first example has only a nonvolatile semiconductor memory device 300. A pad PAD of the nonvolatile semiconductor memory device is connected to a card terminal 302. An output circuit 304 with a protection function described in the first to fourth embodiments is connected to the PAD connected to the card terminal 302, of the nonvolatile semiconductor memory device 300.

(Second Example of Memory Card)

Figure 45:
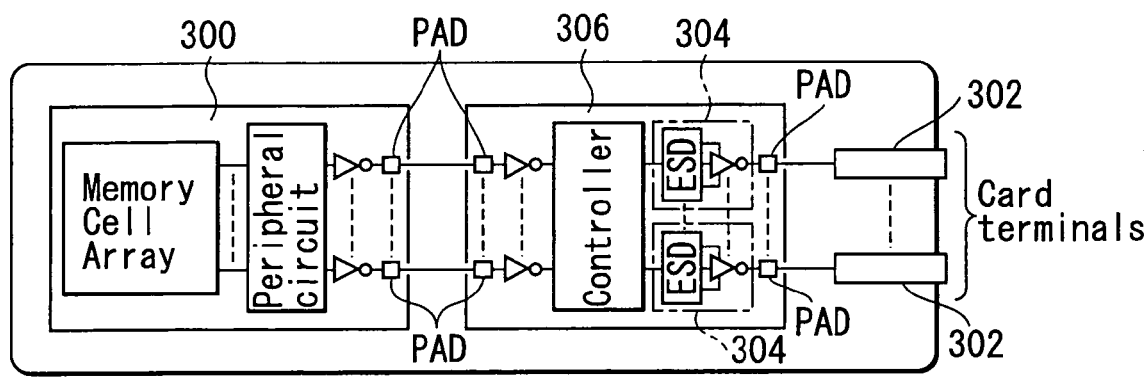
FIG. 45 is a block diagram depicting a second example of a memory card.

FIG. 45 is a block diagram depicting a second example of the memory card.

As shown in FIG. 45, the memory card according to the second example has a nonvolatile semiconductor memory device 300 and a controller 306. A pad PAD of the nonvolatile semiconductor memory device 300 is connected to a PAD of the controller 306. For example, another pad PAD of the controller 306 is connected to PAD connected to a card terminal 302, of the controller 306.

(Third Example of Memory Card)

Figure 46:
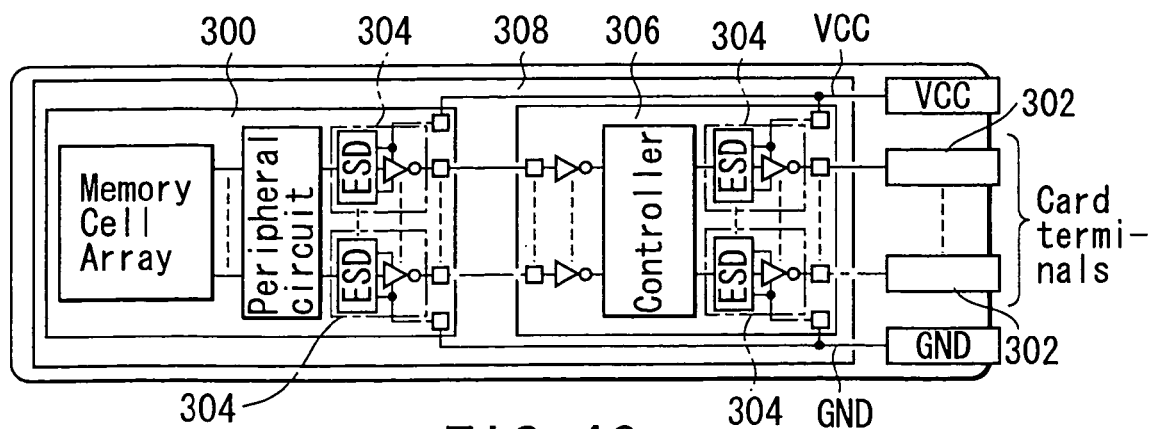
FIG. 46 is a block diagram depicting a third example of a memory card.

FIG. 46 is a block diagram depicting a third example of the memory card.

As shown in FIG. 46, the memory card according to the third example has a nonvolatile semiconductor memory device 300 and a controller 306, as in the second example. The third example is different from the second example in that the output circuit 304 with a protection function is connected to the PAD connected to the controller 306, of the nonvolatile semiconductor memory device 300 as well. The nonvolatile semiconductor memory device 300 and controller 306 are connected to wirings on a circuit board 308, and are provided as one system. The wirings of the circuit board 308 include, for example, a power source wiring VCC and a ground wiring GND, and the nonvolatile semiconductor memory device 300 and controller 306 are electrically connected to each other via the power source wiring VCC and ground wiring GND. If an aerial discharge occurs with the card terminal 302, a mass current flows the output circuit 304 of the controller 306. This mass current flows a semiconductor substrate or a well, and thus, there is a possibility that such mass current reaches the semiconductor substrate or well of the nonvolatile semiconductor memory device 300 via the power source wiring VCC or ground wiring GND. Concerning an unexpected circumstance, as in the third example, it would be better to provide the output circuit 304 with a protection function at the nonvolatile semiconductor memory device 300 even in a system in which the nonvolatile semiconductor memory device 300 is not directly connected to the card terminal 302.

In the second and third examples, although the controller 306 is shown, the controller 306 may be replaced with an interface circuit for electrically connecting the nonvolatile semiconductor memory device 300 to an electronic product.

In addition, all the systems may be integrated in one semiconductor integrated circuit device chip.

(Fourth Example of Memory Card)

In the first to third examples of the memory card, the memory card is systematically classified. In the following example, the memory card is structurally classified.

Figure 47:
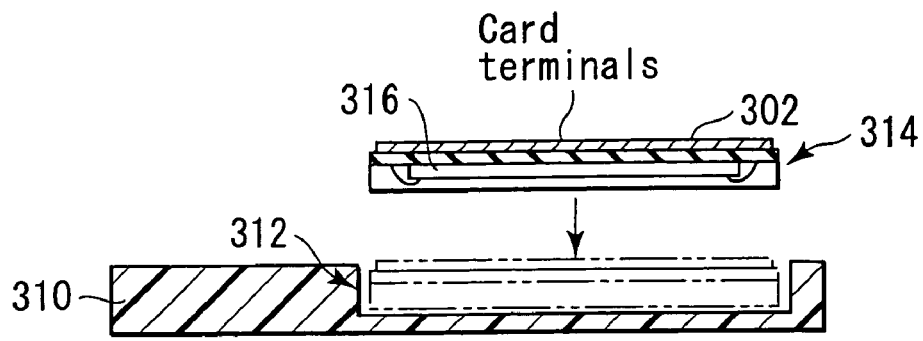
FIG. 47 is an exploded sectional view showing a fourth example of a memory card.

FIG. 47 is an exploded sectional view showing a fourth example of the memory card.

As shown in FIG. 47, the memory card according to the fourth example is provided as an example in which a nonvolatile semiconductor memory package or nonvolatile semiconductor memory module package 314 is directly pasted on a bottom of a package mount hole 312 provided on a card base 310. A semiconductor integrated circuit device chip 316 is housed in the package 314. The chip 316 is provided as the nonvolatile semiconductor memory device 300 described in the first to third examples or the controller described in the second and third examples. That is, the chip 316 is provided as the semiconductor integrated circuit device described in the first to fourth embodiments.

The semiconductor integrated circuit device according to the first to fourth embodiments can be used for a memory card with a structure in which the package 314 is directly pasted on the bottom of the mount hole 312.

(Fifth Example of Memory Card)

Figure 48:
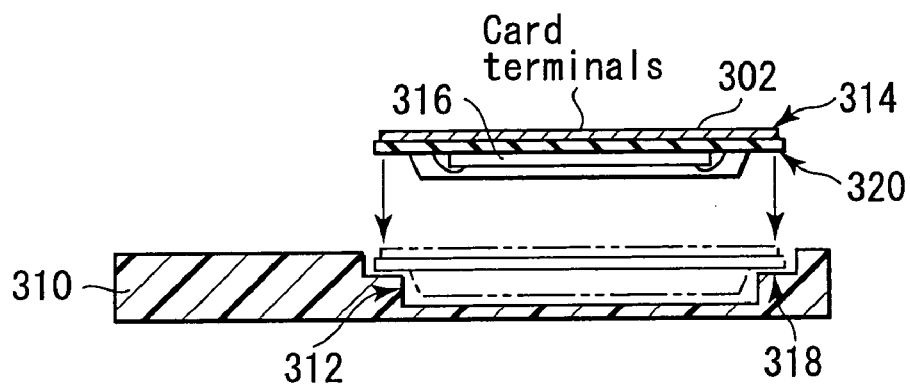
FIG. 48 is an exploded sectional view showing a fifth example of a memory card.

FIG. 48 is an exploded sectional view showing a fifth example of the memory card.

As shown in FIG. 48, the memory card according to the fifth example is provided as an example in which a fringe 320 formed at the periphery of the package 314 is pasted on an adhesive portion 318 formed in a stepped shape at the periphery of a package mount hole 312 provided in a card base 310. A chip 316 in the package 314 is provided as the semiconductor integrated circuit device described in the first to fourth embodiments.

The semiconductor integrated circuit device according to the first to fourth embodiments can be used for a memory card with a structure in which the fringe 320 of the package 314 is pasted on the adhesive portion 318 formed at the periphery of the mount hole 312.

(Sixth Example of Memory Card)

Figure 49:
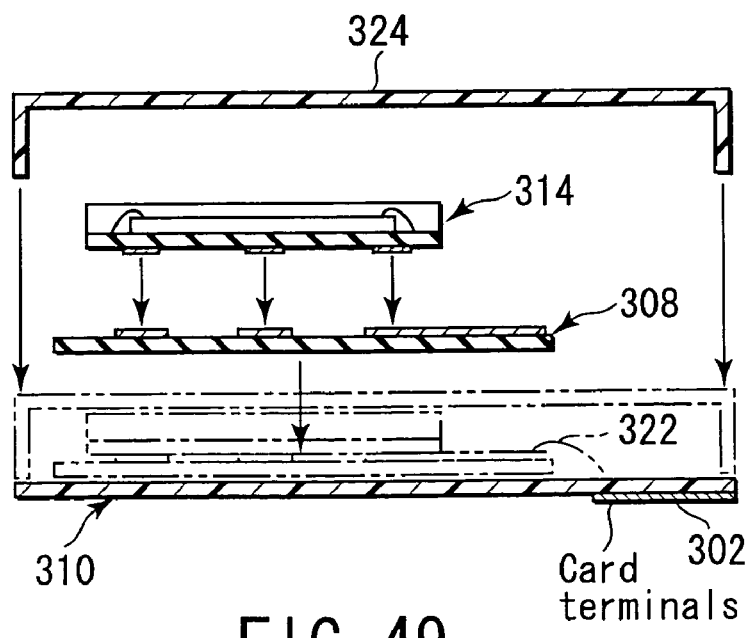
FIG. 49 is an exploded sectional view showing a sixth example of a memory card.

FIG. 49 is an exploded sectional view showing a sixth example of the memory card.

As shown in FIG. 49, the memory card according to the sixth example is provided as an example in which a package 314 is connected to a circuit board 308, the circuit board 308 is adhered to a card base 310, and the circuit board 308 is electrically connected to a card terminal 302 provided on the card base 310 by using a bonding wire 322. Further, a cover 324 is adhered to the card base 310 to shield the package 314 from the outside. A chip 316 in the package 314 is provided as the semiconductor integrated circuit device described in the first to fourth embodiments.

The semiconductor integrated circuit device described in the first to fourth embodiments can be used for a memory card with a structure in which the package 314 is shielded from the outside.

Application Example 2

In an application example 2, some examples of an application utilizing the electronic card according to the embodiment of this invention are explained.

Figure 50:
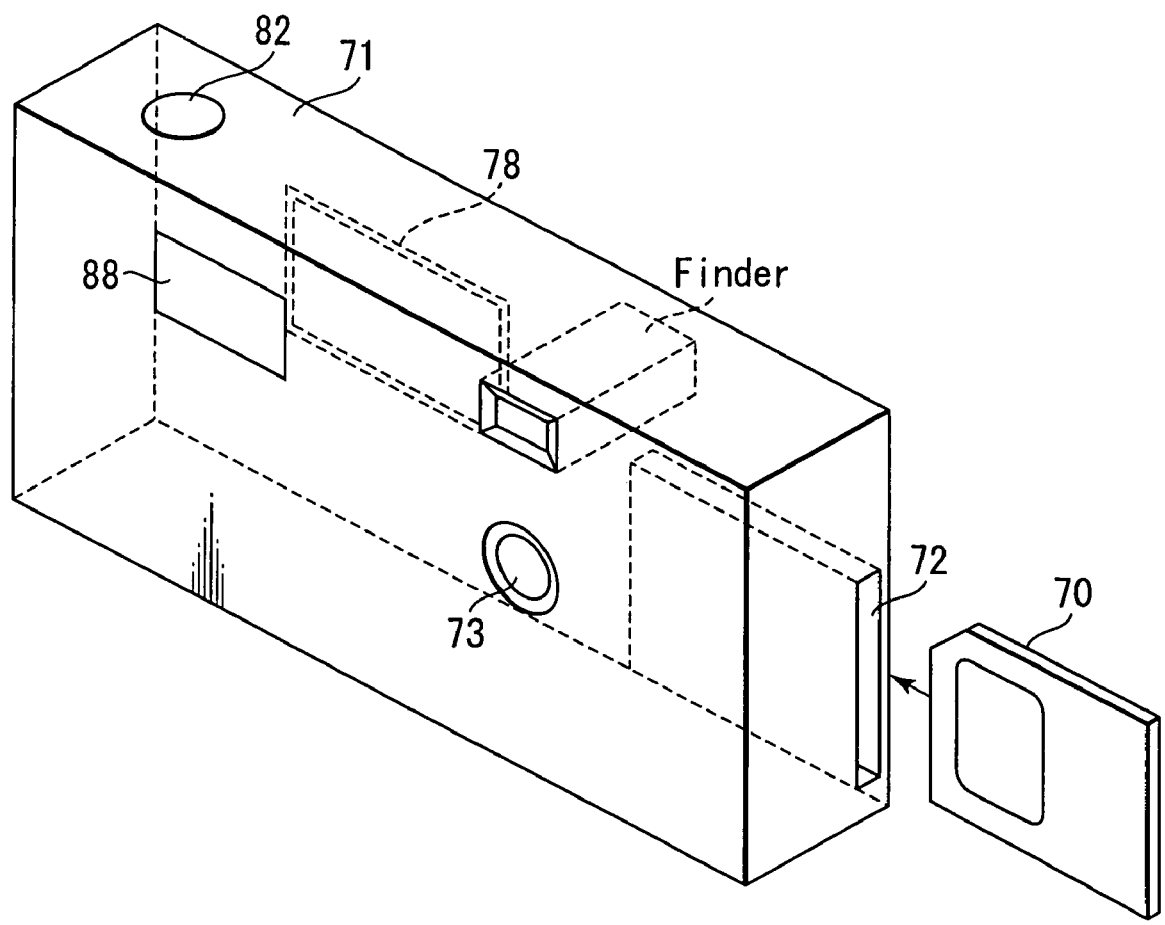
FIG. 50 is a perspective view showing an example of electronic equipment utilizing an IC card according to one embodiment of the present invention.

FIG. 50 is a perspective view showing an example of an electronic equipment utilizing an IC card according to one embodiment of the present invention. In FIG. 50, as one example of the electronic equipment, a portable electronic equipment, for example, a digital still camera is shown. The IC card according to the embodiment is a memory card, for example, and is used as a recording medium of the digital still camera, for example.

As shown in FIG. 50, a card slot 72 and a circuit board connected to the card slot 72 are received into a case of a digital still camera 71. The circuit board is omitted in FIG. 50 for simplicity. A memory card 70 is removably mounted on the card slot 72 of the digital still camera 71. When mounted on the card slot 72, the memory card 70 is electrically connected to an electronic circuit on the circuit board.

Figure 51:
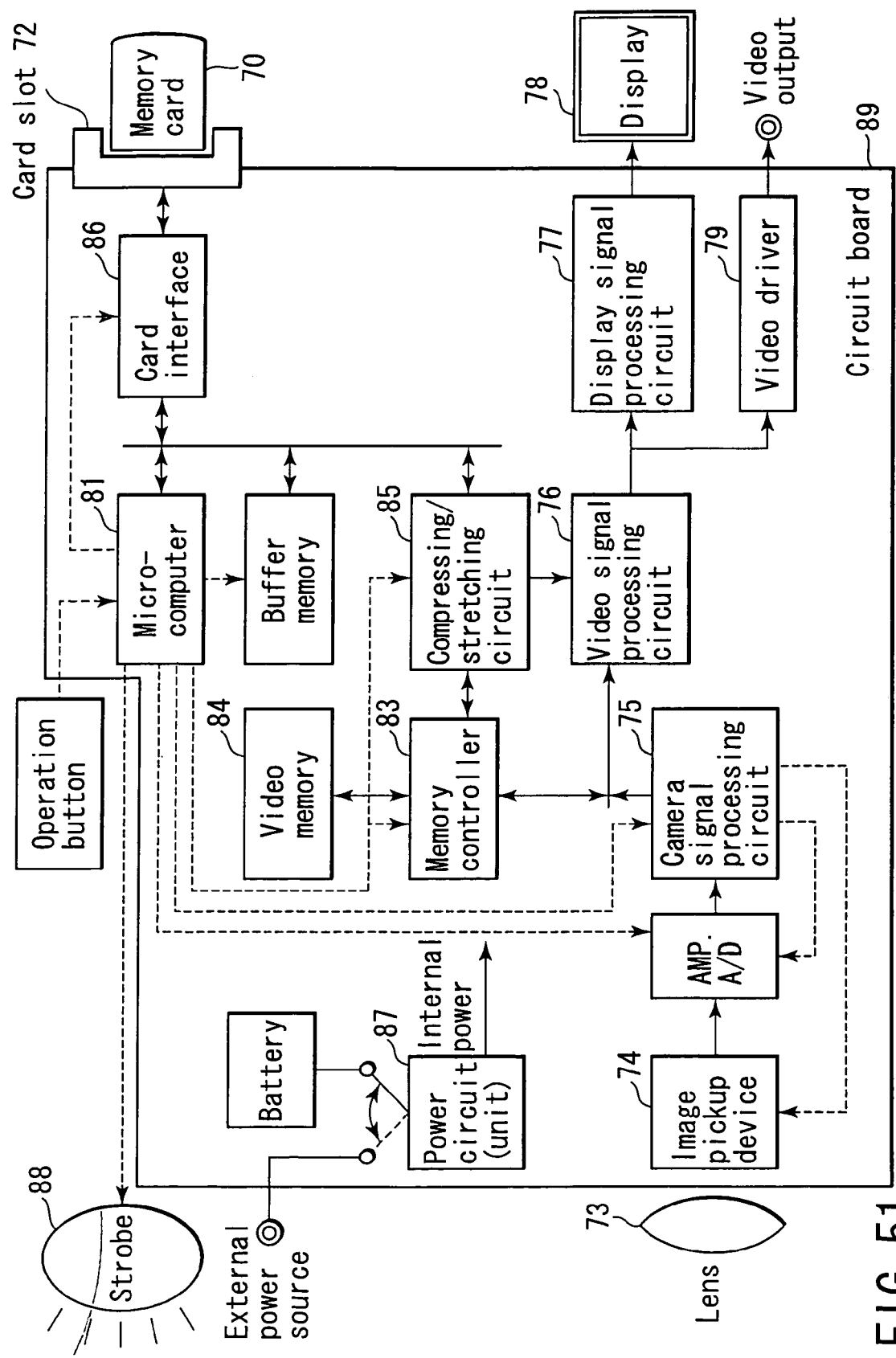
FIG. 51 is a block diagram showing a basic system of a digital still camera.

FIG. 51 is a block diagram showing a basic system of the digital still camera.

Light from a subject is converged by a lens 73 and input to an image pickup device 74. The image pickup device 74 photo electrically converts input light and outputs an analog signal, for example. One example of the image pickup device 74 is a CMOS image sensor. The analog signal is amplified by an analog amplifier (AMP.) and then converted into a digital signal by an analog-to-digital converter (A/D). The digital signal is input to a camera signal processing circuit 75 and is then subjected to an automatic exposure control process (AE), automatic white balance control process (AWB) and color separation process, for example. After this, it is converted into a luminance signal and color difference signal.

When an image is monitored, a signal output from the camera signal processing circuit 75 is input to a video signal processing circuit 76 and converted into a video signal. As a system of the video signal, for example, an NTSC (National Television System Committee) system can be given. The video signal is output to a display section 78 mounted on the digital still camera 71 via a display signal processing circuit 77. One example of the display section 78 is a liquid crystal monitor. Further, the video signal is output to a video output terminal 80 via a video driver 79. An image photographed by use of the digital still camera 71 can be output to an image display device such as a television or a display of a personal computer via the video output terminal 80. Thus, it is possible to take pleasure in looking at the photographed image displayed on a screen other than the display section 78. The image pickup device 74, analog amplifier (AMP.), analog-to-digital converter (A/D) and camera signal processing circuit 75 are controlled by a microcomputer 81.

When an image is captured, an operation button, for example, a shutter button 82 is depressed. Then, the microcomputer 81 controls a memory controller 83 to cause a signal output from the camera signal processing circuit 75 to be written into a video memory 84 as a frame image. The frame image written into the video memory 84 is compressed based on a preset compression format by a compression/expansion processing circuit 85. Then, the compressed image is recorded on the memory card 70 mounted on the card slot 72 via a card interface 86.

When a recorded image is reproduced, an image recorded on the memory card 70 is read out via the card interface 86, expanded by the compression/expansion processing circuit 85 and written into the video memory 84. The thus written image is input to the video signal processing circuit 76 and displayed on the display section 78 or image display device in the same manner as in a case wherein the image is monitored.

In the example of the basic system, an example in which the card slot 72, image pickup device 74, analog amplifier (AMP.), analog-to-digital converter (A/D), camera signal processing circuit 75, video signal processing circuit 76, display signal processing circuit 77, video driver 79, microcomputer 81, memory controller 83, video memory 84, compression/expansion processing circuit 85 and card interface 86 are mounted on a circuit board 89 is shown. It is not necessary to mount the card slot 72 on the circuit board 89 and it is possible to connect the card slot to the circuit board 89 via a connector cable or the like. Further, in this example, a power source circuit 87 is mounted on the circuit board 89. The power source circuit 87 receives power source voltage from an external power source or battery and generates internal voltage used in the internal portion of the digital still camera 71. One example of the power source circuit 87 is a DC—DC converter. The internal power source voltage is supplied to each circuit as operation power source voltage and additionally supplied as power source voltages of a strobe 88 and display section 78.

Thus, the IC card according to the embodiment of this invention can be utilized for the portable electronic equipment such as the digital still camera.

The IC card according to the embodiment of this invention can be utilized for the digital still camera. Further, as shown in FIGS. 52A to 52F, and FIGS. 53A to 53F, for example, it can be used for a video camera (FIG. 52A), television (FIG. 52B), audio/visual equipment (FIG. 52C), audio equipment (FIG. 52D), game equipment (FIG. 52E), electronic musical instrument (FIG. 52F), portable telephone (FIG. 53A), personal computer (FIG. 53B), personal digital assistant (PDA, FIG. 53C), voice recorder (FIG. 53D), PC card (FIG. 53E), electronic book terminal (FIG. 53F) and the like.

Further, for example, the electronic card 1 can be roughly divided into a contact type electronic card having an external terminal 3 and a non-contact type electronic card having no external terminal 3. The semiconductor integrated circuit device according to the first to fourth embodiments can be incorporated into any one of the contact type electronic card and non-contact type electronic card. In this case, it is predicted that the aerial discharge is a phenomenon which tends to occur in the contact type electronic card. This is because the external terminal 3 which is a conductor is exposed from the card surface in the contact type electronic card. As is explained in the item of "Test Example", it is impossible to completely predict the position of the electronic card in which the aerial discharge occurs in the market. However, there is a strong possibility that the aerial discharge more easily occurs with respect to the external terminal 3 which is a conductor than with respect to the card external casing which is generally an insulator. The external terminal 3 is connected to the output terminal PAD of the chip 2. Therefore, when the aerial discharge occurs with respect to the external terminal 3, an unexpected situation occurs as explained in the item of "Embodiment". As a result, the advantage in the above embodiment can be effectively attained in the contact type electronic card.

Further, the possibility that the aerial discharge occurs in the contact type electronic card will depend on the ratio of the area of the external terminal 3 to the card size. If the area of the external terminal 3 occupying the card size is large, a large portion of the conductor is exposed from the card surface and the possibility of occurrence of the aerial discharge becomes strong. For example, in some of the electronic cards 1, the ratio of the area of the external terminal 3 to the card size exceeds 25% (for example, refer to the perspective views of FIGS. 42A and 42B). Thus, in the electronic card 1 in which the ratio of the area of the external terminal 3 to the card size exceeds 25%, the advantage in the above embodiments can be more effectively attained.

Of course, application of the semiconductor integrated circuit device according to the first to fourth embodiments is not limited to a contact type electronic card and a contact type electronic card in which the ratio of the area of the external terminal 3 to the card size exceeds 25%. Further, the semiconductor integrated circuit device can also be used for a non-contact type electronic card and a contact type electronic card in which the ratio of the area of the external terminal 3 to the card size is equal to or less than 25%. This is because it cannot be asserted that no unexpected situation occurs in the above cards. Therefore, even when the semiconductor integrated circuit device according to the first to fourth embodiments is applied to a non-contact type electronic card and a contact type electronic card in which the ratio of the area of the external terminal 3 to the card size is equal to or less than 25%, the advantage in the above embodiment can be attained.

As described above, the present invention is explained with reference to the first to fourth embodiments, but the present invention is not limited to the embodiments. When embodying the invention, the present invention can be variously modified without departing from the technical scope thereof.

The above embodiments can be independently performed, but it is of course possible to adequately combine them and perform the combined embodiments.

Each of the above embodiments contains inventions of various stages and the inventions of various stages can be extracted by adequately combining a plurality of constituents disclosed in each of the embodiments.

As explained above, according to the embodiments of this invention, it is possible to provide the semiconductor integrated circuit device and the electronic card using the semiconductor integrated circuit device which can protect the integrated circuit from destruction in a state in which the integrated circuit is connected neither to the ground node nor the power source.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic card comprising:
   a card terminal which is exposed on a surface of a card;
   a semiconductor integrated circuit chip including an output terminal connected to the card terminal and an output circuit connected to the output terminal, the output circuit including an output buffer including a first insulated-gate field effect transistor connected to the output terminal, and a drive circuit including a second insulated-gate field effect transistor connected to the gate of the first insulated-gate field effect transistor; and
   a protection circuit provided in the semiconductor integrated circuit chip and between the output buffer and the drive circuit, the protection circuit configured to protect the first insulated-gate field effect transistor from destruction against a pulse having a pulse width of 1 ns or less applied to the card terminal, the protection circuit including a third insulated-gate field effect transistor connected between a source terminal of the first insulated-gate field effect transistor and the gate of the first insulated-gate field effect transistor, the third insulated-gate field effect transistor formed in an active region in which the first insulated-gate field effect transistor is formed.

2. The electronic card according to claim 1, wherein the semiconductor integrated circuit chip includes a nonvolatile semiconductor memory device and the output circuit which is an output circuit of the nonvolatile semiconductor memory device.

3. The electronic card according to claim 2, wherein the nonvolatile semiconductor memory device is a flash memory.

4. The electronic card according to claim 3, wherein the flash memory is a NAND type flash memory.

5. The electronic card according to claim 1, wherein the semiconductor integrated circuit chip includes a memory controller and the output circuit which is an output circuit of the memory controller.

6. The electronic card according to claim 5, further comprising a nonvolatile semiconductor memory device and the memory controller which controls the nonvolatile semiconductor memory device.

7. The electronic card according to claim 6, wherein the nonvolatile semiconductor memory device includes a flash memory.

8. The electronic card according to claim 7, wherein the flash memory is a NAND type flash memory.

9. The electronic card according to claim 1, wherein the semiconductor integrated circuit chip includes an interface circuit and the output circuit which is an output circuit of the interface circuit.

10. The electronic card according to claim 9, further comprising a nonvolatile semiconductor memory device and the interface circuit for connecting the nonvolatile semiconductor memory device to an electronic product.

11. The electronic card according to claim 10, wherein the nonvolatile semiconductor memory device chip includes a flash memory.

12. The electronic card according to claim 11, wherein the flash memory is a NAND type flash memory.

13. An electronic card comprising:
a card terminal which is exposed on a surface of a card; and
a semiconductor integrated circuit chip including an output terminal connected to the card terminal and an integrated circuit device having an output circuit connected to the output terminal, the output circuit including an output buffer which drives the output terminal, a drive circuit which drives the output buffer, and a protection circuit provided between the output buffer and the drive circuit, the protection circuit protecting the output buffer, the output buffer including a first insulated-gate field effect transistor connected to the output terminal, the protection circuit including a second insulated-gate field effect transistor connected between a source terminal of the first insulated-gate field effect transistor and the gate of the first insulated-gate field effect transistor, the second insulated-gate field effect transistor formed in an active region in which the first insulated-gate field effect transistor is formed.

14. The electronic card according to claim 13, wherein the integrated circuit device includes a nonvolatile semiconductor memory device.

15. The electronic card according to claim 13, wherein the integrated circuit device includes a memory controller.

16. The electronic card according to claim 13, wherein the integrated circuit device includes an interface circuit.

* * * * *